(12) United States Patent
Park

(10) Patent No.: US 7,229,884 B2
(45) Date of Patent: Jun. 12, 2007

(54) PHOSPHOROUS DOPING METHODS OF MANUFACTURING FIELD EFFECT TRANSISTORS HAVING MULTIPLE STACKED CHANNELS

(75) Inventor: Jin-Jun Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 299 days.

(21) Appl. No.: 10/998,472

(22) Filed: Nov. 29, 2004

(65) Prior Publication Data

US 2005/0266645 A1 Dec. 1, 2005

(30) Foreign Application Priority Data

May 25, 2004 (KR) ...................... 10-2004-0037517

(51) Int. Cl.
*H01L 21/336* (2006.01)
(52) U.S. Cl. .............................. 438/289; 257/E21.051
(58) Field of Classification Search ................ 438/289; 257/E21.615, E21.051
See application file for complete search history.

(56) References Cited

U.S. PATENT DOCUMENTS

| | | | |
|---|---|---|---|
| 4,996,574 A | 2/1991 | Shirasaki | |
| 5,221,849 A | 6/1993 | Goronkin et al. | |
| 5,412,224 A | 5/1995 | Goronkin et al. | |
| 5,583,362 A | 12/1996 | Maegawa | |
| 5,965,914 A | 10/1999 | Miyamoto | |
| 6,190,234 B1 | 2/2001 | Swedek et al. | |
| 6,413,802 B1 * | 7/2002 | Hu et al. | 438/151 |
| 6,440,806 B1 | 8/2002 | Xiang | |
| 7,026,688 B2 | 4/2006 | Kim et al. | |
| 7,141,837 B2 * | 11/2006 | Coronel et al. | 257/241 |
| 2002/0149031 A1 | 10/2002 | Kim et al. | |
| 2004/0056285 A1 | 3/2004 | Cabral, Jr. et al. | |
| 2004/0063286 A1 | 4/2004 | Kim et al. | |

FOREIGN PATENT DOCUMENTS

| | | |
|---|---|---|
| DE | 199 28 564 A1 | 1/2004 |
| EP | 1 056 135 A1 | 11/2000 |
| EP | 1 188 188 B1 | 8/2005 |

(Continued)

OTHER PUBLICATIONS

Translation of an Official Letter as issued by the German Patent and Trademark Office, Application No. 103 39 920.8-33, Nov. 4, 2004.

(Continued)

*Primary Examiner*—Scott B. Geyer
*Assistant Examiner*—Stanetta Isaac
(74) *Attorney, Agent, or Firm*—Myers Bigel Sibley & Sajovec, P.A.

(57) ABSTRACT

Integrated circuit field effect transistors are manufactured by forming a pre-active pattern on a surface of a substrate, while refraining from doping the pre-active pattern with phosphorus. The pre-active pattern includes a series of interchannel layers and channel layers stacked alternately upon each other. Source/drain regions are formed on the substrate, at opposite ends of the pre-active pattern. The interchannel layers are then selectively removed, to form tunnels passing through the pre-active pattern, thereby defining an active channel pattern including the tunnels and channels including the channel layers. The channels are doped with phosphorus after selectively removing the interchannel layers. A gate electrode is then formed in the tunnels and surrounding the channels.

19 Claims, 69 Drawing Sheets

FOREIGN PATENT DOCUMENTS

| | | |
|---|---|---|
| JP | 11-8390 A | 1/1999 |
| JP | 2000-340793 A | 12/2000 |
| KR | 1994-0003076 A | 3/1995 |

OTHER PUBLICATIONS

Kim et al., *Field Effect Transistors Having Multiple Stacked Channels*, U.S. Appl. No. 10/610,607, filed Jul. 1, 2003.

Combined Search and Examination Report Under Sections 17 and 18(3), GB 0321985.4, Mar. 17, 2004.

Translation of an Official Letter as issued by the German Patent and Trademark Office, Application No. 10 2005 015 418.2, Aug. 25, 2006.

* cited by examiner

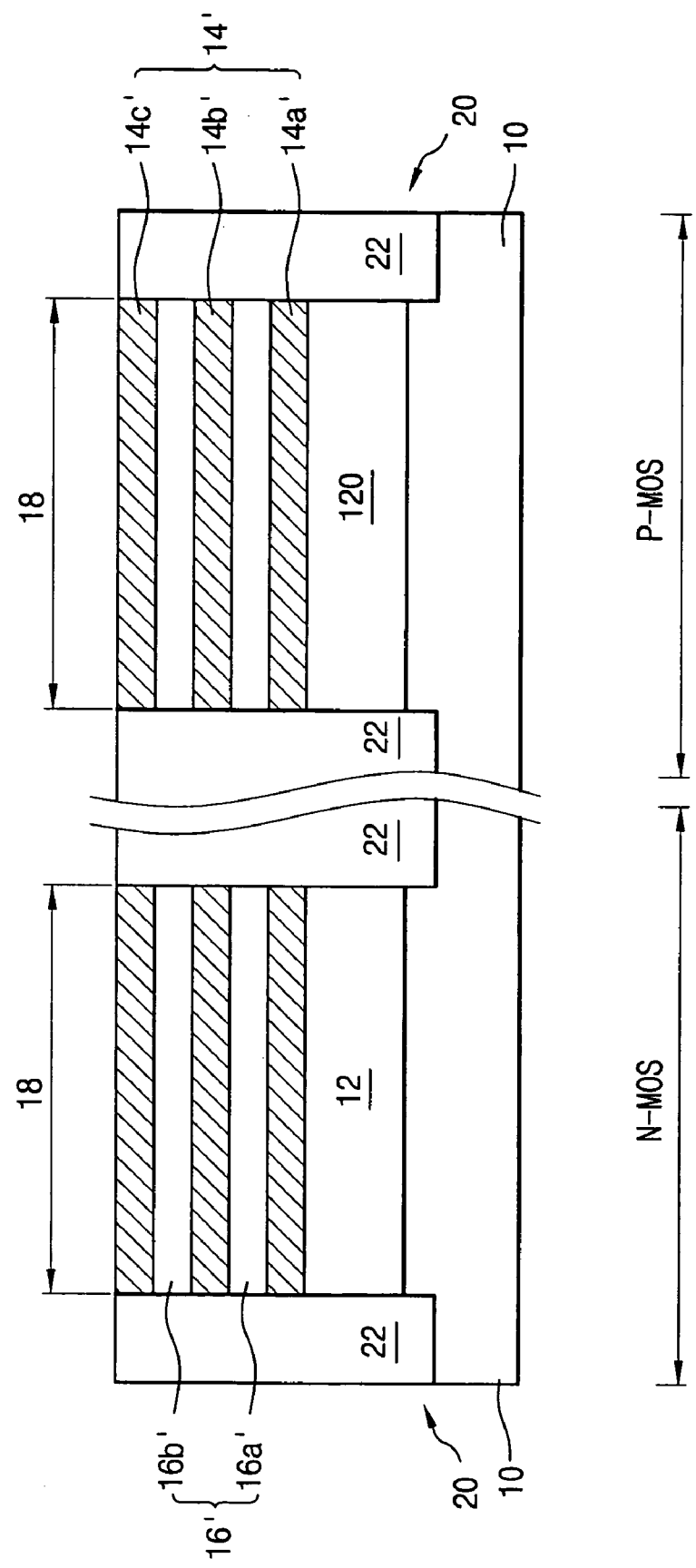

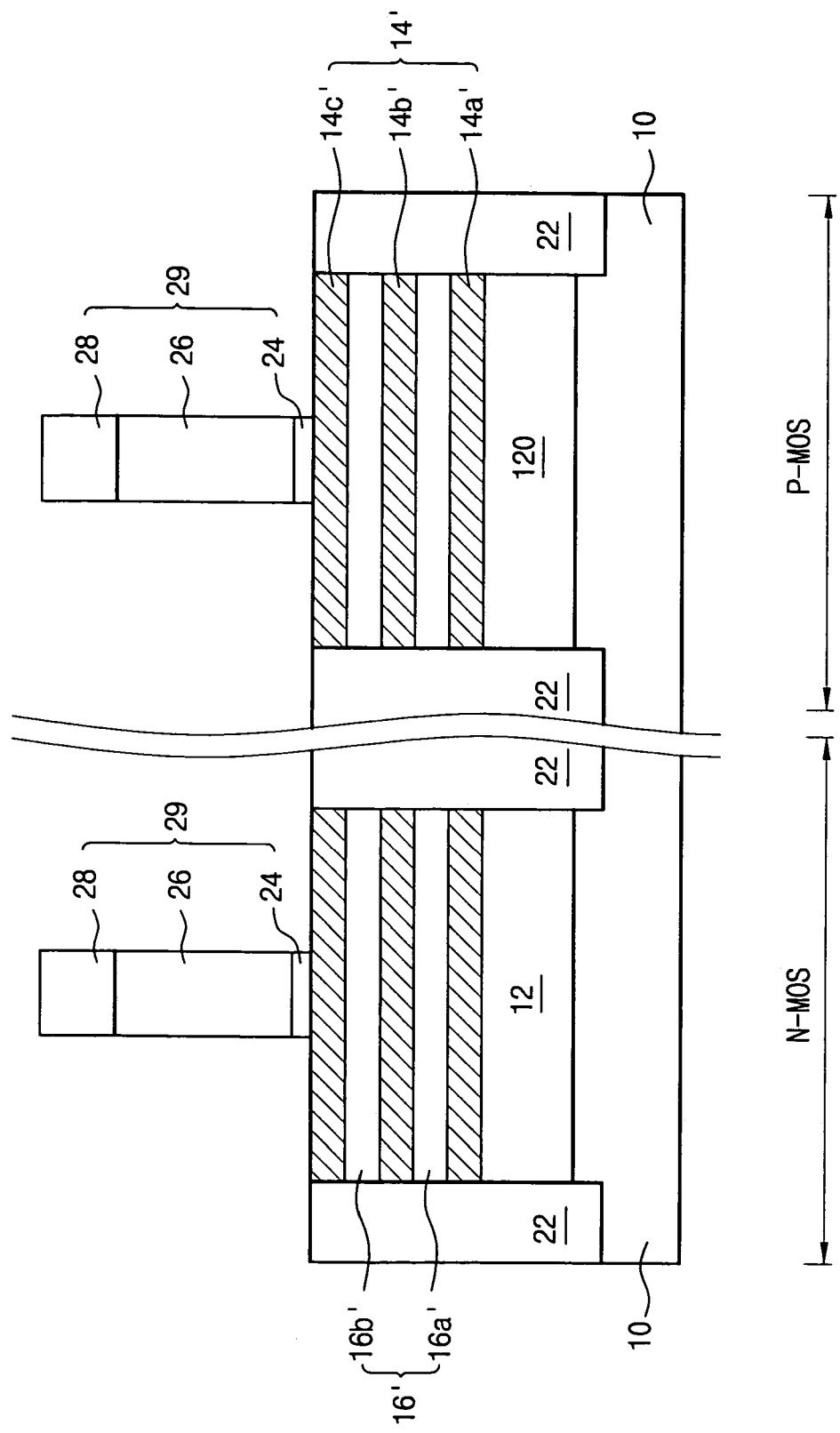

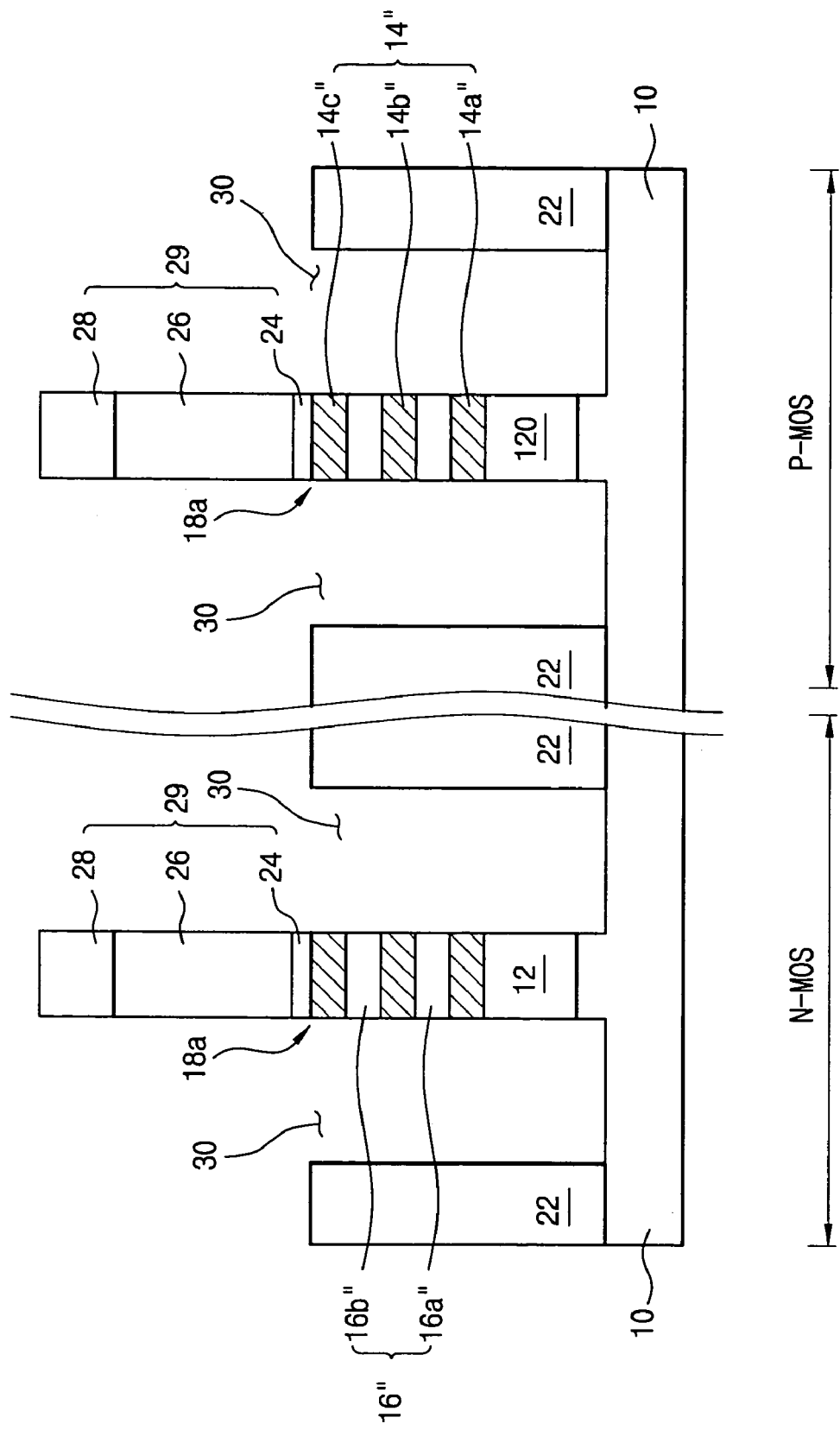

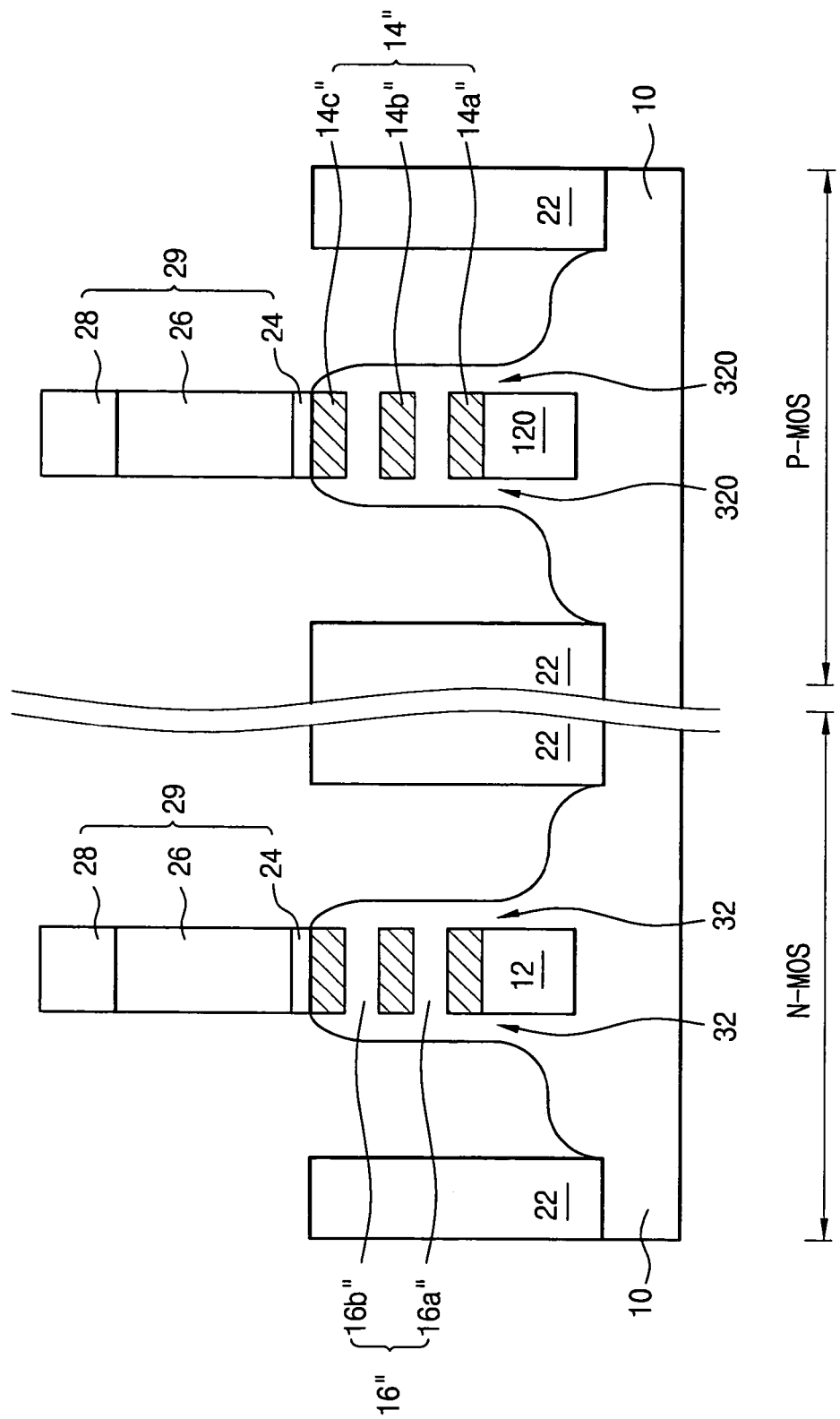

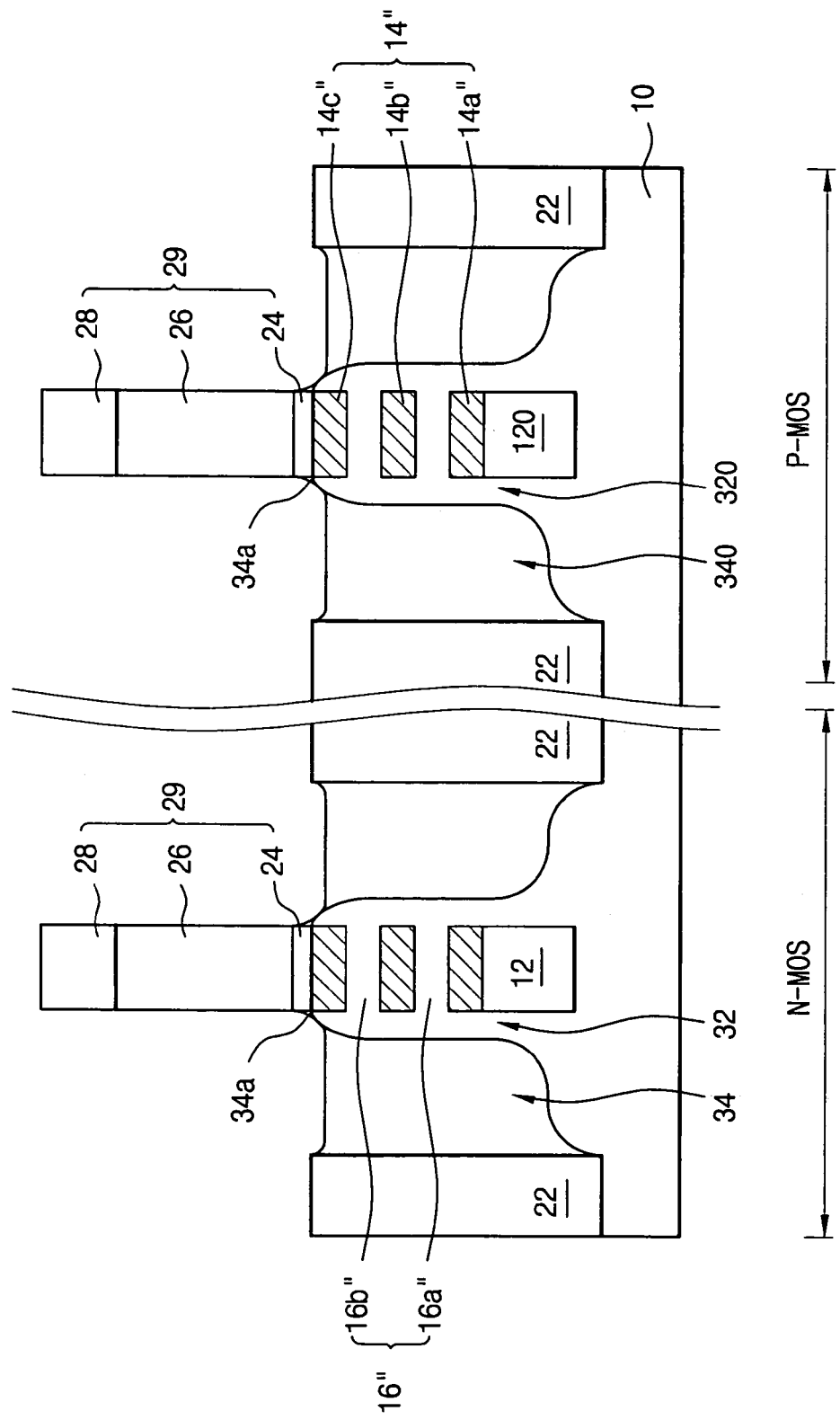

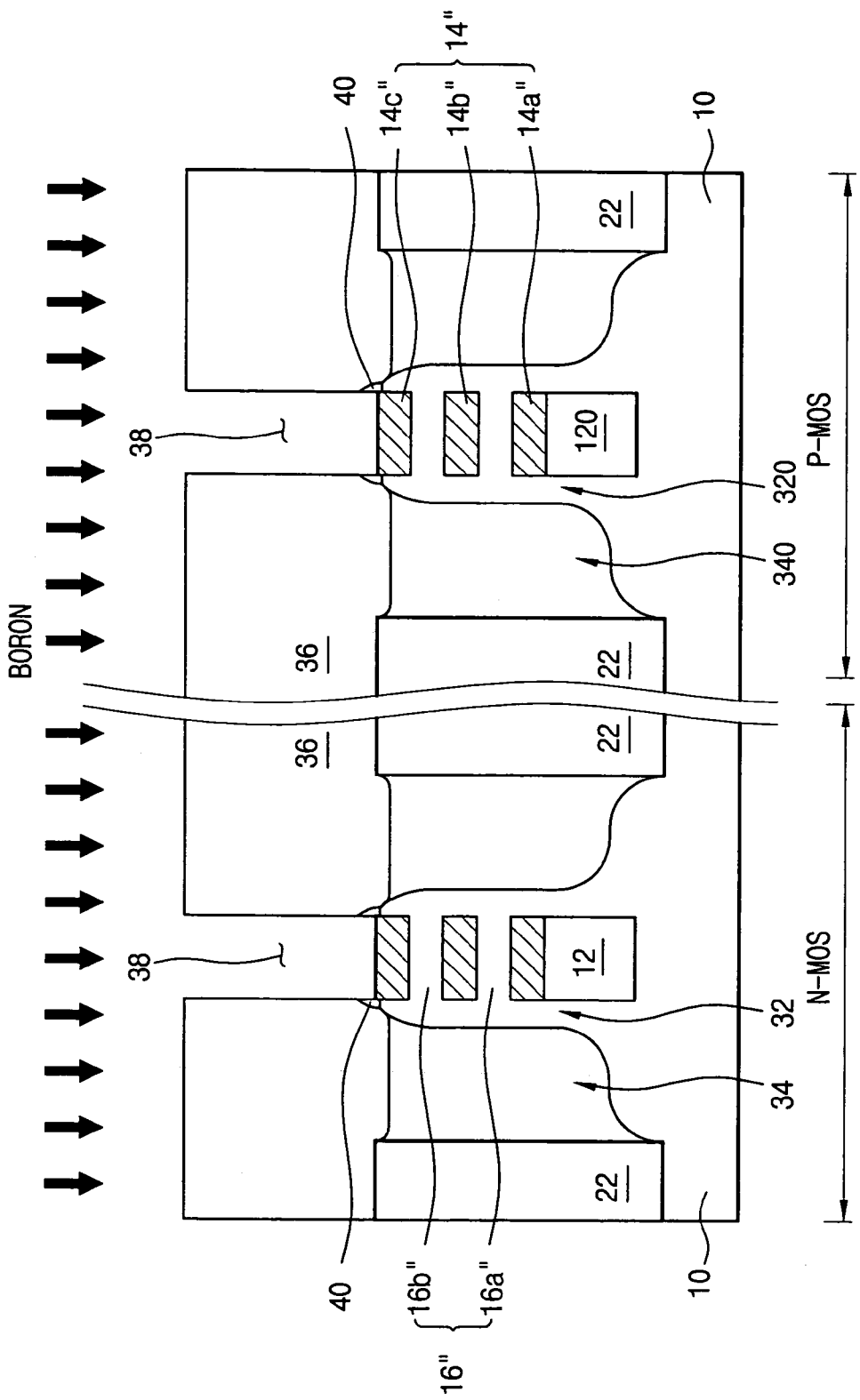

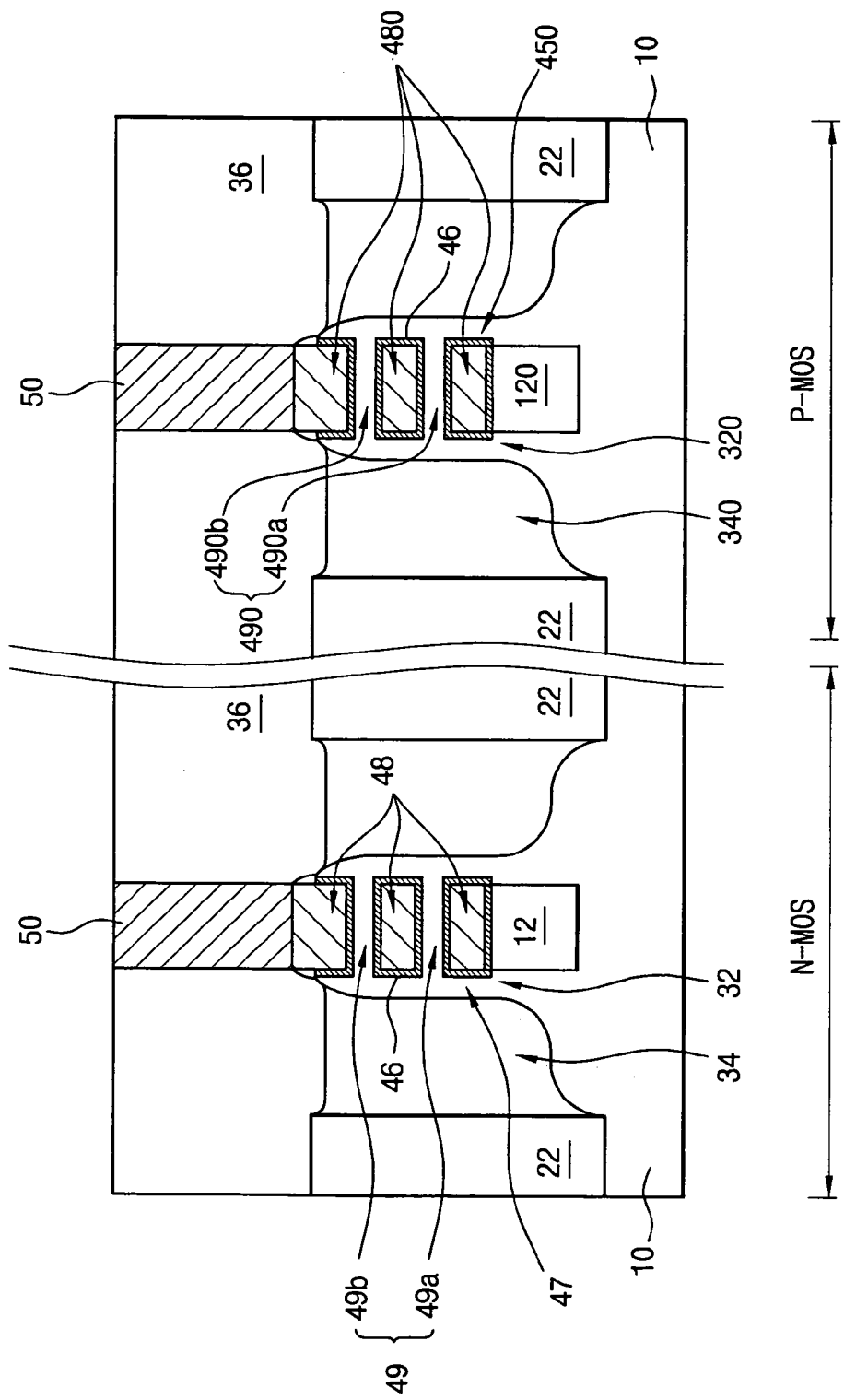

US 7,229,884 B2

PHOSPHOROUS DOPING METHODS OF MANUFACTURING FIELD EFFECT TRANSISTORS HAVING MULTIPLE STACKED CHANNELS

RELATED APPLICATION

This application claims the benefit of Korean Patent Application No. 2004-0037517, filed May 25, 2004, the disclosure of which is hereby incorporated herein by reference in its entirety as if set forth fully herein.

FIELD OF THE INVENTION

The present invention relates to methods of manufacturing integrated circuit devices. More particularly, the present invention relates to methods of manufacturing field effect transistors.

BACKGROUND OF THE INVENTION

Integrated circuit field effect transistors are widely used in logic, memory, processor and other integrated circuit devices. As is well known to those having skill in the art, an integrated circuit field effect transistor includes spaced apart source and drain regions, a channel therebetween and a gate electrode adjacent the channel. Integrated circuit field effect transistors are often referred to as Metal Oxide Semiconductor Field Effect Transistors (MOSFETs) or simply as MOS devices. Moreover, integrated circuit field effect transistors may be provided in two complementary types: N-channel field effect transistors, often referred to as N-MOS devices, and P-channel field effect transistors, often referred to as P-MOS devices. When both types of complementary transistor types are provided in a single integrated circuit, they may be referred to as CMOS devices. Although these terms will be used in the present application, they are used to generally denote integrated circuit field effect transistors and are not limited to field effect transistors having metal gates or oxide gate insulators.

As the integration density of integrated circuit field effect transistors continues to increase, the size of the active region and the channel length may continue to decrease. With the reduction in the channel length of the transistor, the influence of the source/drain upon the electric field or potential in the channel region may become considerable. This is called the "short channel effect". Further, with the scaling down of the active size, the channel width decreases which may increase a threshold voltage. This is called the "narrow width effect".

Various structures have been developed in attempts to improve or maximize the device performance, while reducing the sizes of elements formed on a substrate. For example, there are vertical transistor structures known as a fin structure, a DELTA (fully DEpleted Lean-channel TrAnsistor) structure and GAA (Gate All Around) structure.

For example, U.S. Pat. No. 6,413,802 discloses a FinFET device. As noted in the Abstract of this patent, a FinFET device is fabricated using conventional planar MOSFET technology. The device is fabricated in a silicon layer overlying an insulating layer (e.g., SIMOX) with the device extending from the insulating layer as a fin. Double gates are provided over the sides of the channel to provide enhanced drive current and effectively suppress short channel effects. A plurality of channels can be provided between a source and a drain for increased current capacity. In one embodiment, two transistors can be stacked in a fin to provide a CMOS transistor pair having a shared gate.

An example of a MOS transistor having DELTA structure is disclosed in U.S. Pat. No. 4,996,574. As noted in the Abstract of this patent, a metal-insulator-semiconductor transistor comprises an insulator layer, a semiconductor body provided on the insulator layer and comprising a source region, a drain region and a channel region extending in a first direction between and interconnecting the source region and the drain region, a gate insulator film provided on the semiconductor body so as to cover the channel region except for the part of the channel region in contact with the insulator layer, and a gate electrode of a conductive material provided in contact with the gate insulator film so as to cover the channel region underneath the gate insulator film except for the part of the channel region in contact with the insulator layer. The channel region has a width substantially smaller than twice the maximum extension of the depletion region formed in the channel region.

An example of a thin film transistor having the GAA structure is disclosed in U.S. Pat. No. 5,583,362. In typical MOS transistors of GAA structure, the SOI layer serves as an active pattern and a gate electrode is formed surrounding a channel region of the active pattern of which the surface is covered with a gate-insulating layer.

A field effect transistor having multiple stacked channels, and fabrication methods thereof, is described in application Ser. No. 10/610,607, filed Jul. 1, 2003, entitled Field Effect Transistors Having Multiple Stacked Channels, assigned to the assignee of the present invention, the disclosure of which is hereby incorporated herein by reference in its entirety as if set forth fully herein. Integrated circuit field effect transistors are manufactured, according to some embodiments of application Ser. No. 10/610,607, by forming a pre-active pattern on a surface of a substrate. The pre-active pattern comprises a series of interchannel layers and channel layers stacked alternately upon each other. Source/drain regions are formed on the substrate at opposite ends of the pre-active pattern. The plurality of interchannel layers are selectively removed to form a plurality of tunnels passing through the pre-active pattern, to thereby define an active channel pattern comprising the tunnels and a plurality of channels comprising the channel layers. A gate electrode is formed in the tunnels and surrounding the channels.

SUMMARY OF THE INVENTION

Integrated circuit field effect transistors are manufactured, according to some embodiments of the present invention, by forming a pre-active pattern on a surface of a substrate, while refraining from doping the pre-active pattern with phosphorus. The pre-active pattern comprises a series of interchannel layers and channel layers stacked alternately upon each other. Source/drain regions are formed on the substrate, at opposite ends of the pre-active pattern. The plurality of interchannel layers are then selectively removed, to form a plurality of tunnels passing through the pre-active pattern, thereby defining an active channel pattern comprising the tunnels and a plurality of channels comprising the channel layers. The channels are doped with phosphorus after selectively removing the plurality of interchannel layers. A gate electrode is then formed in the tunnels and surrounding the channels.

In some embodiments, the integrated circuit field effect transistor is a P-channel integrated circuit field effect transistor. In some embodiments, the channel layers comprise single crystalline silicon, the interchannel layers comprise single crystalline silicon-germanium and/or selectively removing is performed using conventional poly-etchant. As used herein, "poly-etchant" refers to a wet etching solution for single crystalline silicon and/or polycrystalline silicon that includes a mixture of nitric acid ($HNO_3$) and hydrofluoric acid (HF) and which may include other constituents such as water ($H_2O$). Moreover, doping the channels may be performed using ion implantation and/or plasma doping.

Some embodiments of the present invention may arise from a recognition that it may be difficult to selectively etch phosphorus doped interchannel layers that comprise single crystalline germanium, relative to channel layers that comprise phosphorus doped single crystalline silicon, using conventional poly-etchant, to provide selective removal of the plurality of interchannel layers, as described above. In contrast, undoped single crystalline silicon-germanium may be successfully selectively etched with respect to undoped single crystalline silicon using conventional poly-etchant. Accordingly, embodiments of the present invention defer or refrain from doping the pre-active pattern with phosphorus during formation thereof, and later dope the channels with phosphorus after selectively removing the plurality of interchannel layers. Selective removal thereby may be accomplished effectively, for example using conventional poly-etchant.

Embodiments of the invention have been described above with respect to an integrated circuit field effect transistor such as a P-MOS device. Other embodiments of the invention, as will now be described, may be used to manufacture integrated circuit N-channel and P-channel field effect transistors, commonly referred to as CMOS devices.

More specifically, an N-channel pre-active pattern and a P-channel pre-active pattern are formed on a surface of a substrate, while refraining from doping the N-channel and P-channel pre-active patterns with phosphorus. The respective N-channel and P-channel pre-active patterns comprise a series of interchannel layers and respective N-channel layers and P-channel layers stacked alternately upon each other. Source/drain regions are then formed on the substrate, at opposite ends of each of the N-channel and P-channel pre-active patterns. The plurality of interchannel layers are then selectively removed, to form a plurality of tunnels passing through the N-channel and P-channel pre-active patterns, thereby defining respective active N-channel and P-channel patterns comprising the tunnels, and a plurality of respective N-channels and P-channels comprising the channel layers. The P-channels of the active P-channel patterns are then doped with phosphorus after selectively removing the plurality of interchannel layers, while refraining from doping the N-channels of the active N-channel patterns with phosphorus after selectively removing the plurality of interchannel layers. A gate electrode is then formed in the tunnels and surrounding the N-channels and the P-channels.

In some embodiments, after selectively removing the plurality of interchannel layers, the N-channels of the active N-channel patterns are doped with boron, while refraining from doping the P-channels of the active P-channel patterns with boron. In other embodiments, the doping of the N-channel layers of the N-channel pre-active patterns with boron while refraining from doping the P-channel layers of the P-channel pre-active patterns with boron, is performed before selectively removing the plurality of interchannel layers. In yet other embodiments, after selectively removing the plurality of interchannel layers, both the N-channels of the active N-channel patterns and the P-channels of the active P-channel patterns are doped with boron. In yet other embodiments, the N-channel layers of the active N-channel pre-active patterns and the P-channel layers of the P-channel pre-active patterns are doped with boron before selectively removing the plurality of interchannel layers. Thus, boron doping may be performed in the N-channel patterns and may also be performed in the P-channel patterns, and may be performed prior to and/or after selectively removing the plurality of interchannel layers.

In some CMOS embodiments, the channel layers comprise single crystalline silicon, the interchannel layers comprise single crystalline silicon-germanium and/or selectively removing is performed using poly-etchant. Moreover, in some CMOS embodiments, doping of the P-channels is performed using ion implantation and/or plasma doping.

DETAILED DESCRIPTION

Figure 1A:
FIG. 1A is a cross-sectional photograph illustrating etching by a conventional poly wet etchant of a boron doped N-channel silicon-germanium interchannel layer relative to a boron doped monocrystalline silicon epitaxial layer.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a layer illustrated as having a smooth surface will, typically, have some roughness rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

As was described above, U.S. patent application Ser. No. 10/610,607 describes methods of manufacturing an integrated circuit field effect transistor by forming a pre-active pattern on a surface of a substrate, wherein the pre-active pattern comprises a series of interchannel layers and channel layers stacked alternately upon one another, and forming source/drain regions on the substrate at opposite ends of the pre-active pattern. The plurality of interchannel layers are selectively removed, to form a plurality of tunnels passing through the pre-active pattern, thereby defining an active channel pattern comprising the tunnels, and a plurality of channels comprising the channel layers. A gate electrode is formed in the tunnels and surrounding the channels. In some embodiments, the channel layers comprise single crystalline epitaxial silicon and the interchannel layers comprise single crystalline epitaxial silicon-germanium. Boron is typically used to dope the channel layers and interchannel layers P-type and phosphorus is typically used to dope the channel layers and interchannel layers N-type. In some embodiments, the channel layers may have a thickness of about 300 Å and the interchannel layers may have a thickness of about 300 Å.

Figure 1B:
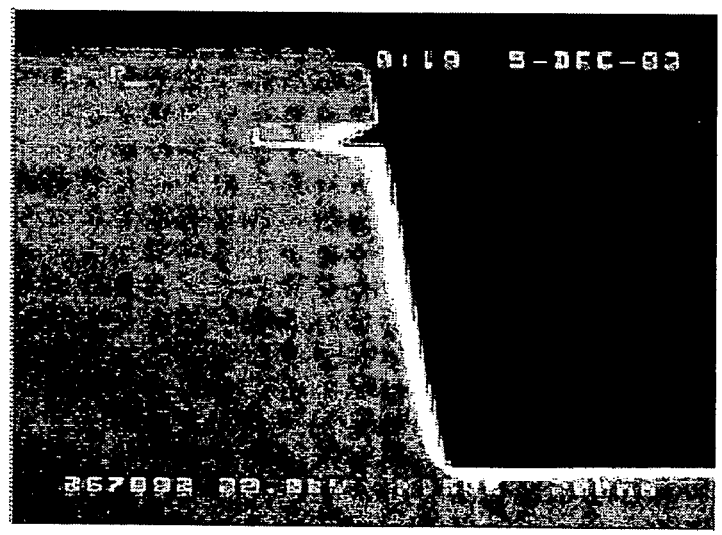
FIG. 1B is a cross-sectional photograph illustrating failure to etch a phosphorus doped P-channel silicon-germanium layer by a conventional polysilicon wet etchant.

Unfortunately, as illustrated in FIGS. 1A and 1B. difficulties may be presented when selectively removing the interchannel layers, to form a plurality of tunnels passing through the pre-active pattern. In particular, as shown in FIG. 1A, when the interchannel layers comprise boron doped P-type layers of single crystalline silicon-germanium, and the channel layers comprise boron doped P-type layers of single crystalline silicon, the boron doped P-type silicon-germanium may be effectively etched relative to the boron doped P-type silicon using a conventional poly wet etchant. Unfortunately, however, in a P-channel device, wherein the interchannel layers comprise phosphorus doped N-type monocrystalline silicon-germanium, and the channel layers comprise phosphorus doped N-type monocrystalline silicon, the phosphorus doped silicon-germanium may not be etched selectively by conventional wet etchant, as shown in FIG. 1B.

According to embodiments of the present invention, this difficulty may be overcome by refraining from doping the pre-active pattern with phosphorus, and then doping the channels with phosphorus after the plurality of interchannel layers are removed to form the active channel pattern. By refraining from doping the pre-active pattern with phosphorus, the pre-active pattern, which can comprise undoped or boron doped silicon-germanium interchannel layers and undoped or boron doped silicon channel layers, may be effectively etched to selectively remove the interchannel layers and form a plurality of tunnels. Phosphorus doping may then be performed after selectively removing the interchannel layers. Moreover, since boron doping may not impact the selective etching of the interchannel layers, boron doping may be performed when forming the pre-active pattern or after selectively removing the interchannel layers to form the active pattern.

Figure 2A:
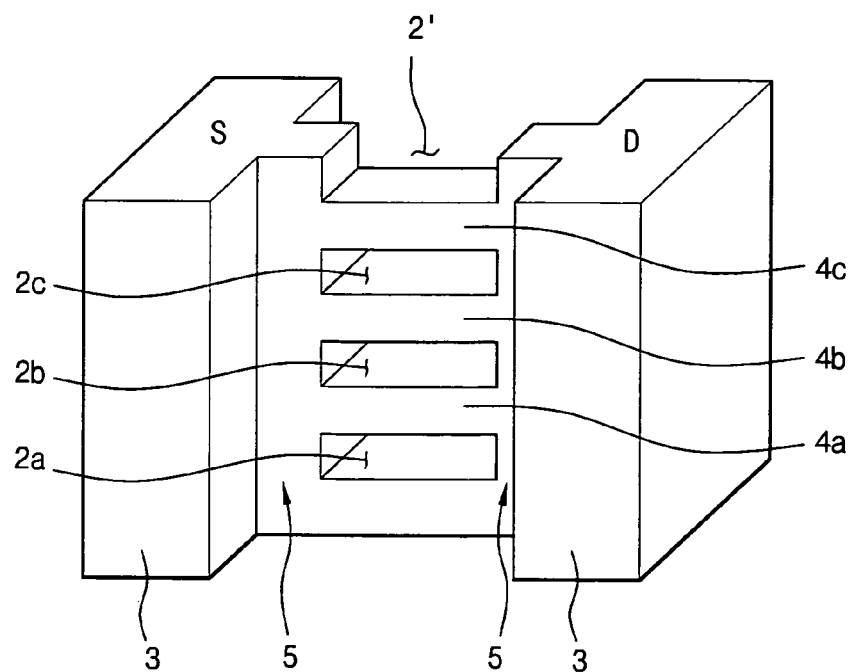
FIGS. 2A and 2B are perspective views showing an active pattern and a gate electrode of a MOS transistor having multiple channels in accordance with some embodiments of the present invention, respectively.
Figure 2B:
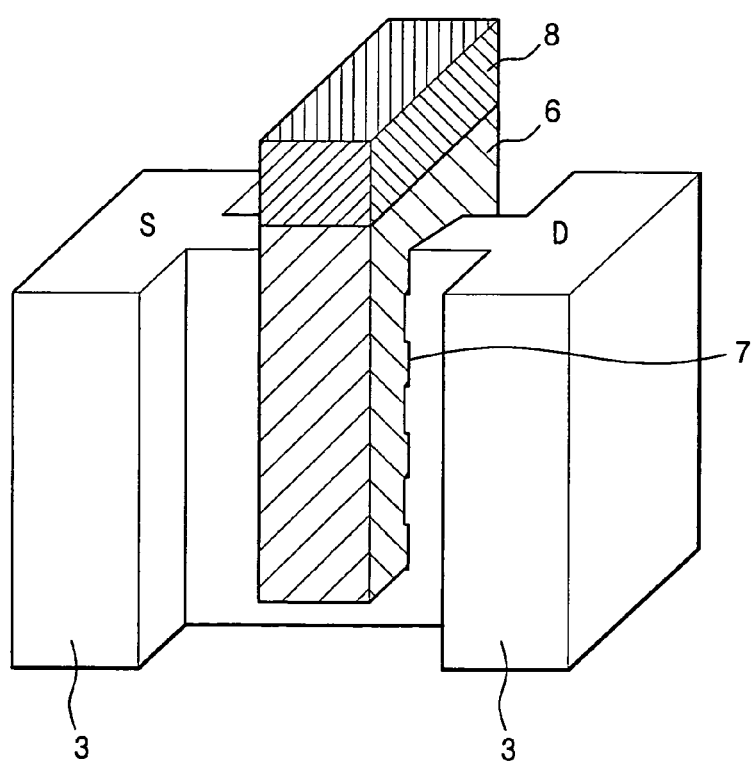

FIGS. 2A and 2B are perspective views showing an active pattern and a gate electrode of a MOS transistor having multiple channels, respectively, in accordance with some embodiments of the present invention.

Referring to FIG. 2A, an active pattern formed on a surface of an integrated circuit substrate such as a semiconductor substrate (not shown) includes a plurality of channels 4a, 4b and 4c formed in a vertical direction. Though three channels 4a, 4b and 4c are shown in the embodiment, two channels may be formed or the number of channels may be more than three.

The channels 4a, 4b and 4c have a vertically stacked structure with a narrow width. A plurality of tunnels 2a, 2b and 2c are formed between the channels 4a, 4b and 4c. Source/drain regions 3 are formed at the both sides of the active pattern so as to be connected to the plurality of channels 4a, 4b and 4c.

The source/drain regions 3 are formed to have a width wider than that of the channels 4a, 4b and 4c. Between the source/drain regions 3 and the channels 4a, 4b, 4c, there may be formed source/drain extension layers 5 connecting the source/drain regions 4 to the channels 4a, 4b and 4c.

Particularly, the active pattern comprises the source/drain regions 3 of a rectangular parallelepiped shape having a relatively wide width on the both sides of the active pattern. It will be understood, however, that the active pattern may have any polygonal shape, and that the sides and vertices need not be equal. A channel region having a width narrower than the rectangular parallelepiped shape is formed between the source/drain regions 3 to connect the source/drain regions 3 to each other. The channel region includes two source/drain extension layers 5 connected to the source/drain regions 3. Two source/drain extension layers 5 are connected to each other by the plurality of channels 4a, 4b and 4c formed in a vertical direction. The plurality of tunnels 2a, 2b and 2c are formed between the channels 4a, 4b and 4c. The lowest tunnel 2a is formed between the lowest channel layer 4a and the underlying surface portion of the semiconductor substrate. A groove 2' of a tunnel shape is formed on the uppermost channel 4c.

Referring to FIG. 2B, a gate electrode 6 is formed on the active pattern. While extending through and/or filling up the plurality of tunnels 2a, 2b and 2c and the tunnel groove 2', the gate electrode 6 is formed to surround the plurality of channels 4a, 4b and 4c in a vertical direction (i.e., a direction perpendicular to the forming direction of the source/drain regions on the plan). A gate-insulating layer 7 is formed between the gate electrode 6 and the plurality of channels 4a, 4b and 4c.

The semiconductor substrate comprises silicon (Si), silicon-germanium (SiGe), silicon-on-insulator (SOI), silicon-germanium-on-insulator (SGOI) and/or other conventional substrates. In some embodiments, the semiconductor substrate comprises a single crystalline Si.

The channels 4a, 4b and 4c comprise a single crystalline semiconductor film, such as a silicon film. The source/drain regions 3 comprise a selective epitaxial single crystalline film or a conductive film such as a polysilicon film, a metal film, a metal silicide film, etc. In case of using the selective epitaxial single crystalline film or the polysilicon film, an impurity is ion-implanted in the source/drain regions 3 so that the source/drain regions 3 are conductive.

In case of forming the source/drain extension layers 5 between the channels 4a, 4b and 4c and the source/drain regions 3 as shown in the figure, in some embodiments the source/drain regions 3 comprise a conductive film such as a polysilicon film, a metal film, a metal silicide film, etc. and the source/drain extension layer 3 comprises a selective epitaxial single crystalline film.

The gate electrode 6 comprises a polysilicon film and may include a gate stack layer 8 formed on the top surface of the gate electrode 6. The gate stack layer 8 comprises a metal silicide for reducing a gate resistance and/or an insulating material for capping the gate electrode 6. The gate-insulating layer 7 comprises a thermal oxide film or an ONO film.

In a MOS transistor of some embodiments of the present invention, the plurality of thin channels 4a, 4b and 4c are connected to the source/drain regions 3 and the source/drain regions 3 are formed to have a uniform doping profile in a direction perpendicular to the plurality of channels 4a, 4b and 4c, which can maintain the uniform source/drain junction capacitance even though the number of the channels increases. So, while reducing or minimizing the junction capacitance, the current can increase to enhance the device speed.

Further, the MOS transistor having a gate electrode smaller than a channel width may be provided in some embodiments because the gate electrode 6 surrounds the plurality of channels 4a, 4b and 4c, which can result in an improvement in the device integration.

In addition, in some embodiments, regions of the active pattern where source/drain regions are to be formed are etched away, in which the active pattern comprises a plurality of interchannel layers serving as the tunnel 2 and a plurality of channel layers serving as the channels 4a, 4b and 4c which are stacked alternately with each other. Then, the etched regions are provided with and/or filled up with an epitaxial single crystalline film and/or a conductive material to form the source/drain regions 3. Accordingly, only active pattern of the channel region may remain, so that a horizontal length of the tunnel 2 filled with the gate electrode may be limited within a gate length region to thereby obtain a highly integrated MOS transistor having a smaller gate length than a channel width.

EMBODIMENT 1

Figure 3A:
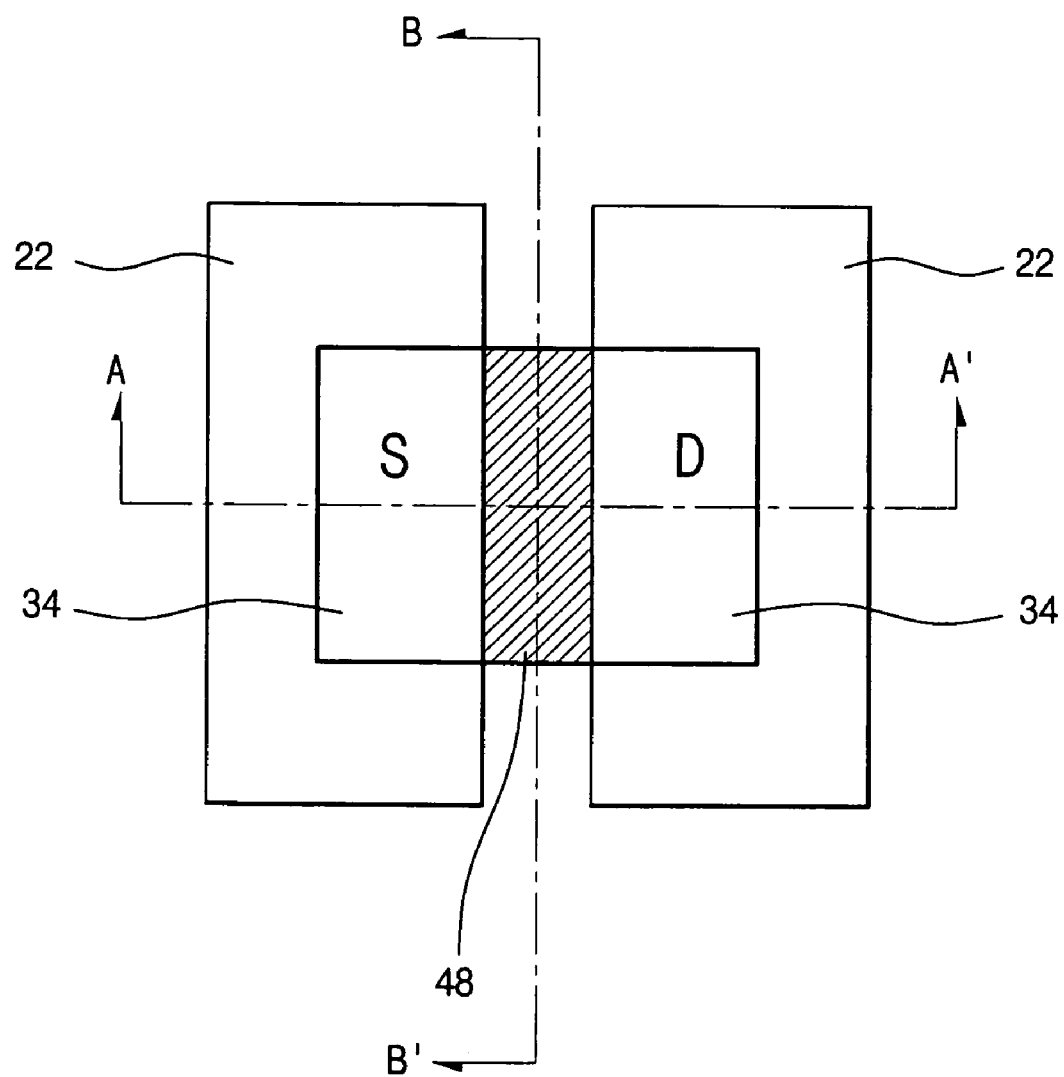
FIG. 3A is a plan view of a device in accordance with first embodiments of the present invention.
Figure 3B:
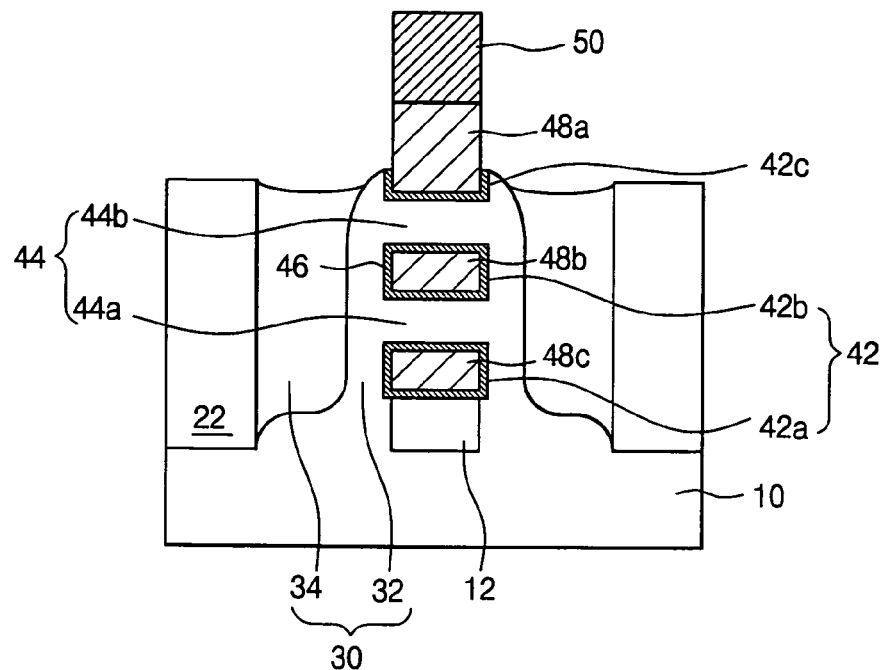
FIGS. 3B and 3C are cross-sectional views of the device of FIG. 3A taken along lines AA' and BB' of FIG. 2A, respectively.
Figure 3C:
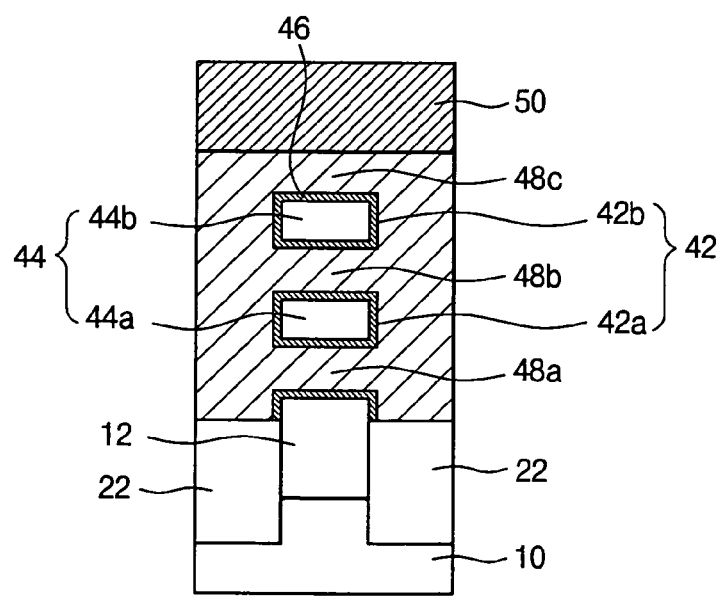

FIG. 3A is a plan view of a semiconductor device in accordance with first embodiments of the present invention. FIGS. 3B and 3C are cross-sectional views of the semiconductor device taken along lines AA' and BB' of FIG. 3A, respectively.

Referring to FIGS. 3A to 3C, an active pattern 30 including multiple channels 44 having a plurality of channels 44a and 44b formed vertically in the upside direction is formed on a main surface of a substrate 10 comprising silicon (Si), silicon-germanium (SiGe), silicon-on-insulator (SOI), silicon-germanium-on-insulator (SGOI) and/or other conventional materials/layers. Source/drain regions 34 are formed so as to be connected to the channels 44a and 44b at opposite sides of the active pattern 30. Between the source/drain regions 34 and the plurality of channels 44a and 44b, there are formed source/drain extension layers 32 connected to the source/drain regions 34 and connected to the channels 44 and 44b. That is, the source/drain extension layers 32 serve as a bridge linking the source/drain regions 34 to the plurality of channels 44a and 44b.

A plurality of tunnels 42 is formed between the plurality of channels 44a and 44b. The lowest tunnel 42a is formed between the lowest channel layer 44a and the underlying surface portion of the semiconductor substrate, i.e., a heavily doped impurity region 12 of the substrate 10. A groove 42c of a tunnel shape is formed on the uppermost channel 44b.

The channels 44a and 44b may comprise a semiconductor material such as single crystalline Si, while the source/drain regions 34 may comprise a conductive material such as polysilicon, metal, metal silicide, etc. Here, the source/drain extension layers 32 are formed to be extended from the channels 44a and 44b using the same material as in the channels 44a and 44b. In some embodiments, the source/drain extension layers 32 are comprised of selective epitaxial single crystalline Si.

On the active pattern 30, there is formed a gate electrode 48 extending through and/or filling up the tunnel 42 including the plurality of tunnels 42a and 42b formed between the channels 44a and 44b and surrounding the channels 44a and 44b in a vertical direction. A gate-insulating layer 46 is formed between the gate electrode 48 and the channels 44a and 44b, i.e., on the inner surfaces of the tunnel 42 and on the inner sidewalls and bottom surfaces of the groove 42 of a tunnel shape. In some embodiments, the gate electrode 48 comprises a polysilicon and a gate stack layer 50 of a metal silicide for reducing a gate resistance is formed on the top surface of the gate electrode 48.

Field regions 22 are formed so as to surround the source/drain regions 34 except the channel region of the plurality of channels 44a and 44b. A heavily doped region 12 is formed in the main surface portion of the substrate 10 below the active pattern 30, i.e., below the lowest channel 44a. The heavily doped region 12 can reduce or prevent the operation of a bottom transistor causing a short channel effect.

Figure 4A:
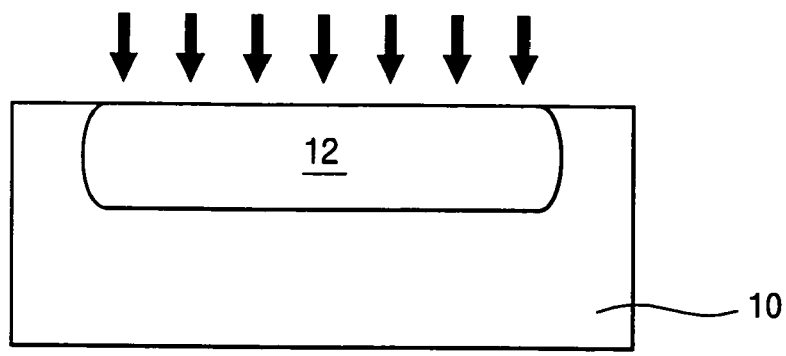
FIGS. 4A to 4S are cross-sectional views illustrating methods of manufacturing a device according to the first embodiments of the present invention.
Figure 4B:
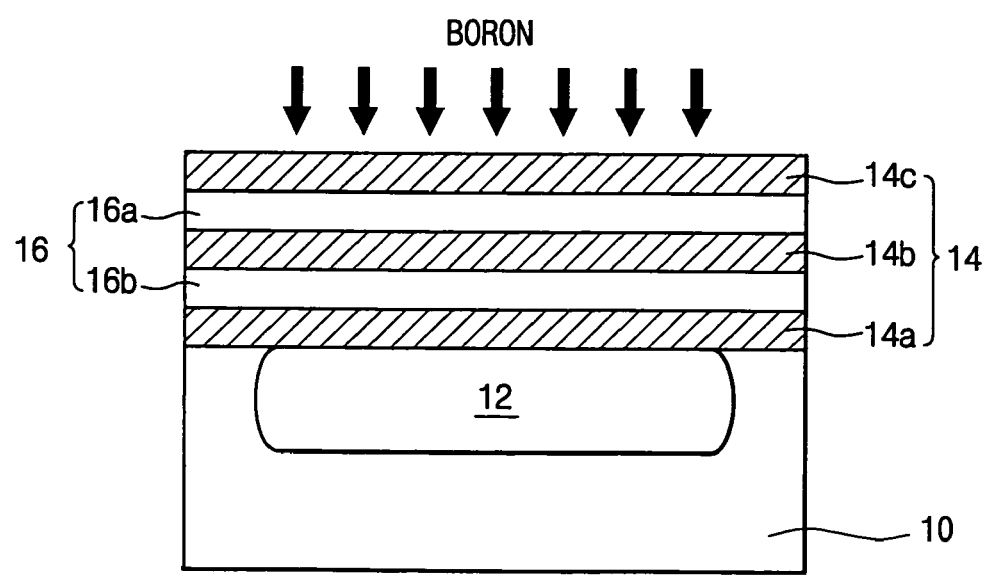
Figure 4C:
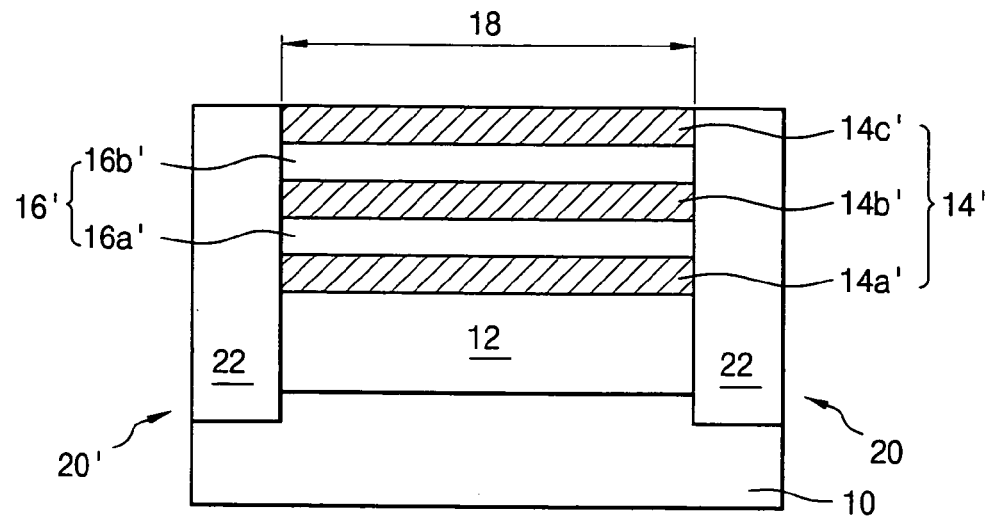
Figure 4D:
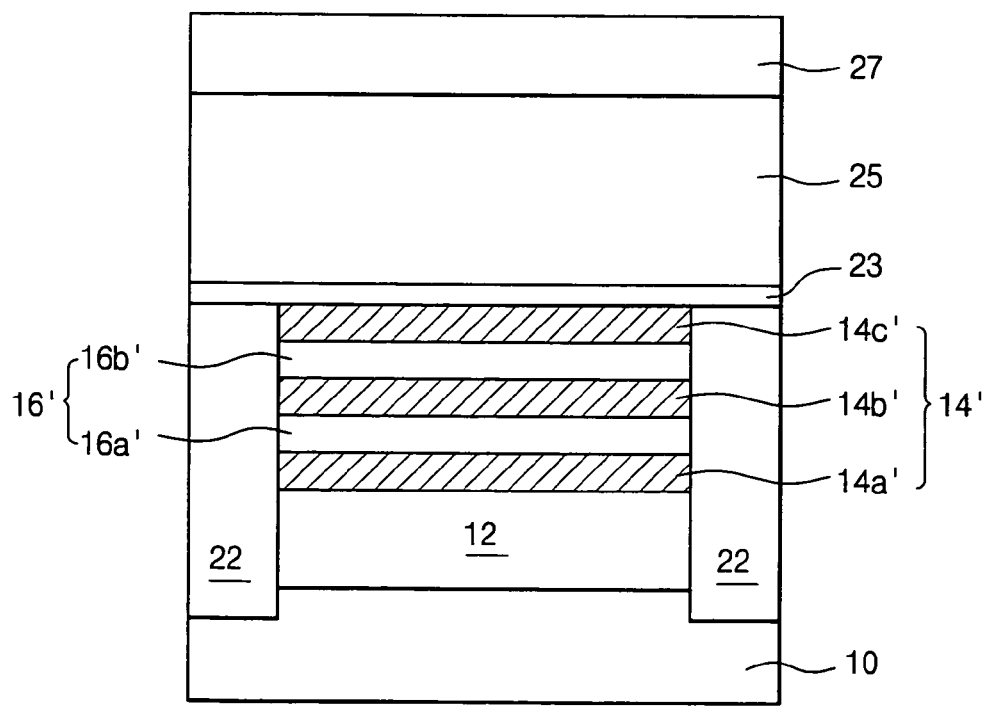
Figure 4E:
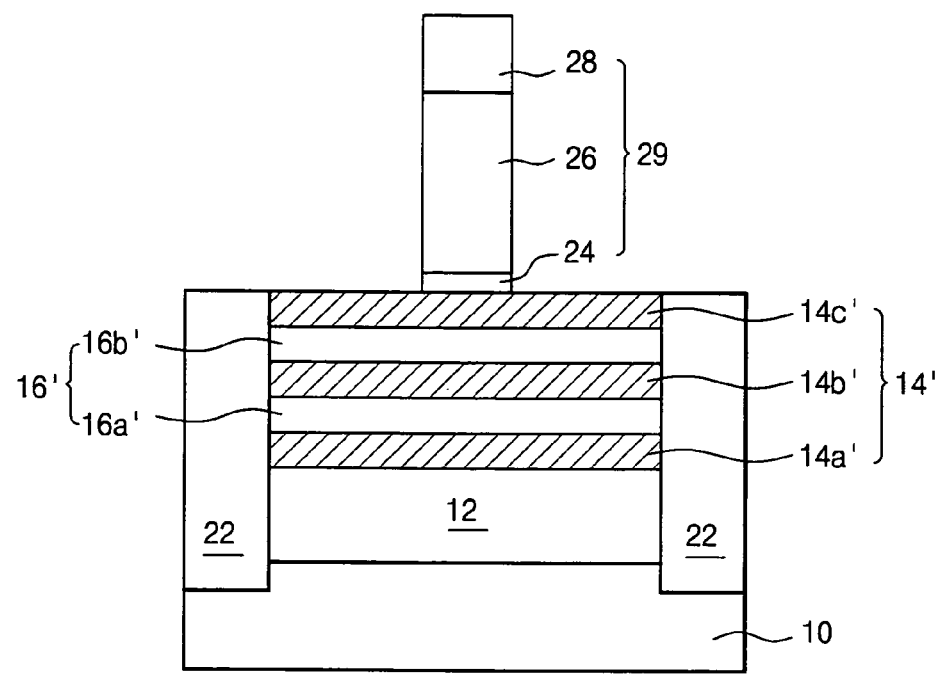
Figure 4F:
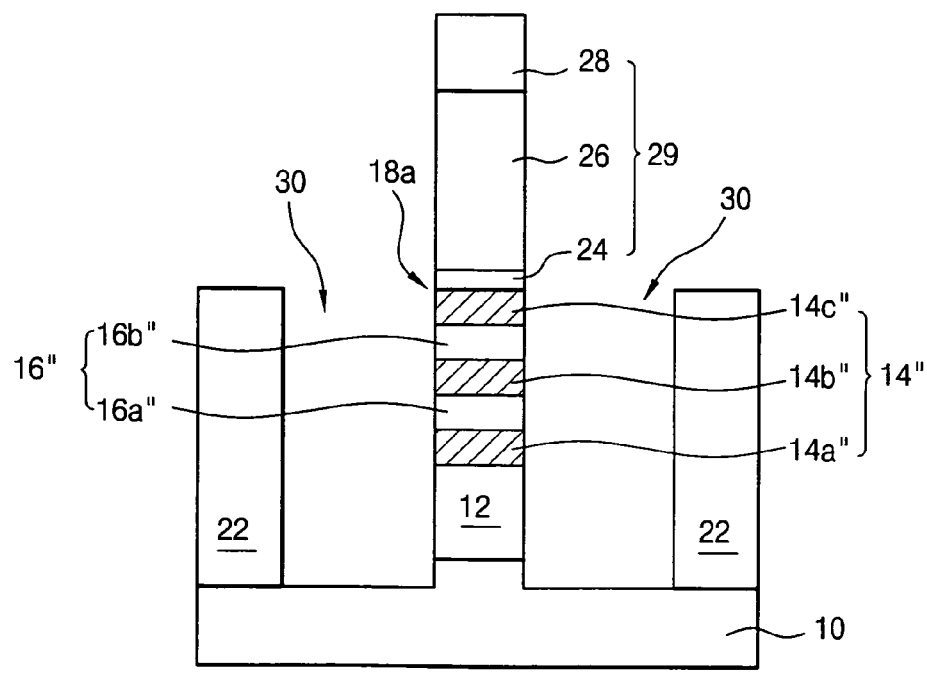
Figure 4G:
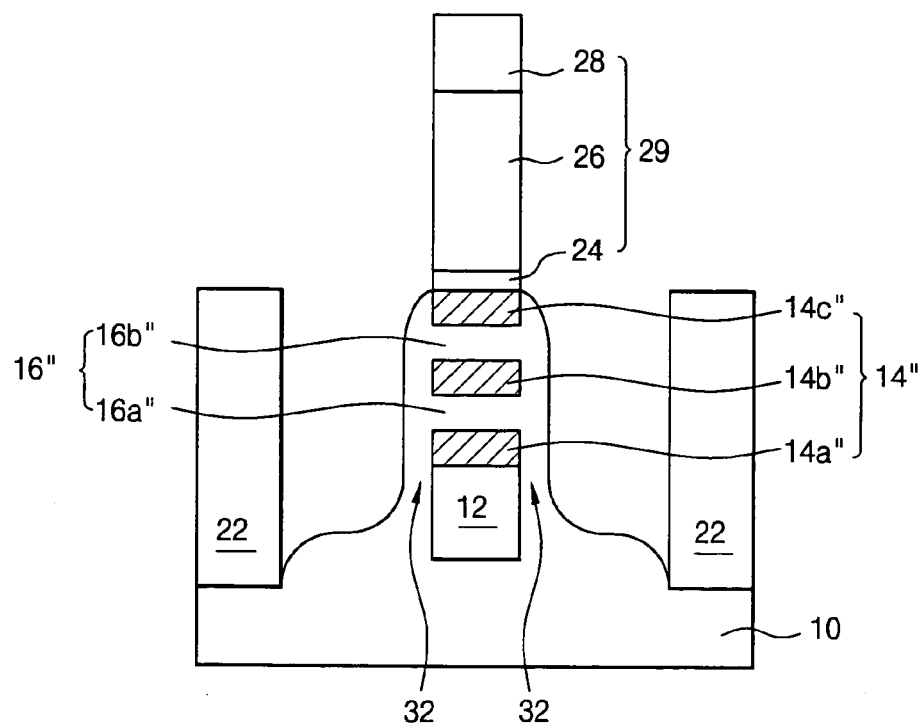
Figure 4H:
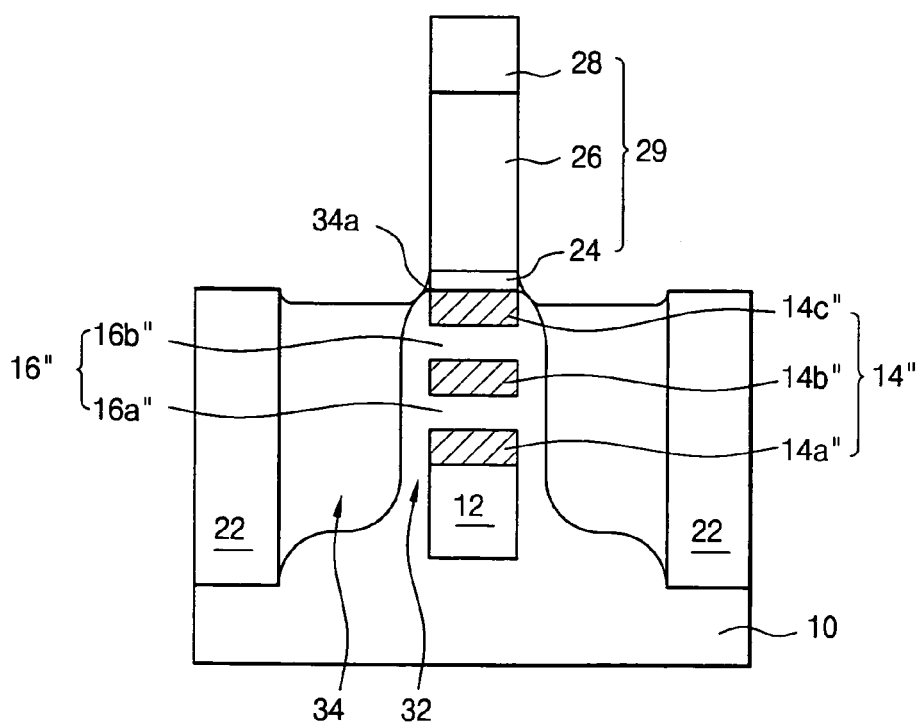
Figure 4I:
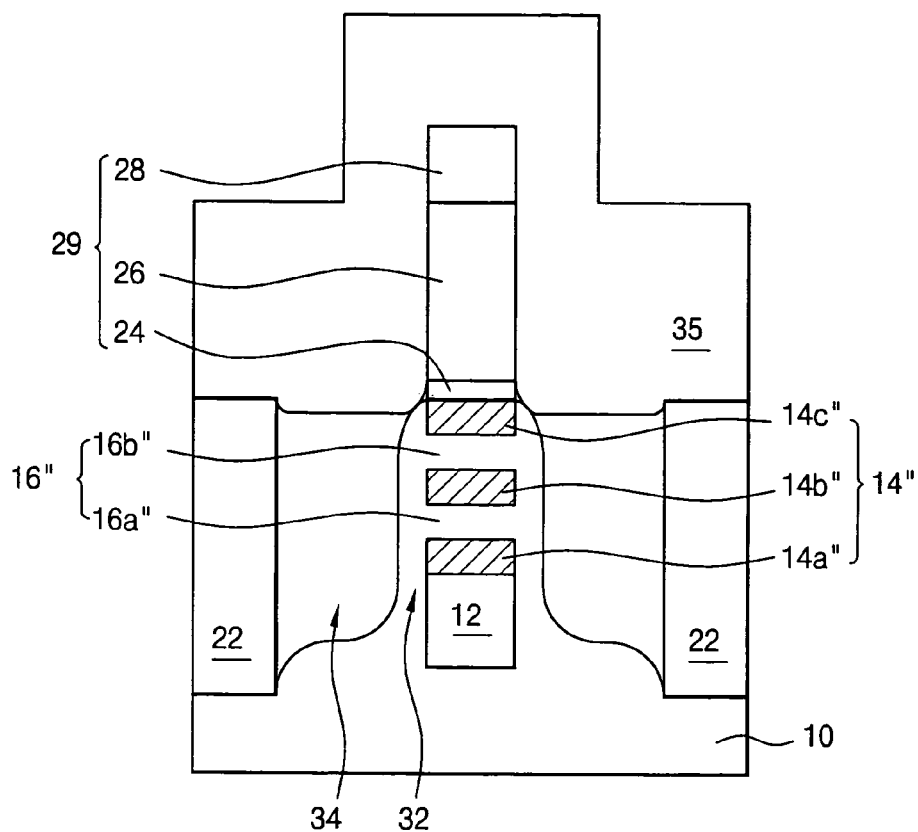
Figure 4J:
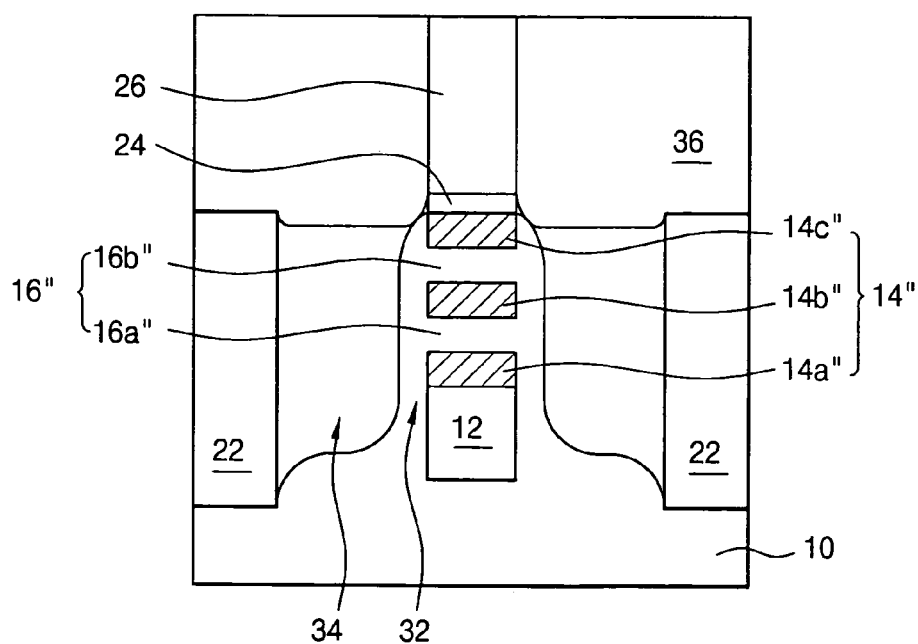
Figure 4K:
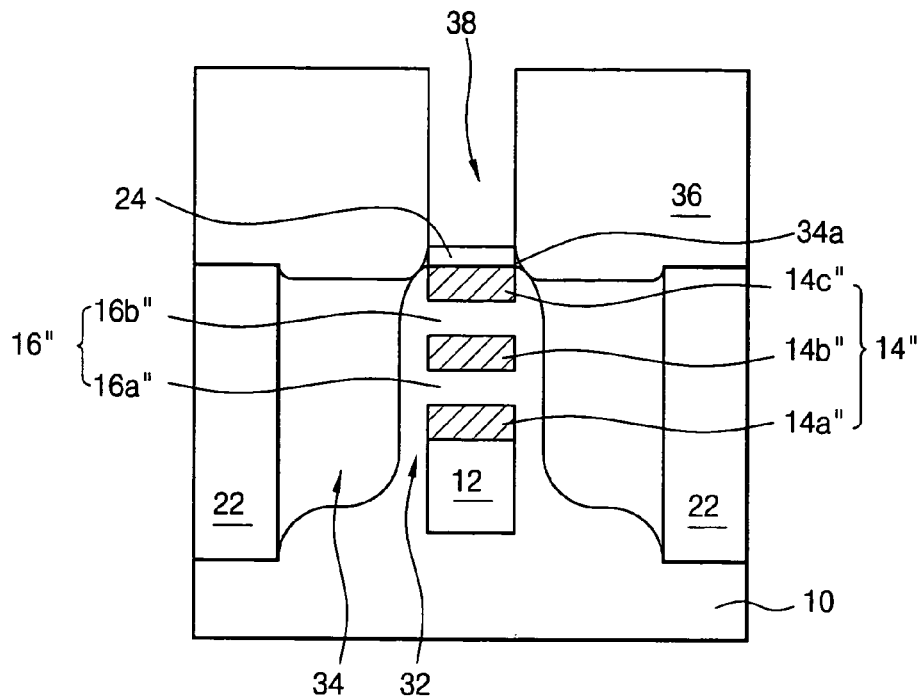
Figure 4L:
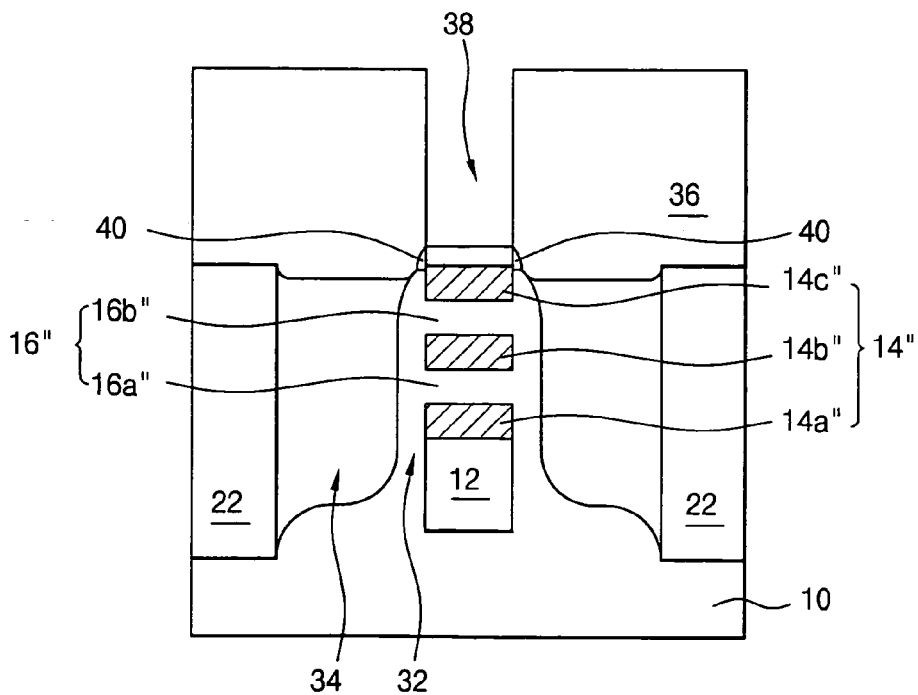
Figure 4M:
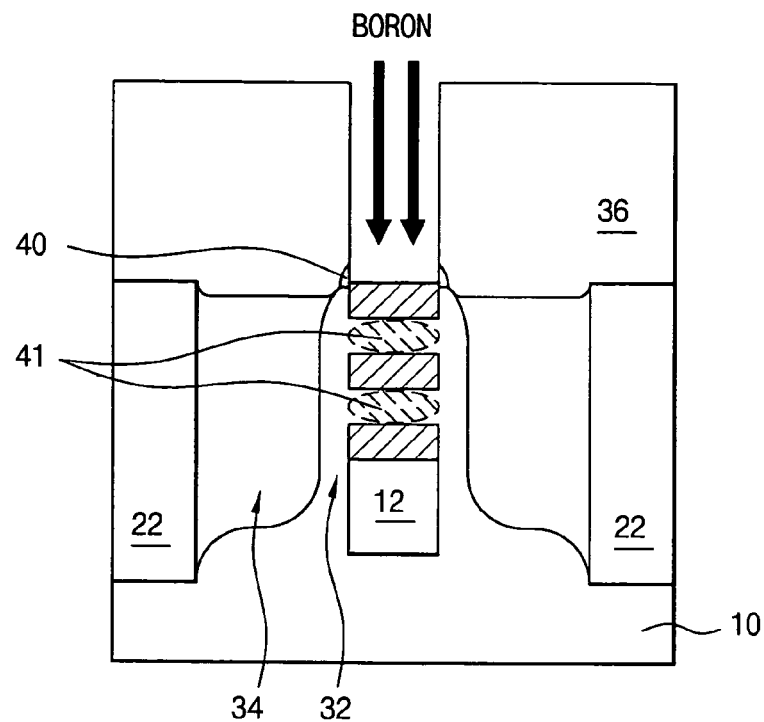
Figure 4N:
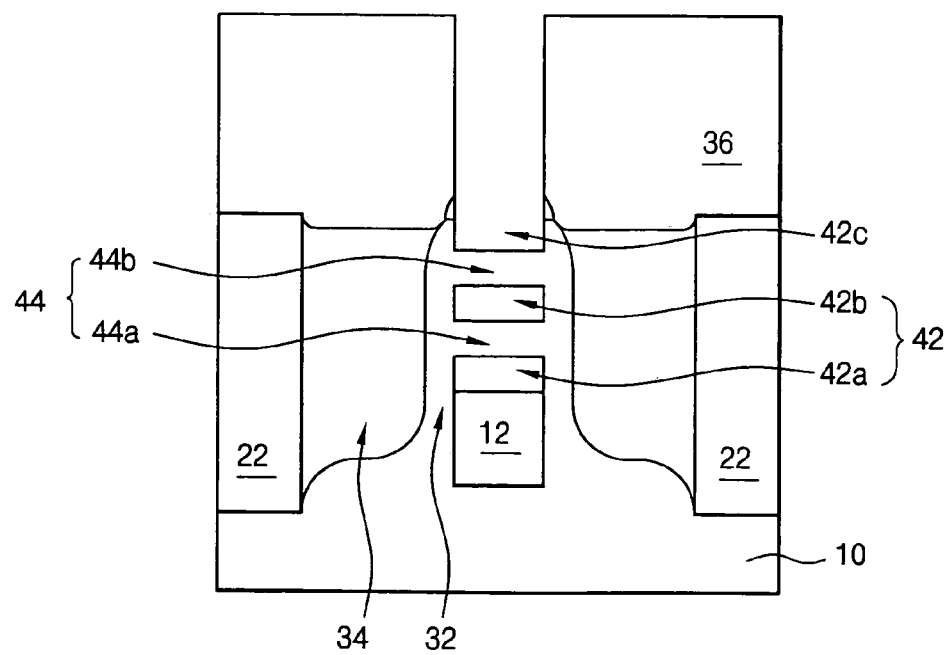
Figure 4O:
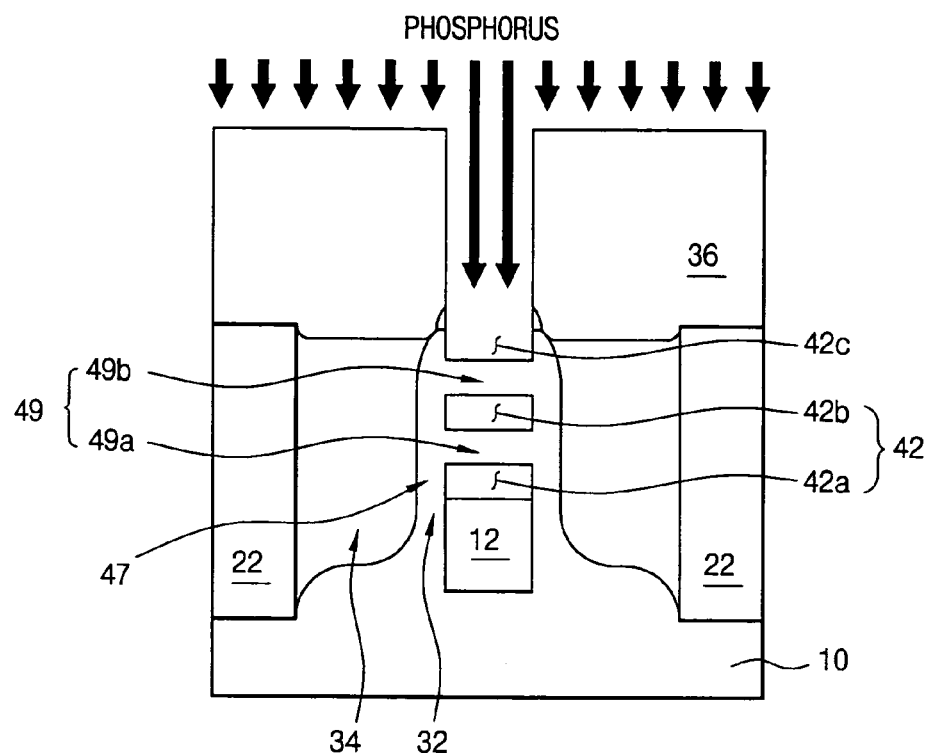
Figure 4P:
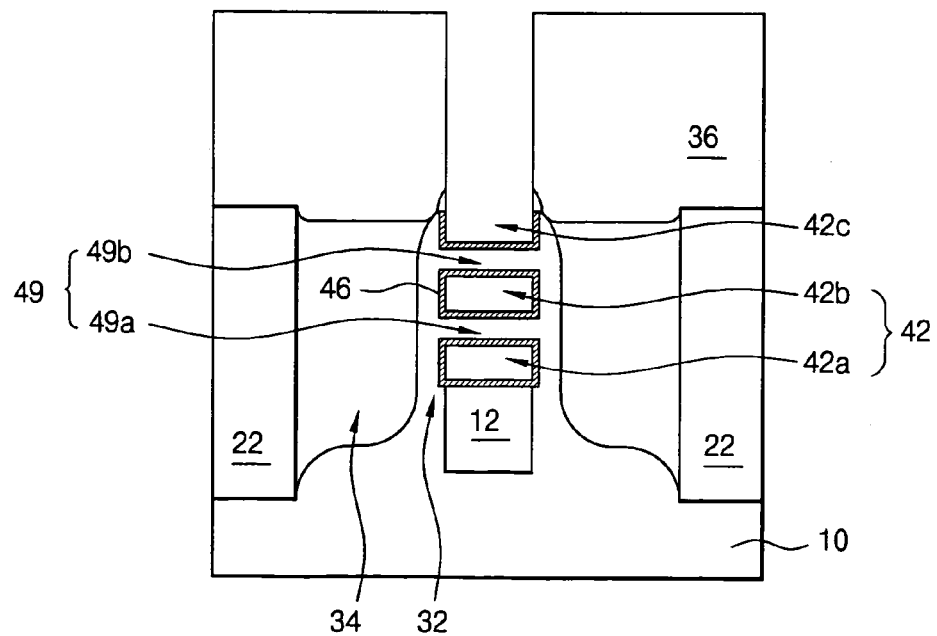
Figure 4Q:
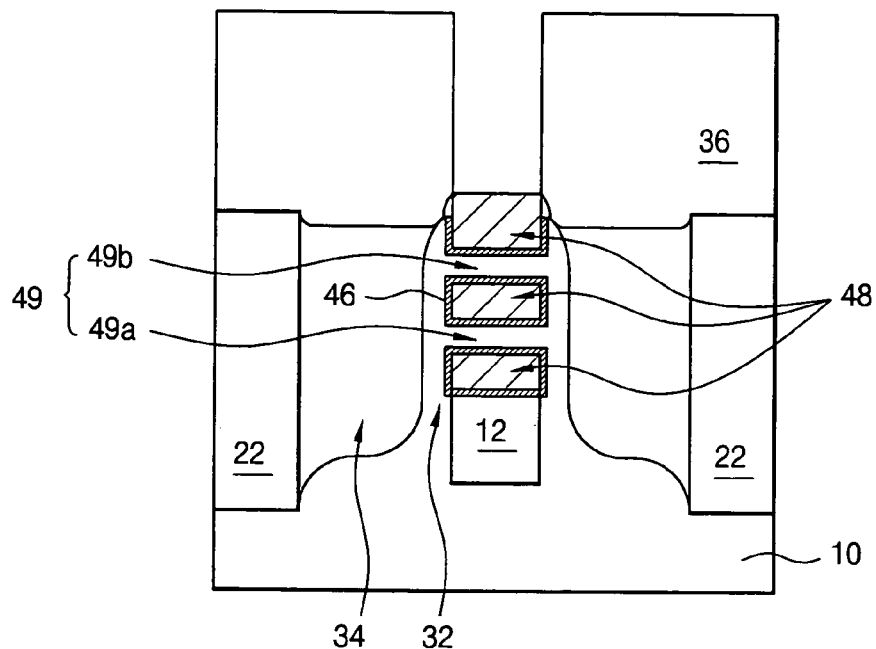
Figure 4R:
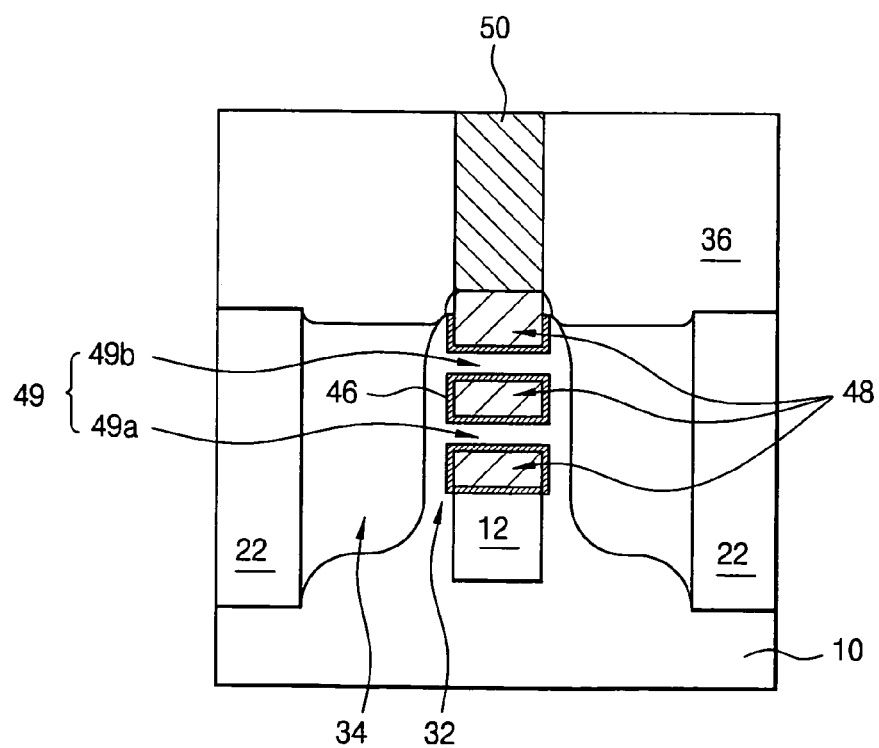
Figure 4S:
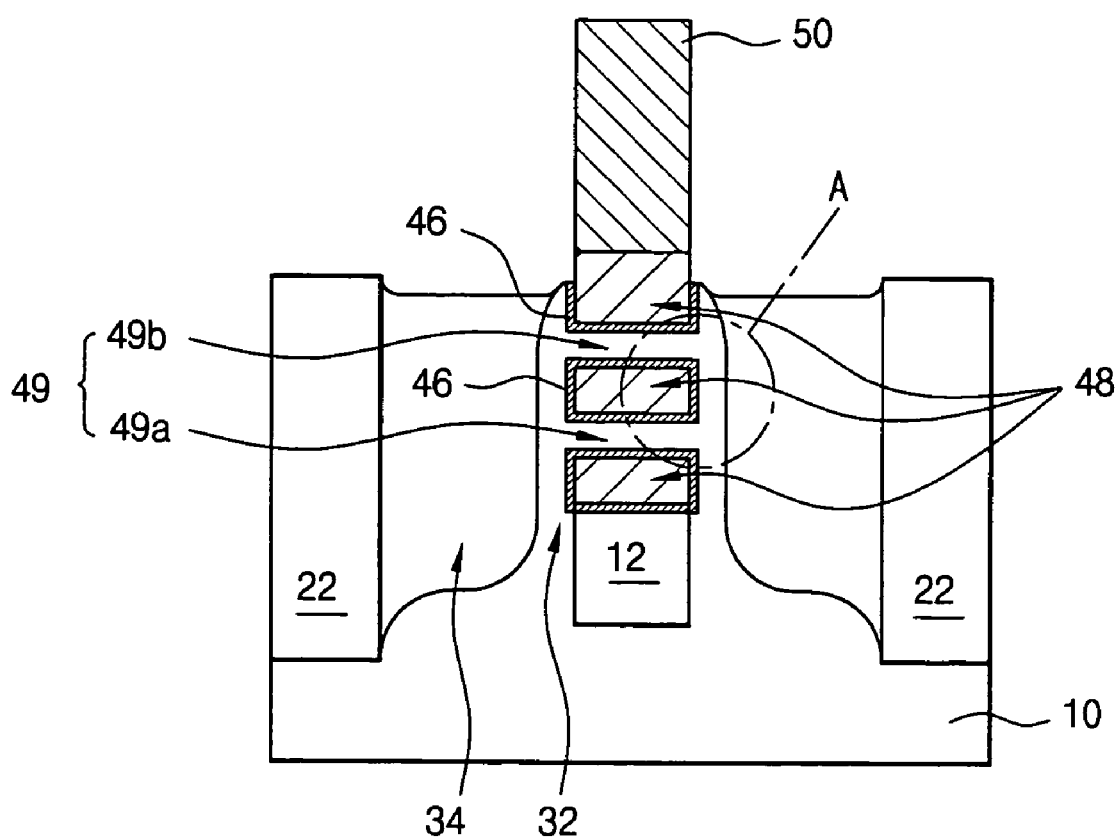

FIGS. 4A to 4S are cross-sectional views illustrating methods of manufacturing a semiconductor device according to the first embodiments of the present invention. FIGS. 5A to 5G are perspective views illustrating some steps of the methods of manufacturing a semiconductor device according to the first embodiments of the present invention.

Referring to FIG. 4A, an impurity of the same conductivity type as that of a substrate 10 is ion-implanted into a main surface of the substrate 10 to form a heavily doped region (well region) 12 which can reduce or prevent the operation of a bottom transistor. The substrate 10 comprises silicon (Si), silicon-germanium (SiGe), silicon-on-insulator (SOI), silicon-germanium-on-insulator (SGOI) and/or other conventional substrates/layers. In some embodiments, the semiconductor substrate 10 comprises single crystalline Si.

Referring to FIG. 4B, a plurality of interchannel layers 14 and a plurality of channel layers 16 are stacked alternately upon each other on the substrate 10. First, a first interchannel layer 14a is formed on the substrate 10, and then, a first channel layer 16a is formed on the first interchannel layer 14a. An uppermost interchannel layer 16c is formed at an uppermost position.

The channel layers 16 and the interchannel layers 14 are comprised of single crystalline semiconductor materials having an etch selectivity with respect to each other. In some embodiments, the channel layers 16 are formed from a single crystalline Si epitaxial film having a thickness of about 300 Å and the interchannel layers 14 are formed from a single crystalline Ge (including, for example, a single crystalline SiGe) epitaxial film having a thickness of about 300 Å.

The repeating number and thickness of the channel layers 16 and the interchannel layers 14 can be controlled in accordance with a purpose of a transistor to be formed. In some embodiments, the channel layers 16 and the interchannel layers 14 are stacked alternately with each other such that the total thickness becomes about 1000~1500 Å.

As also shown in FIG. 4B, the interchannel layers 14 and the channel layers 16 may be doped with boron. Boron doping may be provided for an N-channel device and, in some embodiments, also may be provided for a P-channel device, wherein the P-channel device is later doped with phosphorus at a higher concentration, to provide net N-type doping. However, according to embodiments of the present invention, phosphorus doping is not performed in FIG. 4B for N-channel or P-channel devices. Thus, although FIG. 4B shows an optional boron doping step, phosphorus doping is not performed.

Referring to FIG. 4C, the plurality of channel layers 16 and the plurality of interchannel layers 14 are patterned through a photolithography process to form a pre-active pattern 18 having a first channel layer pre-pattern (or first channel layer preliminary pattern) 16' and a first interchannel layer pre-pattern (or first interchannel layer preliminary pattern) 14'. The first channel layer pre-pattern 16' comprises a plurality of first channel layer patterns 16a' and 16b'. The first interchannel layer pre-pattern 14' comprises a plurality of interchannel layer patterns 14a', 14b' and 14c'. The etching process is performed for sufficient time to form an isolation trench 20 having a depth deeper than that of the impurity region 12 in the substrate 10.

Next, an oxide layer is deposited by a chemical vapor deposition (CVD) method so as to fill up the isolation trench 20. The deposited oxide layer is planarized by an etch-back process or a chemical mechanical polishing (CMP) process until the surface of the pre-active pattern 18 is exposed, thereby forming field regions 22 surrounding the pre-active pattern 18.

Referring to FIG. 4D, an etch-stopping layer 23, a dummy gate layer 25 and an anti-reflective layer 27 are successively stacked on the substrate 10 including the pre-active pattern 18. The etch-stopping layer 23 is formed to a thickness of about 100~200 Å by a material having an etch selectivity with respect to the dummy gate layer 25, such as silicon nitride. The etch-stopping layer 23 plays a role of reducing or preventing the underlying pre-active pattern from being etched during etching the dummy gate layer 25. The dummy gate layer 25 for defining a gate region is formed to a thickness of about 1000 Å by silicon oxide. The anti-reflective layer 27 for reducing or preventing the reflection of light from the lower substrate during a photolithography process is formed to a thickness of about 300 Å by using silicon nitride.

Referring to FIG. 4E, through a photolithography process, the anti-reflective layer 27, the dummy gate layer 25 and the etch-stopping layer 23 are successively dry-etched away to form a gate hard mask 29 having an anti-reflective layer pattern 28, a dummy gate pattern 26 and an etch-stopping layer pattern 24. The gate hard mask 29 has a width of about 0.2~0.3 um and plays a role of self-aligning the source/drain regions to the channel region.

Referring to FIG. 4F, using the gate hard mask 29 as an etching mask, the exposed pre-active pattern 18 is etched away until the surface of the substrate 10 is exposed, thereby defining regions 30 where the source/drain regions are to be formed. Thus, only the channel region of the pre-active pattern 18 remains. At this time, the etching process is preformed for sufficient time to etch the upper portion of the semiconductor substrate 10 to below the projected range of the heavily doped region 12.

As a result, there are formed an active channel pattern 18a including a second channel layer pattern 16" and a second interchannel layer pattern 14" under the gate hard mask 29 as shown in the figure. The second channel layer pattern 16" is comprised of a plurality of second channel layer patterns 16a" and 16b" and the second interchannel layer pattern 14" is comprised of a plurality of interchannel layer patterns 14a", 14b" and 14b".

In a conventional GAA structure where the active region is not etched and utilized as the source/drain regions, the tunnel may extend horizontally to increase the length of the gate electrode when isotropically etching the interchannel layer. In contrast, in some embodiments of the present invention, the regions of the active pattern where the source/drain regions are to be formed are etched and then, the etched regions are filled up with a conductive material to form the source/drain. Accordingly, since the horizontal length of the interchannel layers 14 constituting the active channel pattern 18a can be limited within the gate length region, it can reduce or prevent tunnels from extending horizontally when the second interchannel layers 14" are isotropically etched to form the tunnels in a subsequent process. So, a highly integrated MOS transistor having a gate length smaller than a channel width can be obtained.

Referring to FIG. 4G, a selective epitaxial single crystalline film is partially grown to a thickness of about 300~400 Å on the surfaces of the etched regions 30 of the semiconductor substrate 10 and on the side of the active channel pattern 18a, thereby forming source/drain extension layers 32. Here, the selective epitaxial single crystalline film is doped, if desired, by a tilted ion implantation so that each of the second channel layer patterns 16a" and 16b" have a uniform source/drain impurity concentration. In some cases, with or without performing the ion implantation, a dopant is solid-phase diffused from source/drain regions that are heavily doped in a subsequent annealing process to thereby form the source/drain extension layers 32 having a uniform source/drain doping concentration with respect to each of the channel layers 16.

Referring to FIG. 4H, a conductive material is deposited on the source/drain extension layers 32, and in some embodiments so as to completely fill up the etched regions 30, thereby forming a conductive film. Then, the conductive film is etched back to the surface of the active channel pattern 18a to form the source/drain regions 34 comprising the heavily doped conductive film only within the etched regions 30. In some embodiments, the conductive material comprises doped polysilicon, metal and/or metal silicide. As described above, in some embodiments, the source/drain regions 34 have a uniform doping profile vertically along the active channel pattern 18a because the source/drain regions 34 are formed by deposition. Here, tails 34a of the conductive film for the source/drain may remain under the side of the gate hard mask 29.

Optionally, in order to reduce the surface roughness of the source/drain extension layers 32 comprising the epitaxial single crystalline film and to recrystallize the source/drain extension layers 32, a heat treatment may be performed at a high temperature in a hydrogen (H$_2$) ambient before depositing the conductive film.

Referring to FIG. 4I, silicon nitride is deposited so as to cover the gate hard mask 29 on the source/drain regions 34 and the field regions 22, thereby forming a mask layer 35. In some embodiments, the mask layer 35 comprises the same material as that of the uppermost layer constituting the gate hard mask 29, i.e., the anti-reflective layer pattern 28. Here, before depositing the mask layer 35, an oxide layer may be formed by oxidizing the surface portions of the source/drain regions 34 and the exposed surface portion of the active channel pattern 18a of the channel region through a thermal oxidation process. This oxide layer serves as a stress-buffering layer.

Figure 5A:
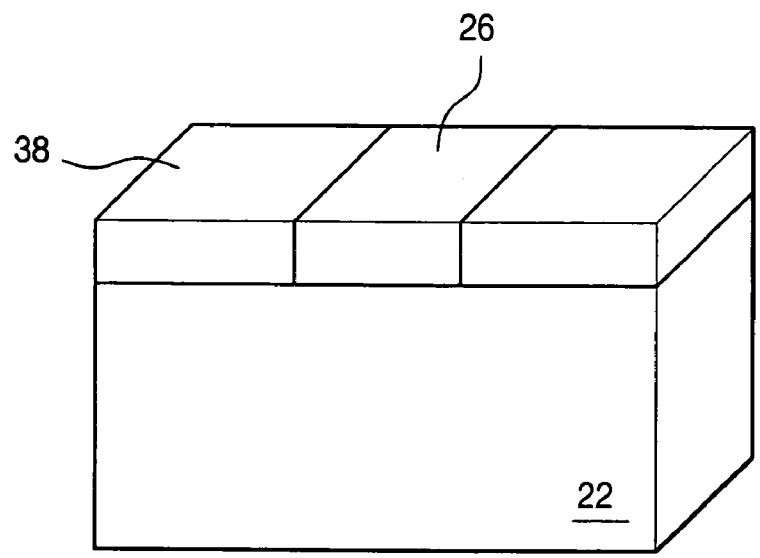
FIGS. 5A to 5G are perspective views illustrating some steps of methods of manufacturing a device according to the first embodiments of the present invention.

Referring to FIG. 4J, until the surface of the dummy gate pattern 26 is exposed, the mask layer 35 is removed by etch-back or chemical mechanical polishing to form mask patterns 36 exposing the dummy gate pattern 26. FIG. 5A is a perspective side view particularly illustrating the step as shown in FIG. 4J.

Figure 5B:
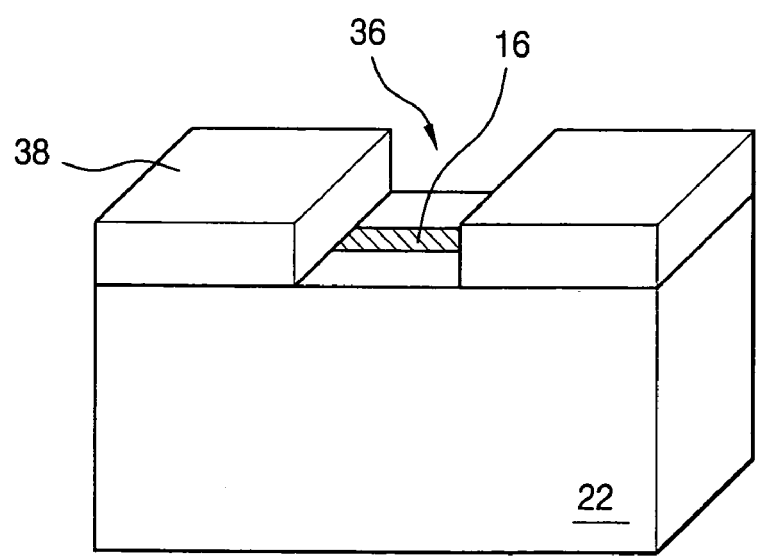

Referring to FIG. 4K, using the mask patterns 26, the dummy gate pattern 26 is selectively removed to form a gate trench 38. The etch-stopping layer pattern 24 reduces or prevents the underlying pre-active pattern 18 from being etched during the etching process of removing the dummy gate pattern 26. FIG. 5B is a perspective side view particularly illustrating the step as shown in FIG. 5K.

Referring to FIG. 4L, if the conductive tails 34a remain under the sides of the gate hard mask 29, an oxidation process and/or a wet etching process is executed to remove the conductive tails 34a. In some embodiments, the oxidation process is carried out to convert the conductive tails 34a into the insulating layers 40, thereby preventing the conductive tails 34a from being short-circuited with a gate electrode to be formed in a subsequent process.

Referring to FIG. 4M, the etch-stopping layer pattern 24 exposed through the gate trench 38 is removed. When the active channel pattern 18a of the channel region is not already doped with boron impurities in FIG. 4B, a boron channel ion implantation may be locally performed through the gate trench 38, as shown in FIG. 4M, to thereby dope the active channel pattern 18a of the channel region with boron. In some embodiments, the channel boron ion implantation is carried out such that the projected range is formed within each of the second channel layer patterns 16a" and 16b". Here, the reference numeral 41 indicates the channel boron ion-implanted regions. Further, in some embodiments, the channel boron ion implantation is executed such that each of the second channel layer patterns 16a" and 16b" may have different doping concentrations from each other, thereby obtaining a transistor that may be operated according to the applied gate voltage.

In other embodiments of the present invention, boron doping may be performed as shown in both FIG. 4B and in FIG. 4M. It will be understood, however, that phosphorus doping is not performed during any of FIGS. 4A–4M, according to embodiments of the present invention.

Figure 5C:
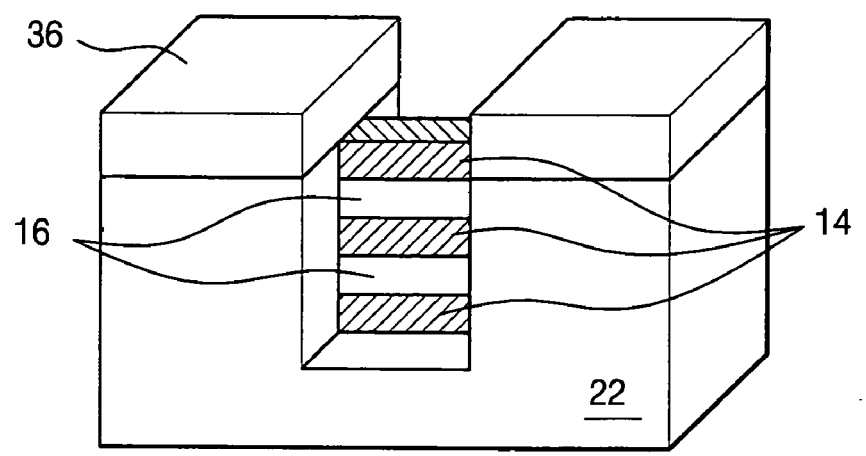

Next, using the source/drain regions 34 as an etching mask, the field regions 22 are selectively etched away to expose the sides of the active channel pattern 18a of the channel region, as shown in FIG. 5C. FIG. 5C is a perspective side view particularly showing a portion that is not shown in the cross-sectional view of FIG. 4M.

Referring to FIG. 4N, through an isotropic etching process, the plurality of interchannel layer patterns 14a", 14b" and 14c" are selectively removed to form a plurality of tunnels 42a and 42b passing through the active channel pattern 18a and a tunnel groove 42c in a tunnel shape, the tunnel groove 42c being located at an uppermost position. Here, the second channel layer patterns 16a" and 16b" form a plurality of channels 44a and 44b. Preferably, the plurality of tunnels 42a and 42b and the plurality of channels 44a and 44b are formed to have the same width as that of the dummy gate pattern 26 within a range of about 50%. Since phosphorus doping has not been performed up to this point, conventional poly-etchant may be used to selectively etch the undoped or boron doped interchannel layer patterns 14" relative to the channel layer patterns 16".

Figure 5D:
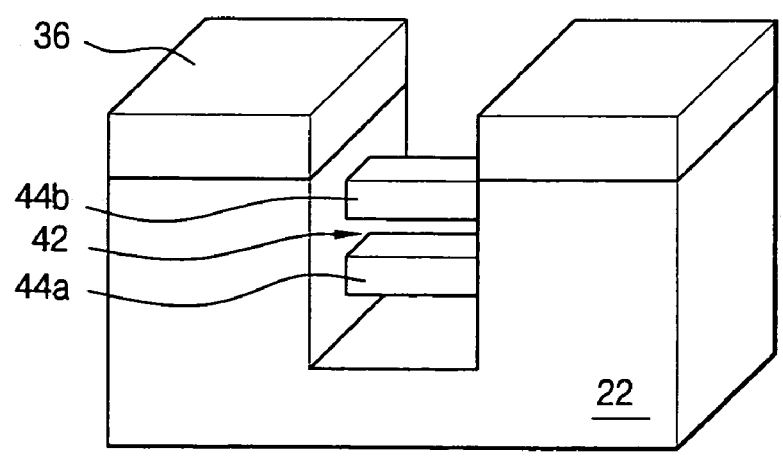

FIG. 5D is a perspective side view particularly illustrating the step as shown in FIG. 4N. As shown, the side surface portions of the source/drain extension layers 32 are partially exposed through the tunnels 42a and 42b.

Referring now to FIG. 4O, the P-channel regions 49a and 49b are doped with phosphorus after the tunnel regions 42 have been formed. Stated differently, the channels 49 are doped with phosphorus after selectively removing the plurality of interchannel layers 14". Boron doping also may be performed at this point, if desirable. In some embodiments, phosphorus doping of FIG. 4O is performed using ion implantation. In other embodiments, phosphorus doping of FIG. 4O is performed using plasma doping. Plasma doping may be used in some embodiments of the present invention, to obtain uniformly phosphorus doped P-channel regions 49. Plasma doping processes are well known to those having skill in the art and need not be described further herein.

Figure 5E:
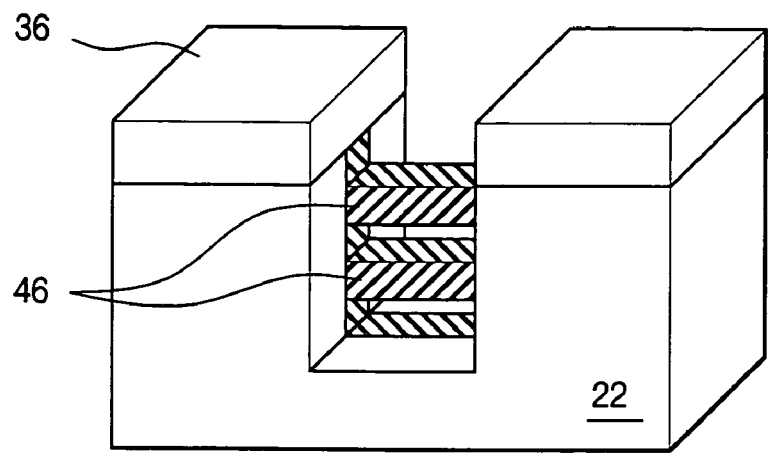

Referring to FIG. 4P, a thermal oxidation process is carried out to form a gate-insulating layer 46 to a thickness of about 10~70 Å on the surfaces of the plurality of channels 49a and 49b and the inner surface of the tunnel groove 42c. FIG. 5E is a perspective side view particularly illustrating the step as shown in FIG. 4P. As shown in the figure, the gate-insulating layer 46 is also continuously formed on a portion of the surfaces of the source/drain extension layers 32 exposed by the channels.

Here, in order to reduce the surface roughness of the channels 49a and 49b, a heat treatment may be performed at a high temperature in a hydrogen ($H_2$) or argon (Ar) ambient before forming the gate-insulating layer 46, thereby decreasing the roughness between the gate-insulating layer 46 and the channels. Alternatively, the gate-insulating layer 46 may be comprised of silicon oxynitride.

Figure 5F:
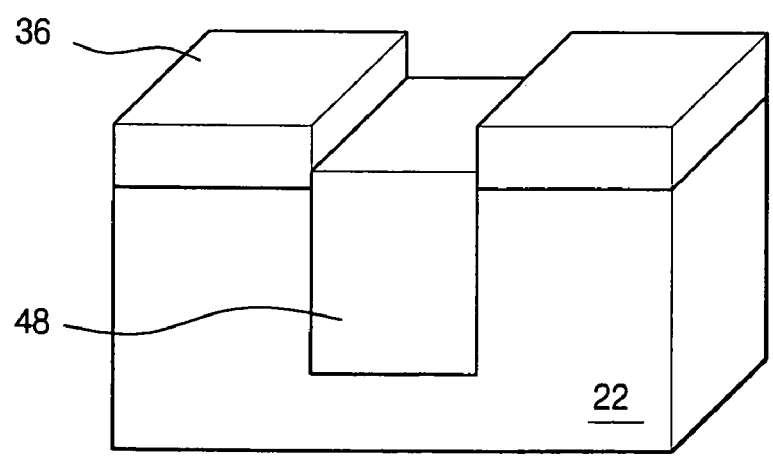

Referring to FIG. 4Q, a gate electrode 48 is formed so as to fill up the plurality of tunnels 42a and 42b and the tunnel groove 42c and to surround the plurality of channels 49a and 49b. In some embodiments, the gate electrode 48 comprises doped polysilicon. FIG. 5F is a perspective side view particularly showing the step as shown in FIG. 3P.

Figure 5G:
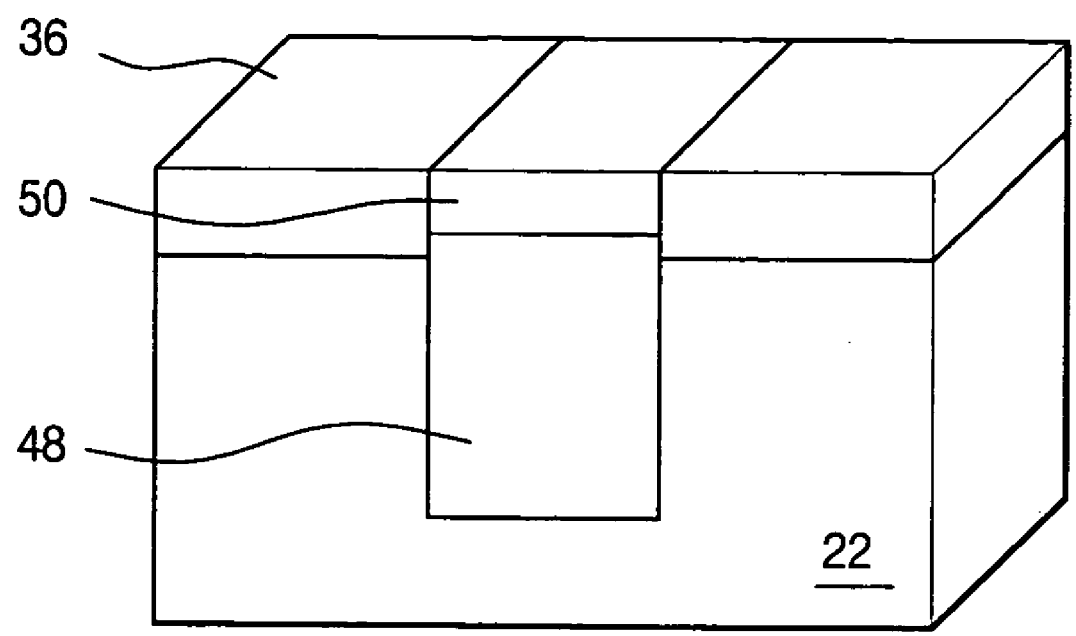

Referring to FIG. 4R, a gate stack layer 50 including a metal silicide for reducing a gate resistance is formed on the polysilicon gate electrode 48. Here, the gate stack layer 50 may be comprised of an insulating material for capping the gate, e.g., silicon oxide or silicon nitride. FIG. 5G is a perspective side view illustrating the step as shown in FIG. 4R.

Referring to FIG. 4S, the mask patterns 36 are removed and then, subsequent processes such as metal interconnection are carried out to complete a vertical MOS transistor having multiple channels. In some cases, the mask patterns 36 may remain to serve as an insulating interlayer.

EMBODIMENT 2

Figure 6A:
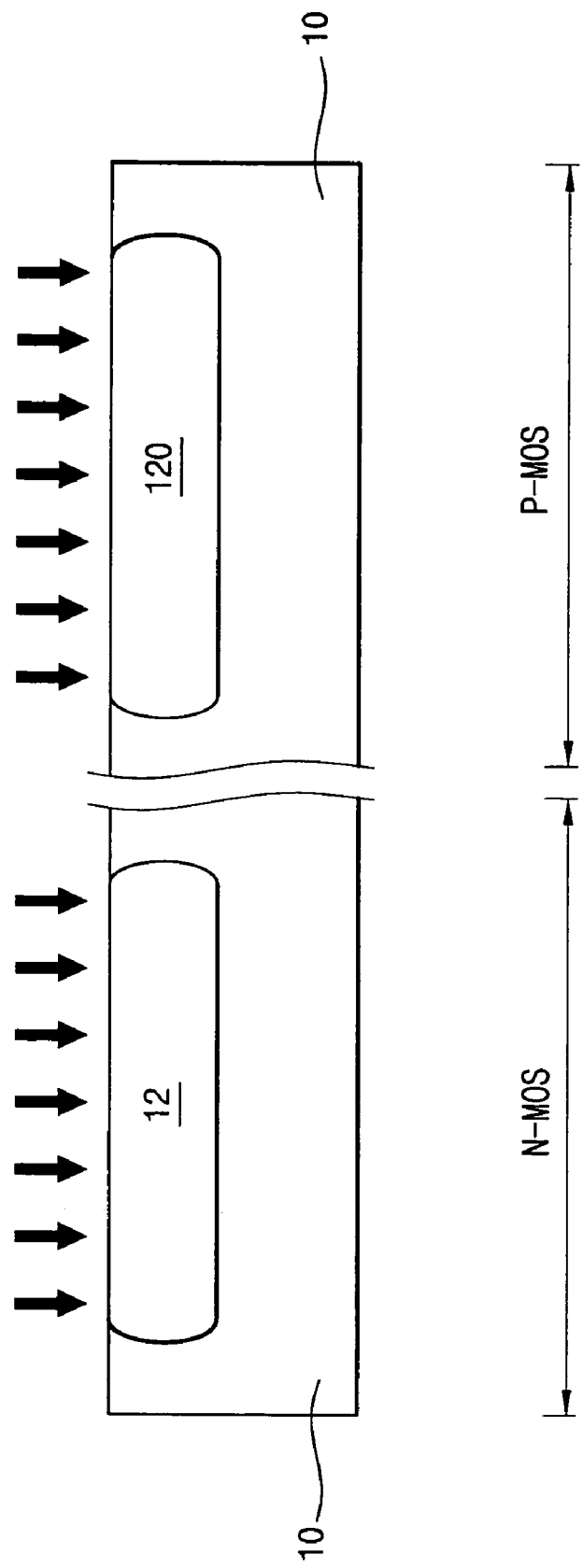
FIGS. 6A–6R are cross-sectional views illustrating methods of manufacturing a device in accordance with second embodiments of the present invention.

FIGS. 6A–6R are cross-sectional views of methods of manufacturing integrated circuit field effect transistors according to second embodiments of the present invention. In these embodiments, integrated circuit N-channel and P-channel field effect transistors, commonly referred to as N-MOS and P-MOS transistors, are fabricated in a single integrated circuit substrate, to provide complementary MOS (CMOS) devices.

As will be described in connection with FIGS. 6A–6R, an N-channel pre-active pattern and a P-channel pre-active pattern are formed on a surface of a substrate, while refraining from doping the N-channel and P-channel pre-active patterns with phosphorus. The respective N-channel and P-channel pre-active patterns comprise a series of interchannel layers and respective N-channel layers and P-channel layers stacked alternately upon each other. Source/drain regions are then formed on the substrate, at opposite ends of the each of the N-channel and P-channel pre-active patterns. The plurality of interchannel layers are then selectively removed to form a plurality of tunnels passing through the N-channel and P-channel pre-active patterns, thereby defining respective active N-channel and P-channel patterns comprising the tunnels and a plurality of respective N-channels and P-channels comprising the channel layers. The P-channels of the active P-channel patterns are then doped with phosphorus after selectively removing the plurality of interchannel layers, while refraining from doping the N-channels of the active N-channel patterns with phosphorus after removing a plurality of interchannel layers. A gate electrode is then formed in the tunnels and surrounding the N-channels and the P-channels.

As also will be described in connection with FIGS. 6A–6R, in some embodiments, the N-channels of the active N-channel patterns are doped with boron, while refraining from doping the P-channels of the active P-channel patterns with boron, after selectively removing the plurality of interchannel layers. In other embodiments, prior to selectively removing the plurality of interchannel layers, the N-channel layers of the N-channel pre-active patterns are doped with boron, while refraining from doping the P-channel layers of the P-channel pre-active patterns with boron. In yet other embodiments, after selectively removing the plurality of interchannel layers, the N-channels of the active N-channel patterns and the P-channels of the active P-channel patterns are doped with boron. Finally, in other embodiments, before selectively removing the plurality of interchannel layers, the N-channel layers of the N-channel pre-active patterns and the P-channel layers of the P-channel pre-active patterns are doped with boron. Thus, boron doping may be performed in the N-channels and, optionally, in the P-channels, before selectively removing the interchannel layers and/or after selectively removing the interchannel layers. However, phosphorus doping of the P-channels is only performed after selectively removing the plurality of interchannel layers.

In FIGS. 6A–6R and subsequent figures, like elements of FIGS. 4A–4S will be designated by like numbers in the N-MOS device on the left side of the figures. Like elements in the P-MOS device at the right side of the figures will be designated by like numbers multiplied by 10 (i.e., an extra "0" is added).

Referring now to FIG. 6A, the same conductivity type as that of a substrate 10 is ion implanted into the substrate 10 to form a first heavily doped region (well region) 12, which can reduce or prevent operation of a bottom transistor. An impurity of the opposite conductivity type as that of the substrate 10 is ion implanted into the substrate 10 to form a second heavily doped region (well region) 120, which can reduce or prevent the operation of a bottom transistor.

Figure 6B:
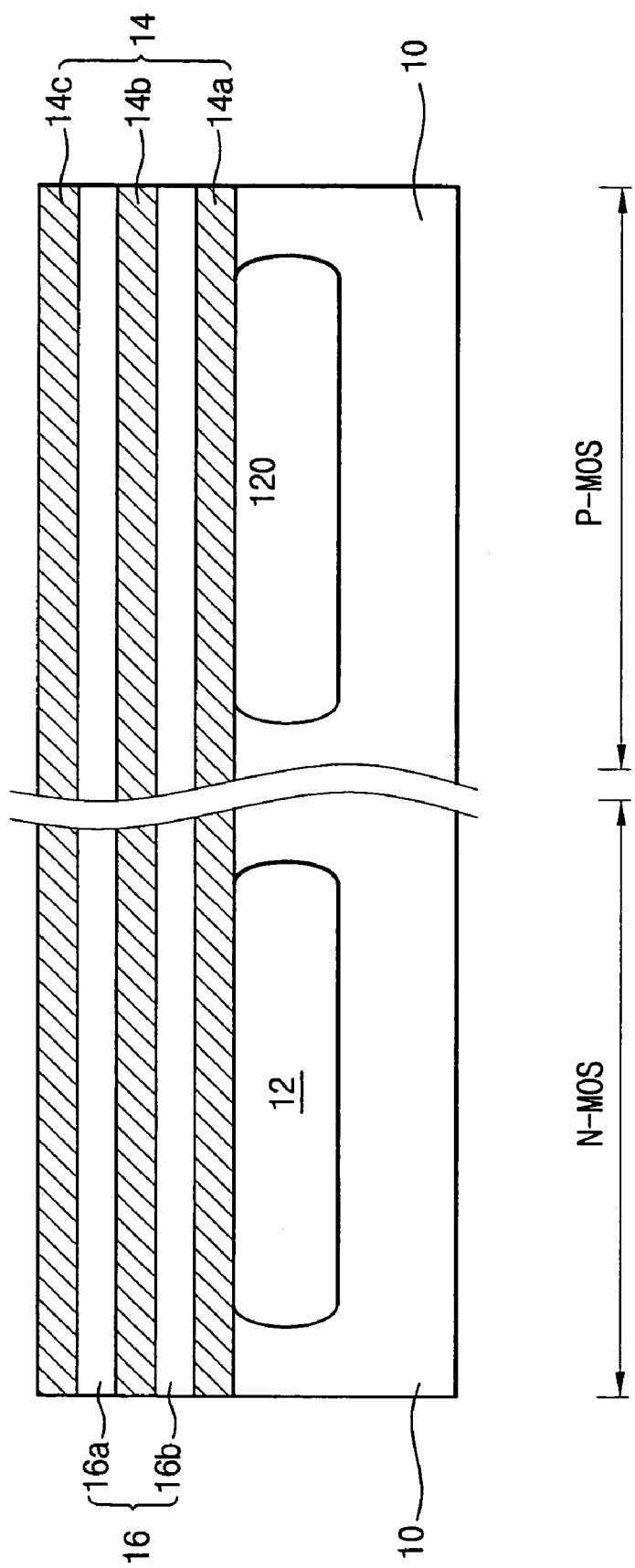

Referring to FIG. 6B, a plurality of interchannel layers 14 and a plurality of channel layers 16 are stacked, as was described in connection with FIG. 4B.

Referring to FIG. 6C, the plurality of channel layers 16 and the plurality of interchannel layers 14 are patterned through a photolithography process as was described in connection with FIG. 4C.

Figure 6D:
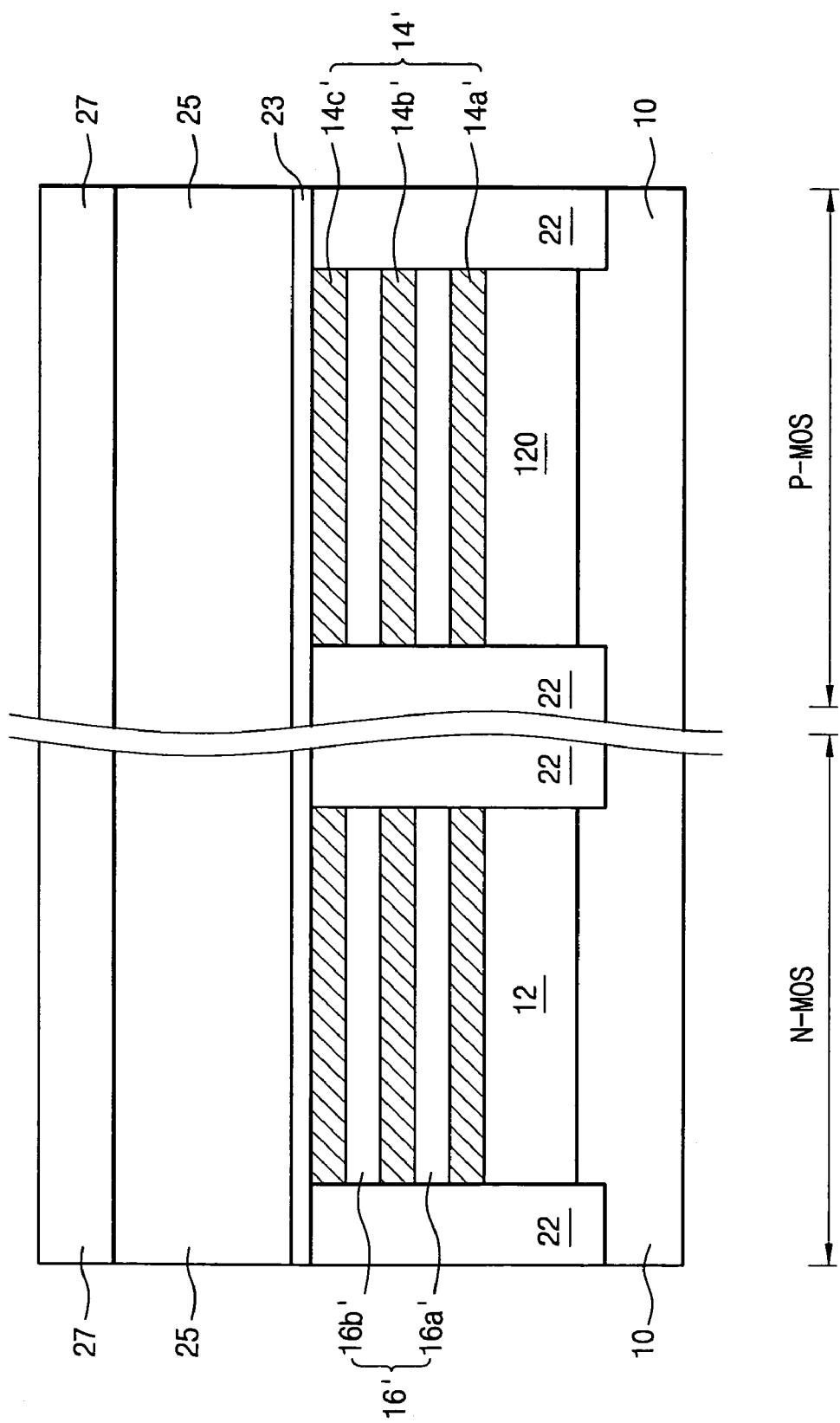
Figure 61:
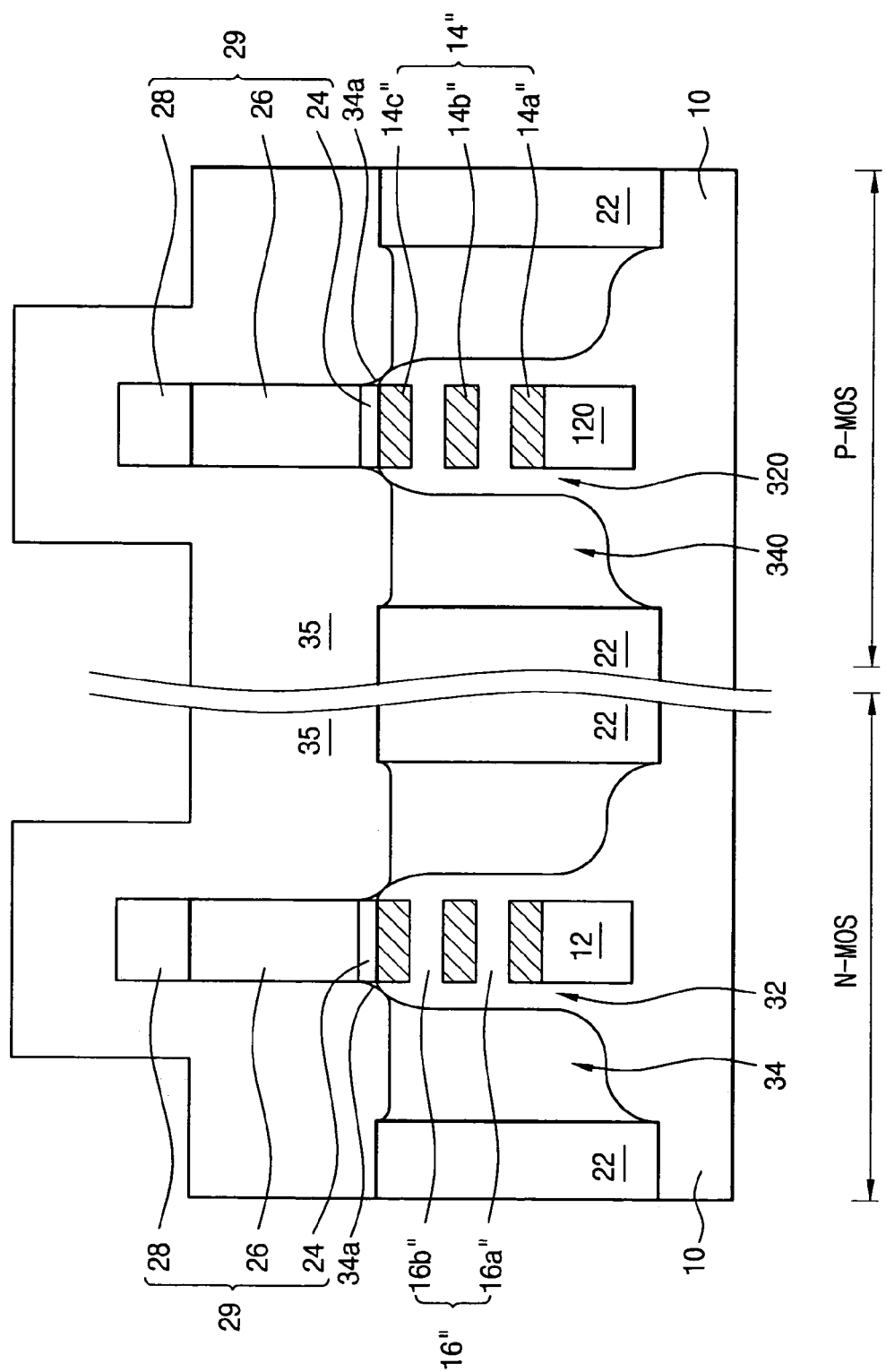

Referring to FIG. 6D, and etch-stopping layer 23, a dummy gate layer 25 and an anti-reflective layer 27 are successively stacked on the substrate 10 as was described in connection with FIG. 4D.

Referring to FIG. 6E, through a photolithography process, the anti-reflective layer 27, the dummy gate layer 25 and the etch stopping layer 23 are etched to form a hard mask 29 as was described in connection with FIG. 4E.

Referring to FIG. 6F, using the gate hard mask 29 as an etching mask, the exposed pre-active pattern 18 is etched away, as was described in connection with FIG. 4F.

Referring to FIG. 6G, a selective epitaxial single crystalline film is partially grown to form source/drain extension layers 32 and 320, as was described in connection with FIG. 4G.

Referring to FIG. 6H, conductive material is deposited on the source/drain extension layers 32 and 320, to thereby form source/drain regions 34 and 340, as was described in connection with FIG. 4H.

Referring now to FIG. 6I, a mask layer 35 is formed as was described in connection with FIG. 4I.

Figure 6J:
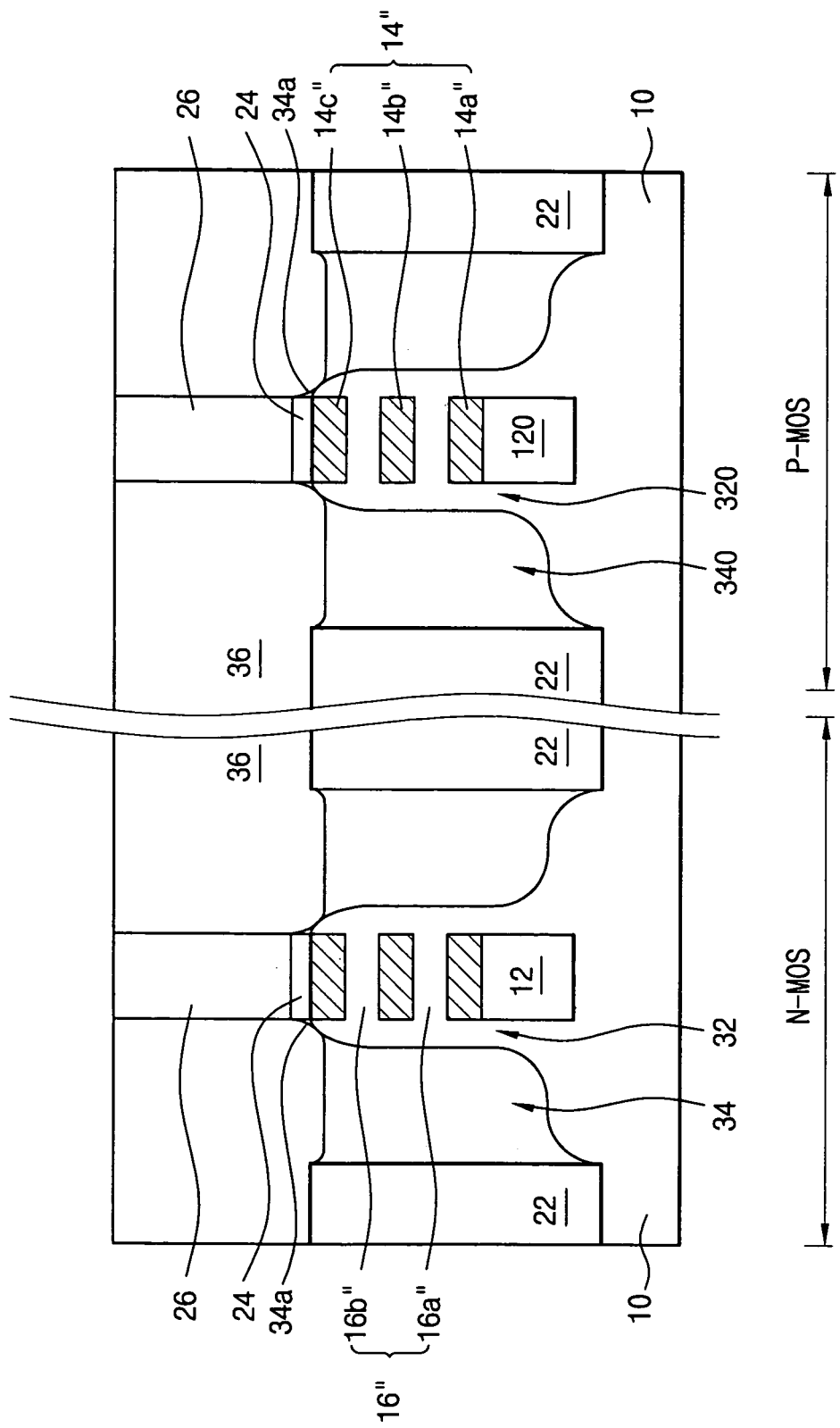

Referring now to FIG. 6J, the mask layer 35 is selectively removed, as was described in connection with FIG. 4J.

Figure 6K:
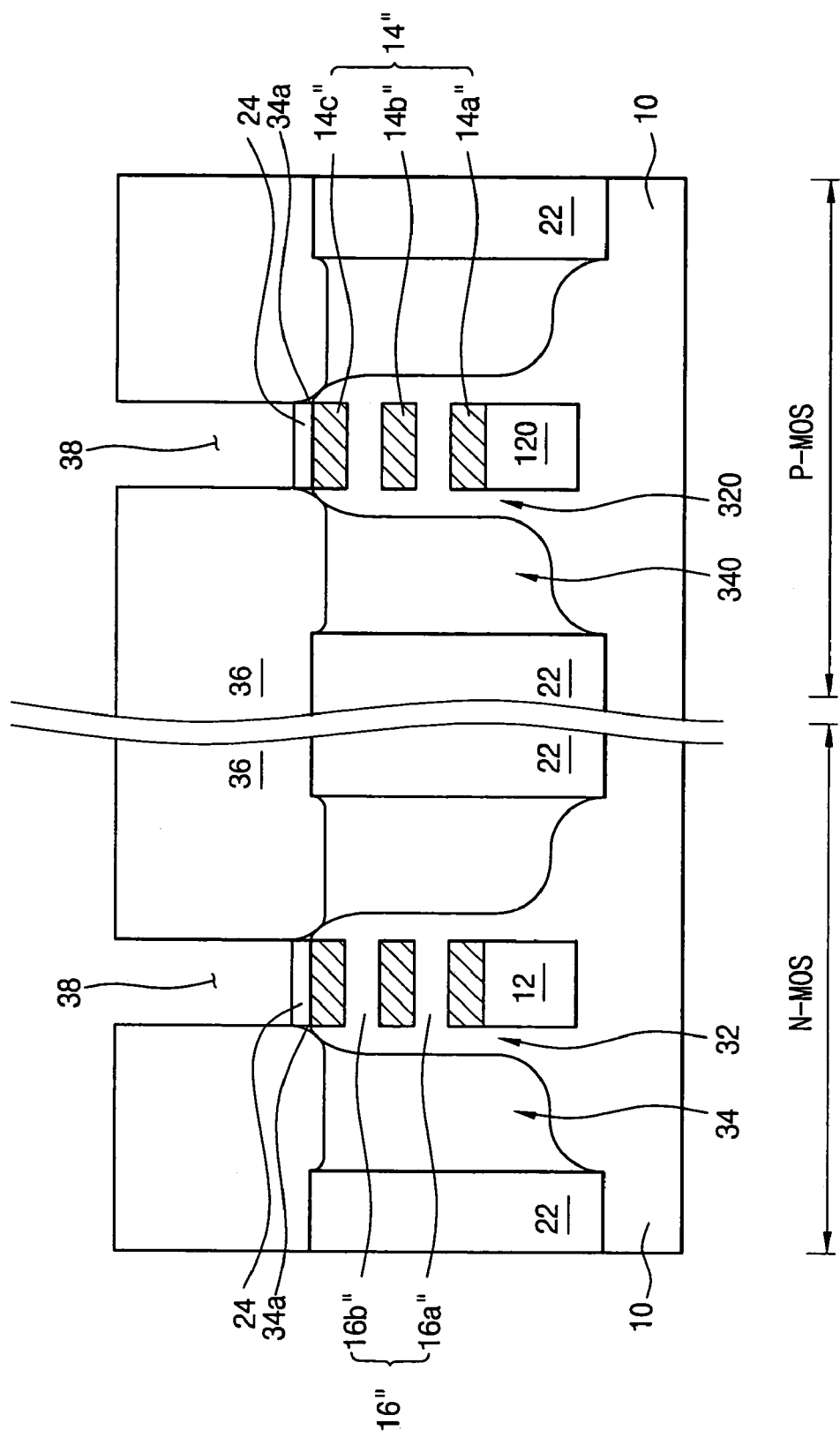

Referring to FIG. 6K, the dummy gate 26 is removed to form a gate trench 38, as was described in connection with FIG. 4K.

Figure 6L:
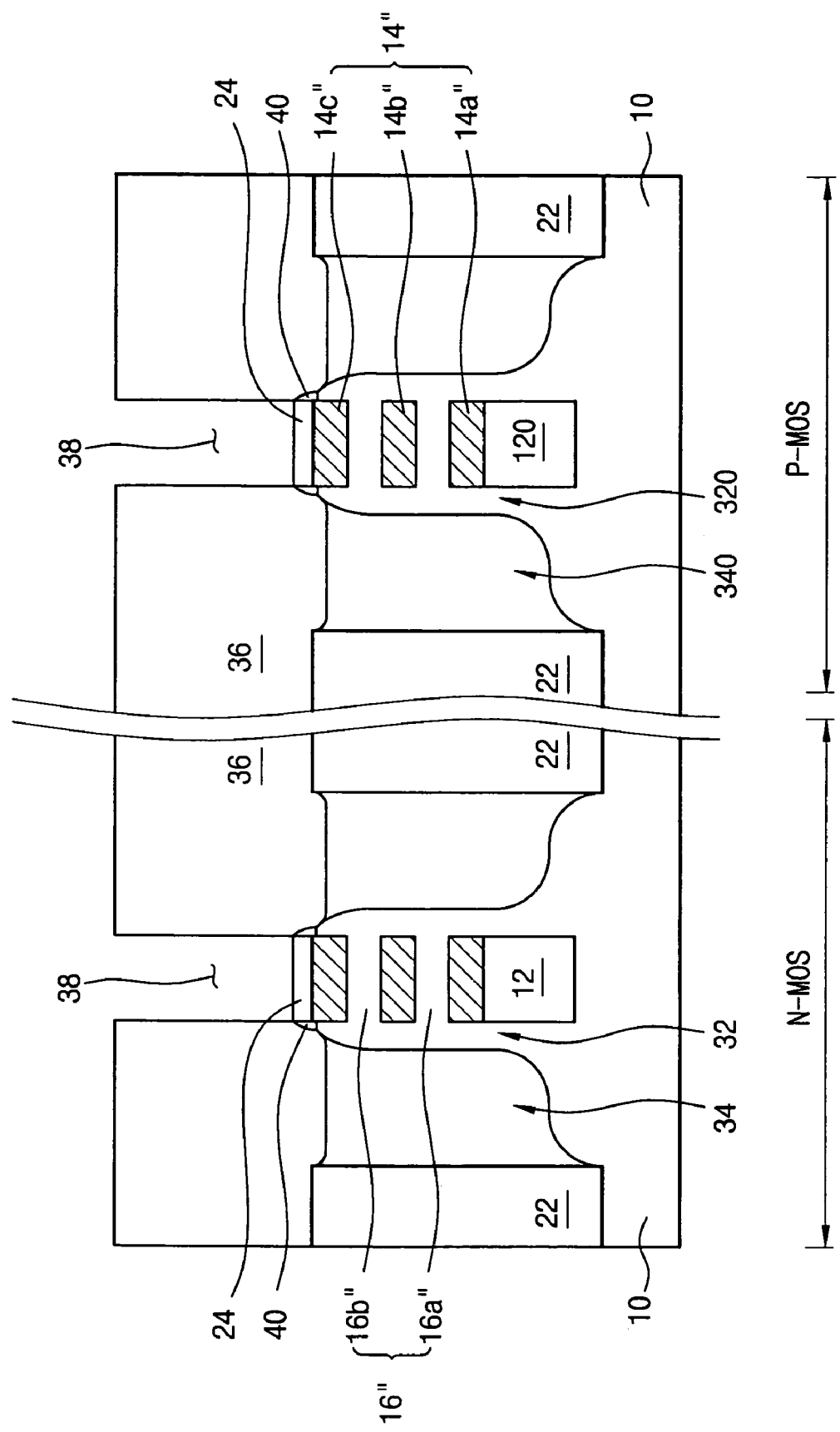

Referring to FIG. 6L, an insulating layer 40 is formed as was described in connection with FIG. 4L.

Referring now to FIG. 6M, the etch stopping layer 24 is removed by a wet etch process and boron doping is performed, as was described in connection with FIG. 4M. In this regard, it should be noted that, in some embodiments of the present invention, only the N-MOS devices may be doped with boron by masking the P-MOS devices. In other embodiments, the N-MOS and P-MOS devices may be doped with boron, as illustrated in FIG. 6M. In yet other embodiments, the boron doping step of FIG. 6M may be eliminated and performed after selectively etching the channel regions 14", as described in detail below.

Figure 6N:
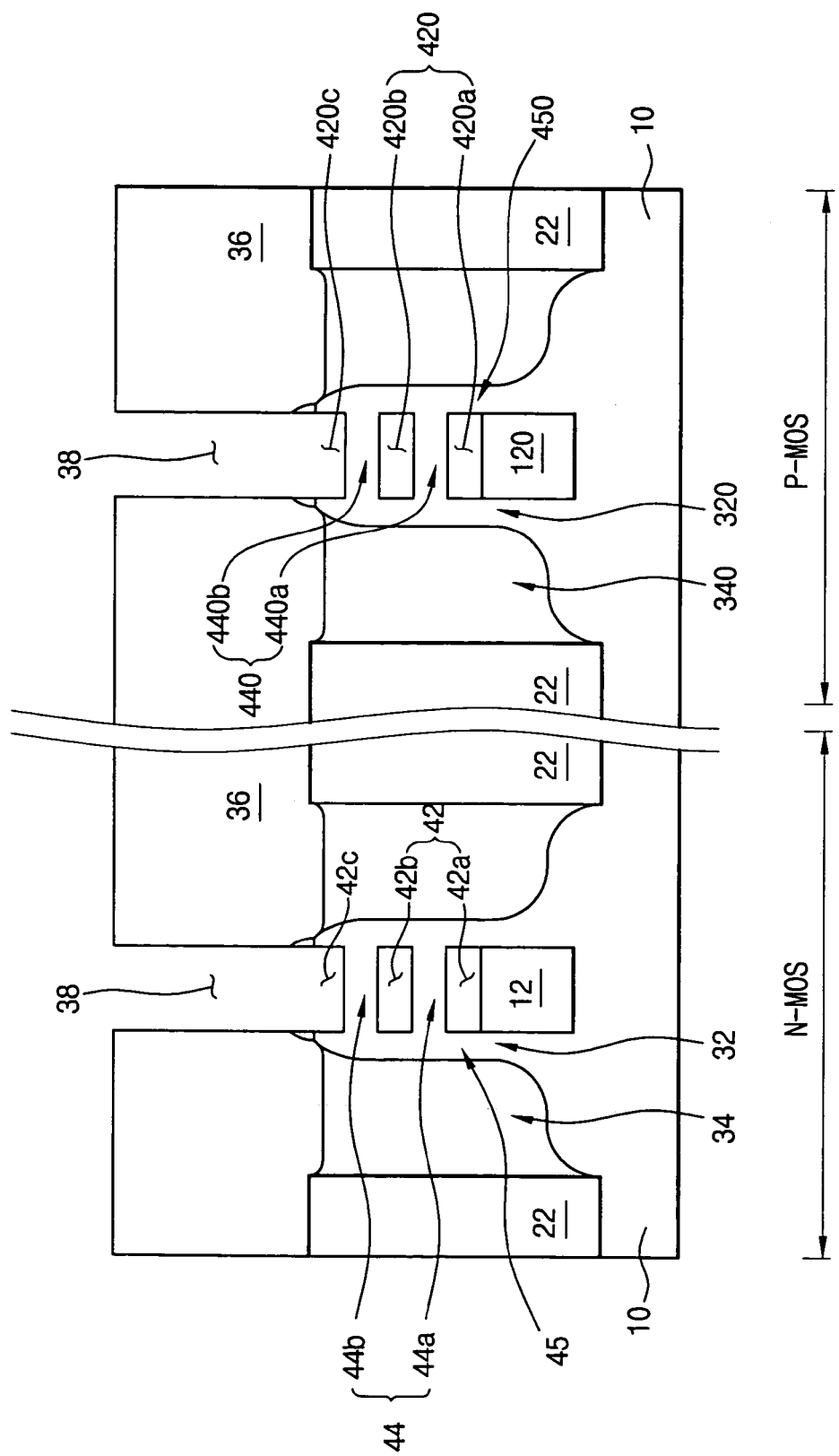
Figure 60:
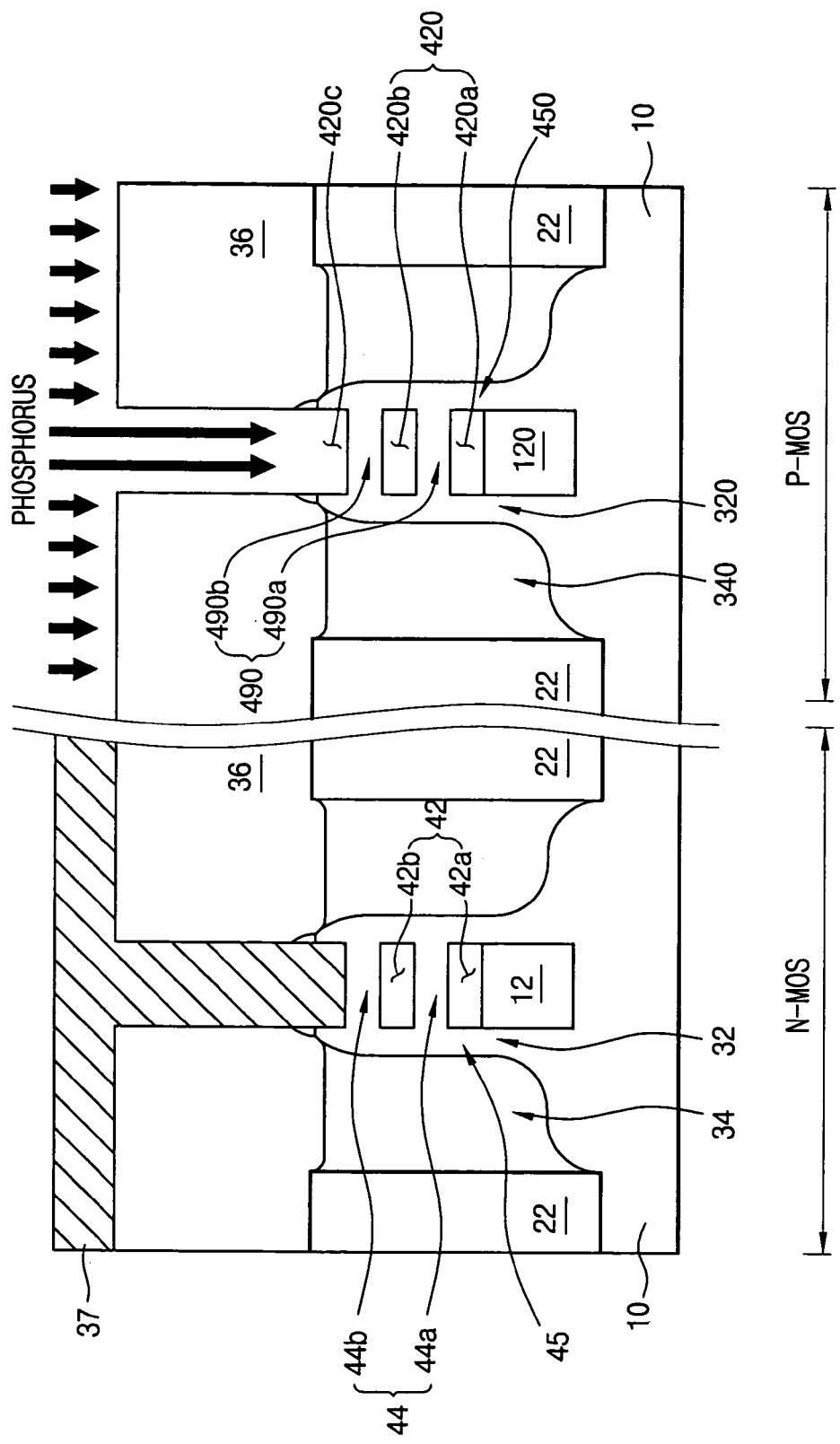

Referring now to FIG. 6N, through an isotropic etching process, the plurality of interchannel layer patterns 14a", 14b" and 14c" are selectively removed, to form a plurality of first tunnels 42a and 42b passing through the active channel pattern and a first tunnel groove 42c at an uppermost portion, and a plurality of second tunnels 420a and 420b, and a second tunnel groove 420c, as was described in connection with FIG. 4N.

Referring now to FIG. 6O, the P-channel region 490 is doped with phosphorus ions using an ion implantation and/or plasma doping process, as was described in connection with FIG. 4O. The N-MOS devices are not doped with phosphorus by providing a mask 37 on the N-MOS devices. It will also be understood that, as already described, the N-MOS and P-MOS devices also may be doped with boron at this time, or the N-MOS devices only may be doped with boron at this time by masking the P-MOS devices.

Figure 6P:
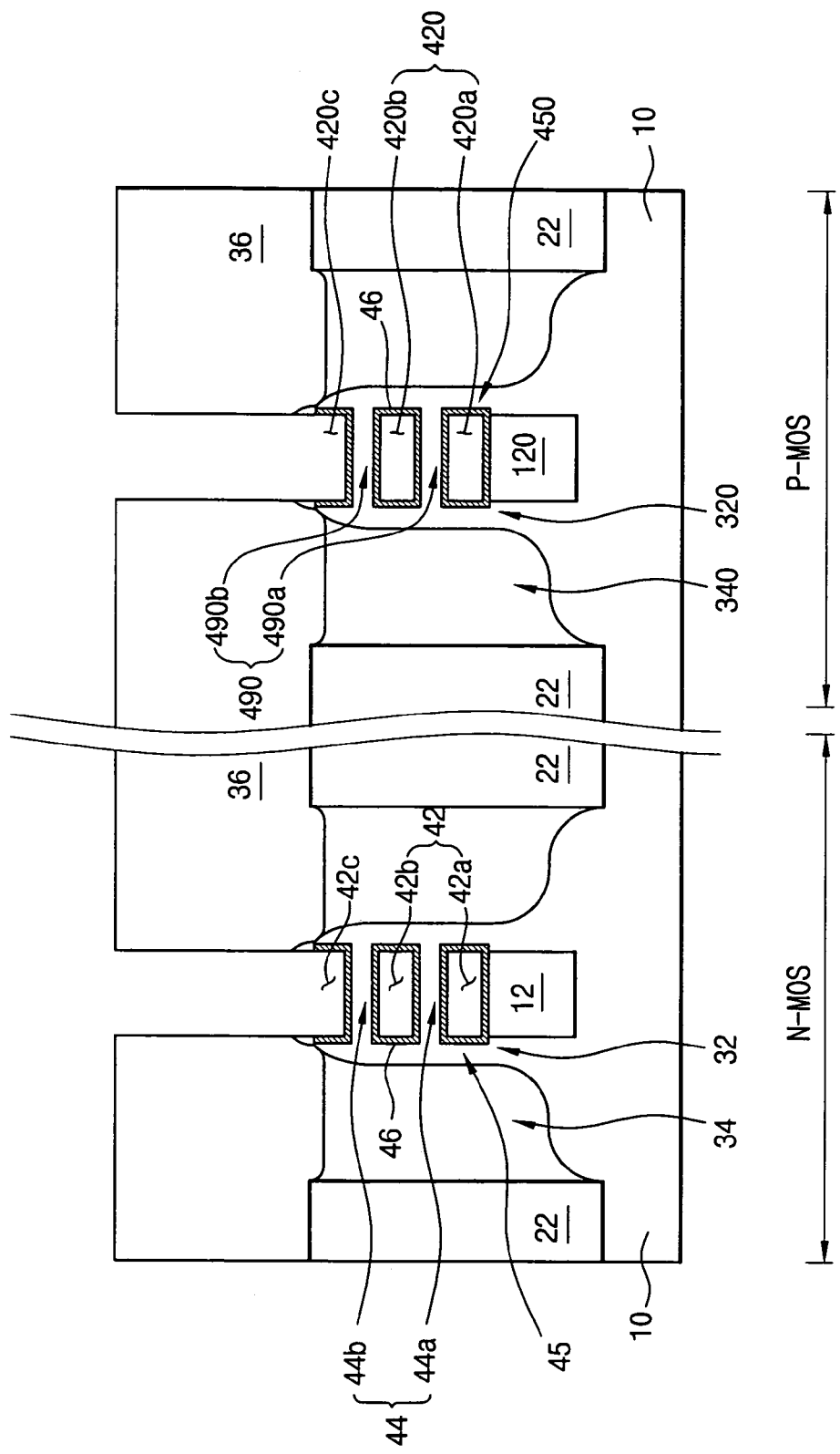

Referring now to FIG. 6P, a gate insulating layer 46 is formed, as was described in connection with FIG. 4P.

Figure 6Q:
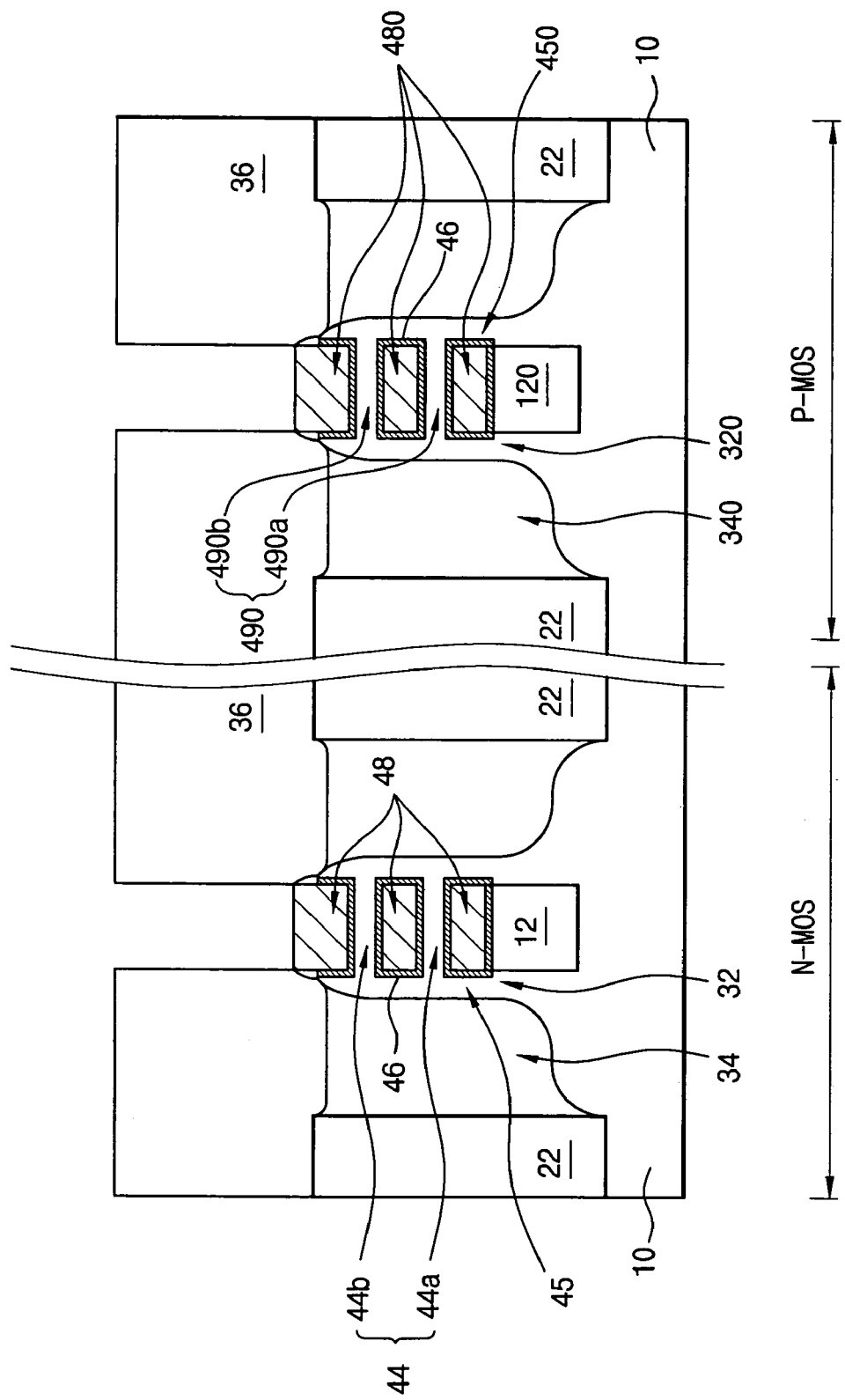

Referring to FIG. 6Q, a gate electrode 48 and 480 is formed, as was described in connection with FIG. 4Q.

Referring to FIG. 6R, a gate stack 50 is formed on the gate electrodes, as was described in connection with FIG. 4R. The mask patterns 36 may then be removed and subsequent processes may be performed to complete the CMOS transistors having multiple channels. In some cases, the mask patterns 36 may remain to serve as an insulating layer.

EMBODIMENT 3

Figure 7:
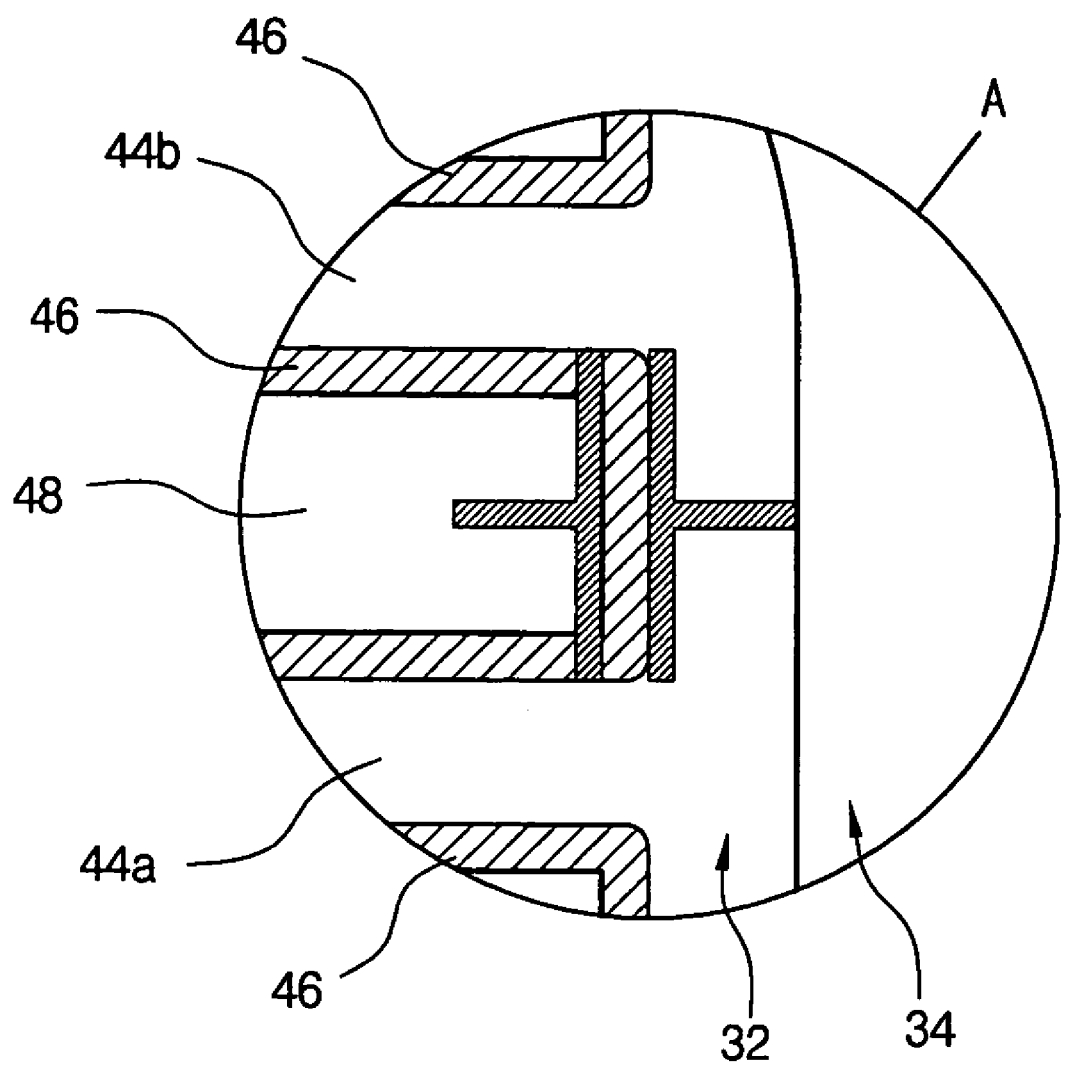
FIG. 7 is an enlarged view of a portion "A" in FIG. 4S.

FIG. 7 is an enlarged view showing a portion "A" in FIG. 4S. Referring to FIG. 7, in the vertical MOS transistor in Embodiment 1, the gate-insulating layer 46 exists between the gate electrode 48 and the source/drain regions 34 (specifically, source/drain extension layers 32) to thereby cause an overlap capacitance between the gate electrode 48 and the source/drain regions 34 as shown by a capacitor symbol (⊣ ⊢). A vertical MOS transistor of the present embodiments is presented to reduce or suppress the generation of the above overlap capacitance.

Figure 8A:
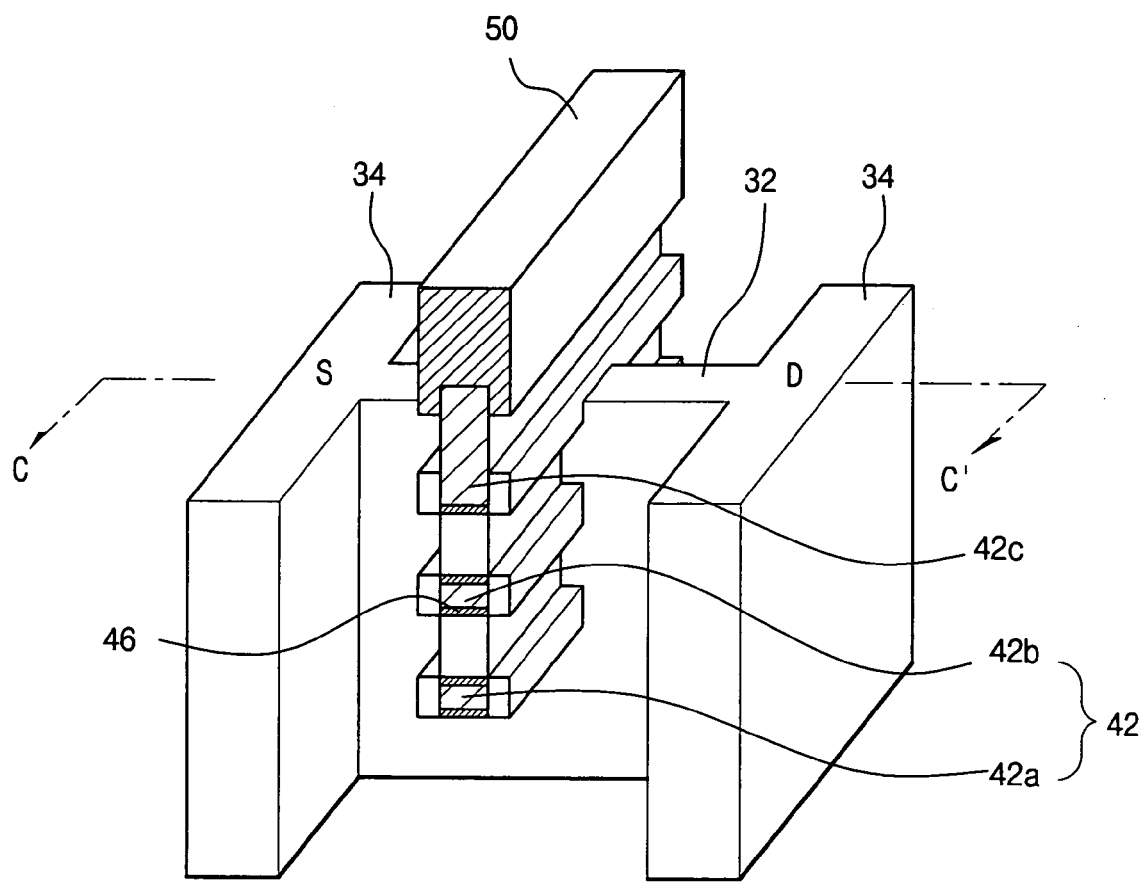
FIGS. 8A and 8B are a perspective view and a cross-sectional view, respectively, of a device in accordance with third embodiments of the present invention
Figure 8B:
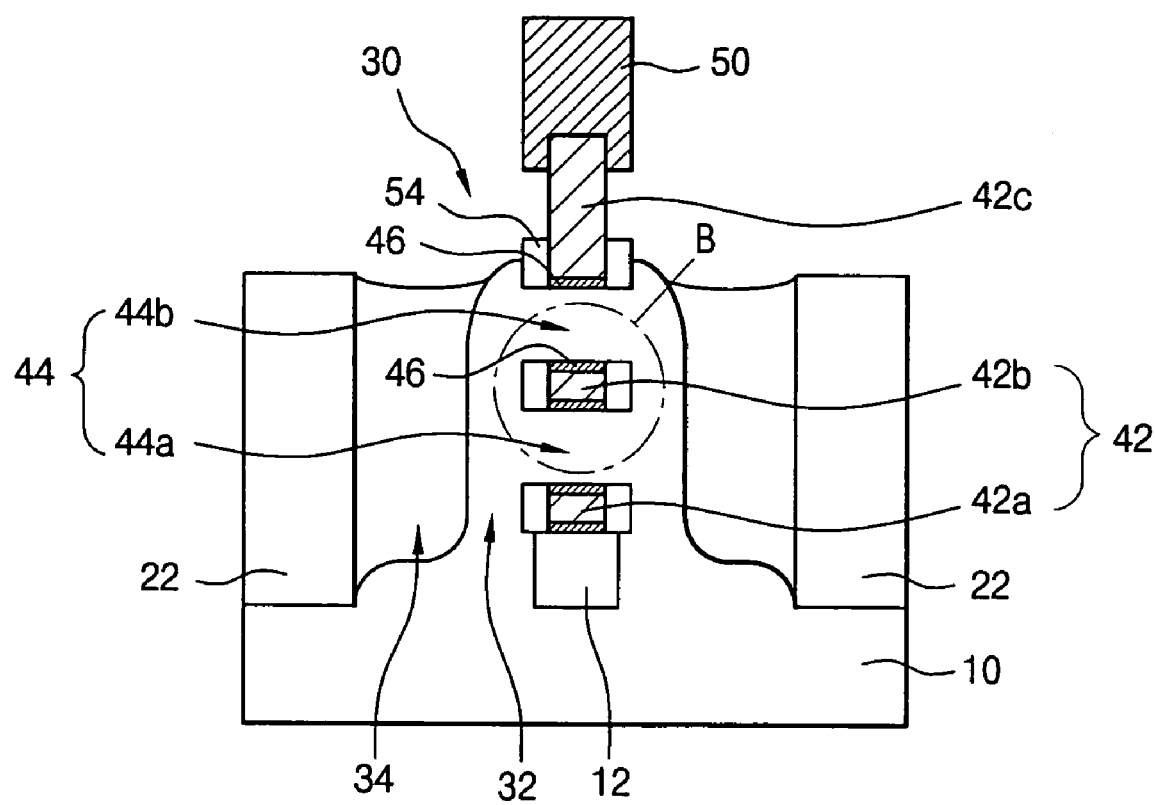

FIG. 8A is a perspective view of a semiconductor device in accordance with the third embodiment and FIG. 8B is a cross-sectional view taken along line C–C' of FIG. 8A. In the present embodiment, gate spacers 54 comprising an insulating material are formed between the gate electrode 48 and the source/drain regions 34 so as to reduce or prevent an increase in the overlap capacitance (see FIG. 7) between the gate electrode 48 and the source/drain regions 34. In the present embodiment, the same elements as those in Embodiment 1 are indicated by the same numerals.

Referring to FIGS. 8A and 8B, an active pattern 30 including a plurality of channels 44a and 44b formed vertically in the upward direction are formed on a main surface of a substrate 10 comprised of silicon (Si), silicon-germanium (SiGe), silicon-on-insulator (SOI), silicon-germanium-on-insulator (SGOI) and/or other conventional substrates/layers. Source/drain regions 34 are connected with the plurality of channels 44a and 44b on both sides of the active pattern 30. Between the source/drain regions 34 and the plurality of channels 44a and 44b, there are formed source/drain extension layers 32 connected to the source/drain regions 34 and connected to the channels 44 and 44b.

Between each of the channels 44a and 44b, there are formed a plurality of tunnels 42 having a length shorter than the channel length. The lowest tunnel 42a is formed between the lowest channel layer 44a and the underlying surface portion of the substrate, i.e., an impurity-doped region 12. A tunnel groove 42c having a tunnel shape is formed on the uppermost channel 44b.

Figure 8C:
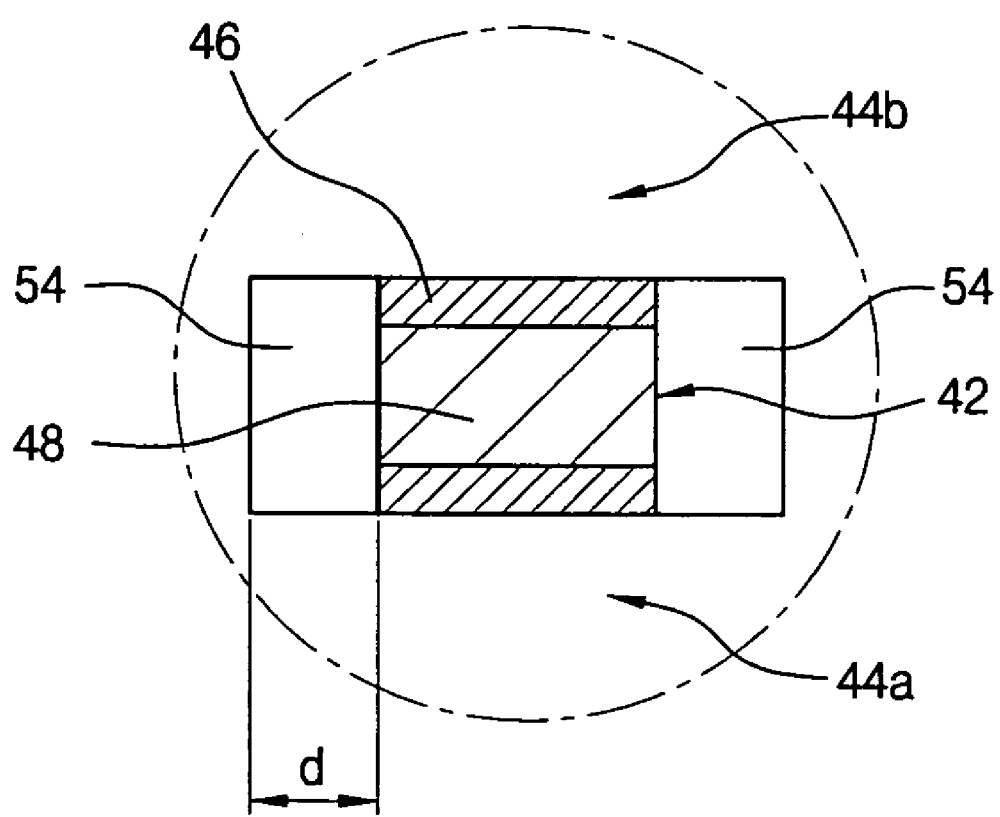
FIG. 8C is an enlarged view of a portion "B" of FIG. 8B.

FIG. 8C is an enlarged view showing a portion "B" in FIG. 8B. Upon both sidewalls of the tunnel 42 and both sidewalls of the tunnel groove 42, two gate spacers 54 of an insulating layer are formed so that each of the gate spacers has a thickness (d) corresponding half the difference between the length of the channels 44a and 44b and the length of the tunnel 42 as shown in FIG. 8C. Over the active pattern 30, there is formed a gate electrode 48 extending through and/or filling up the plurality of tunnels 42a and 42b and the tunnel groove 42c and surrounding the plurality of channels 44a and 44b. A gate-insulating layer 46 is formed between the gate electrode 48 and the plurality of channels 44a and 44b, i.e., on the upper surface and the lower surface of the tunnel 42 and the lower surface of the tunnel groove 42c except for the sidewalls of the tunnel and the sidewalls of the tunnel groove.

In some embodiments, the gate electrode 48 comprises a polysilicon and a gate stack layer 50 composed of a metal silicide and is formed on the top surface of the gate electrode 48. The gate stack layer 50 is formed to surround the upper portion of the sidewalls of the gate electrode 48, thereby making the notched gate electrode. Field regions 22 are formed so as to surround the source/drain regions 34 except the channel region including the plurality of channels 44a and 44b.

Heavily doped region 12 is formed in the main surface portion of the substrate 10 below the active pattern 30 so as to reduce or prevent the operation of a bottom transistor.

Figure 9A:
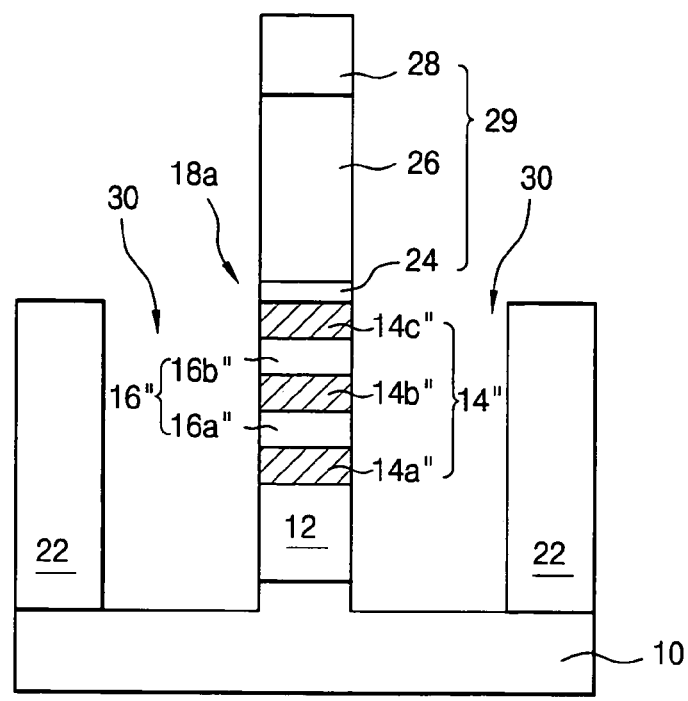
FIGS. 9A to 9N are cross-sectional views illustrating methods of manufacturing a device according to the third embodiments of the present invention.

FIGS. 9A to 9O are cross-sectional views illustrating methods of manufacturing a semiconductor device according to the third embodiments of the present invention. Referring to FIG. 9A, in the same manner as shown in FIGS. 4A to 4F of Embodiment 1, a pre-active pattern 18, in which a plurality of interchannel layers 14 and a plurality of channel-layers 16 are stacked alternately with each other, and field regions 22 surrounding the pre-active pattern 18 are formed on a substrate 10. In some embodiments, the interchannel layers 14 comprise single crystalline Ge (including, for example, single crystalline SiGe film), while the plurality of channel layers 16 comprise single crystalline Si film.

Next, a gate hard mask for self-aligning source/drain regions to the channel region is formed on the pre-active pattern 18. The gate hard mask has an etch-stopping layer pattern 24, a dummy gate pattern 26 and an anti-reflective layer pattern 28 which are successively stacked.

Using the gate hard mask, the pre-active pattern 18 is etched away until the surface of the substrate 10 is exposed, thereby defining regions 30 where the source/drain regions are to be formed. By doing so, only the channel region of the pre-active pattern 18 remains. The etching process is further preformed for sufficient time to etch the upper portion of the semiconductor substrate 10 to below the projected range of the heavily doped region 12.

As a result, an active channel pattern 18a having a second channel layer pattern 16" and a second interchannel layer pattern 14" is formed under the gate hard mask 29 as shown in the figure. The second channel layer pattern 16" is comprised of a plurality of second channel layer patterns 16a" and 16b" and the second interchannel layer pattern 14" is comprised of a plurality of interchannel layer patterns 14a", 14b" and 14c".

Figure 9B:
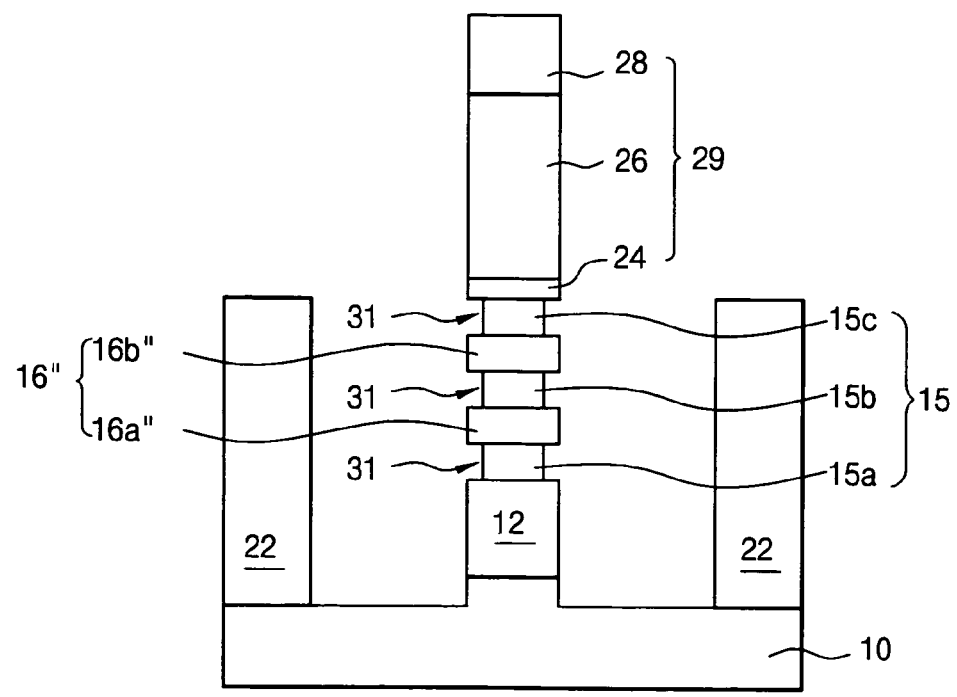

Referring to FIG. 9B, the second interchannel layer patterns 14" are selectively lateral-etched through the exposed sides of the active channel pattern 18a, thereby forming undercut regions 31. A width of the undercut region 31 is formed to a depth of about 500~700 Å from the sidewall surface of the original active channel pattern 18a. Accordingly, a plurality of third interchannel layer patterns 15a, 15b and 15c shorter than the length of the second channel layer patterns 16a" and 16b" are formed from the plurality of second interchannel layer patterns 14a", 14b" and 14c".

Figure 9C:
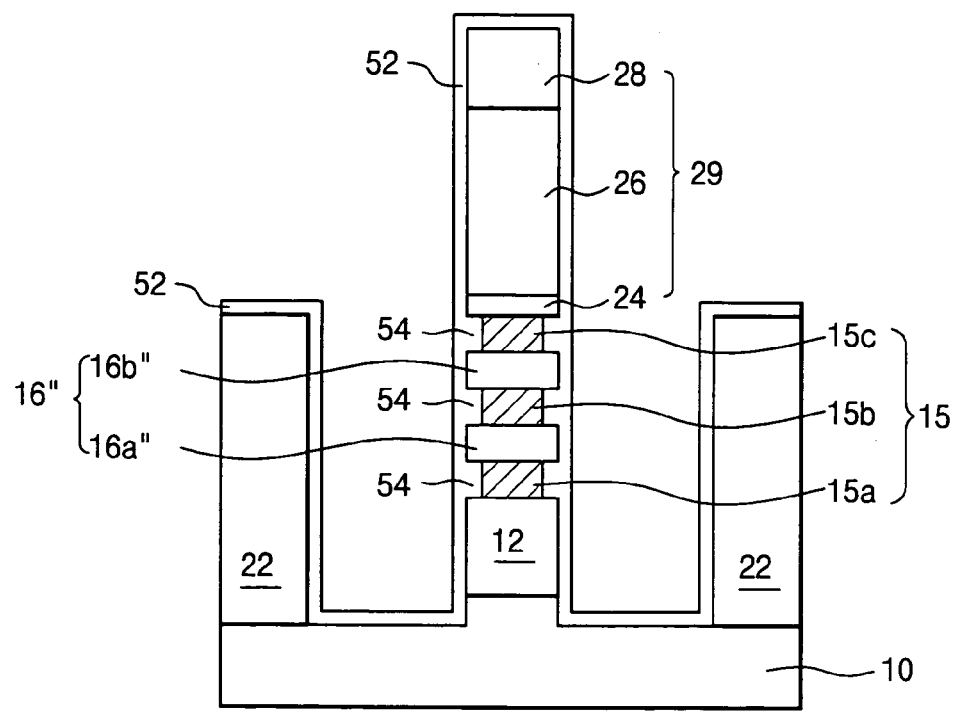

Referring to FIG. 9C, an insulating layer 52 is deposited so as to be formed in or fill up the undercut regions 31 on the entire surface of the resultant structure. Particularly, an insulating material such as silicon oxide is deposited so as to fill up the undercut regions 31 of the active channel pattern 18a through a chemical vapor deposition method, thereby forming the insulating layer 52 covering the entire surface of the resultant structure, i.e., the entire inner surface of the etched regions 30 including the sidewalls and the surface of the active channel pattern 18a.

Figure 9D:
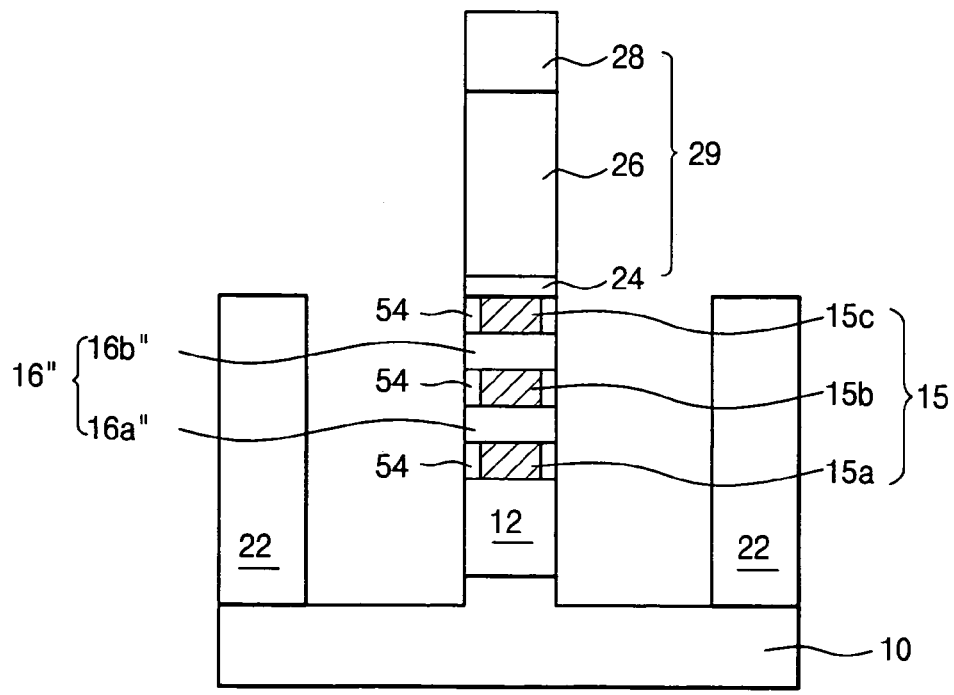

Referring to FIG. 9D, the insulating layer 52 is etched back to form gate spacers 54 comprised of an insulating material such silicon oxide filling up only the undercut regions 31.

Figure 9E:
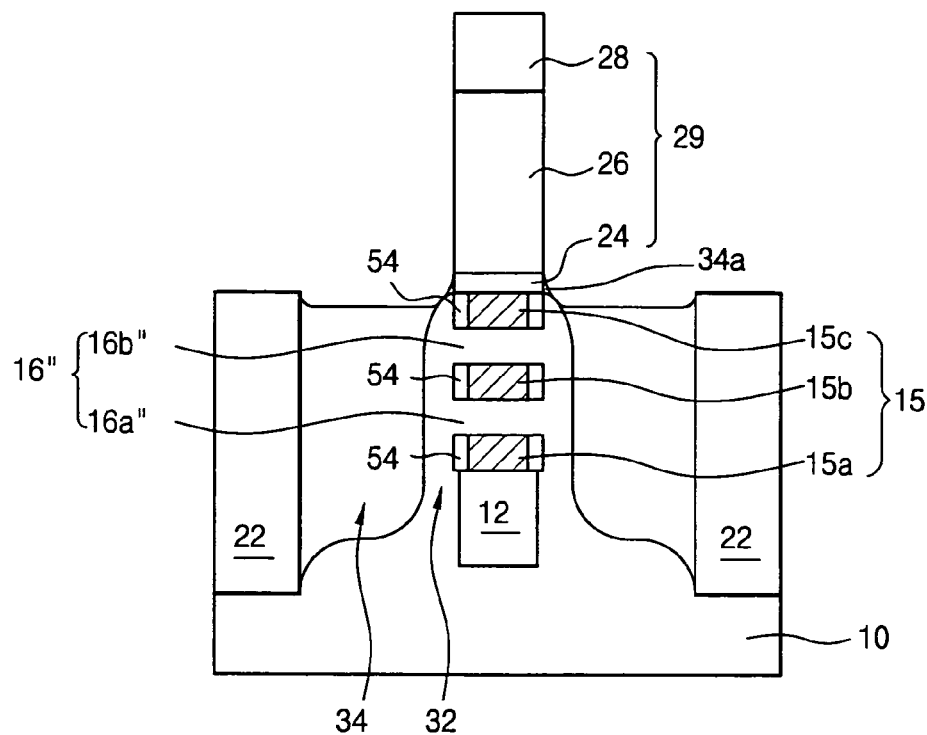

Referring to FIG. 9E, in the same manner as shown in FIG. 4G of Embodiment 1, a selective epitaxial single crystalline film is partially grown on the surfaces of the etched regions 30 and the sides of the active channel pattern 18a, thereby forming source/drain extension layers 32.

Then, in the same manner as shown in FIG. 4H of Embodiment 1, a conductive film such as doped polysilicon, metal or metal silicide is deposited on the entire surface of the resultant structure including the source/drain extension layers 32 and then, the conductive film is etched back to form source/drain regions 34 filling up the etched regions 30.

Here, before depositing the conductive film, a tilted ion implantation may be executed to dope the source/drain extension layers 32 of the selective epitaxial single crystalline film with impurities. Alternatively or in addition, the source/drain extension layers 32 can be doped by solid-phase diffusing a dopant from the source/drain regions in a subsequent annealing process. In either case, the source/drain extension layers 32 and the source/drain regions 34 can have a uniform doping profile in a direction perpendicular to the channel region.

Figure 9F:
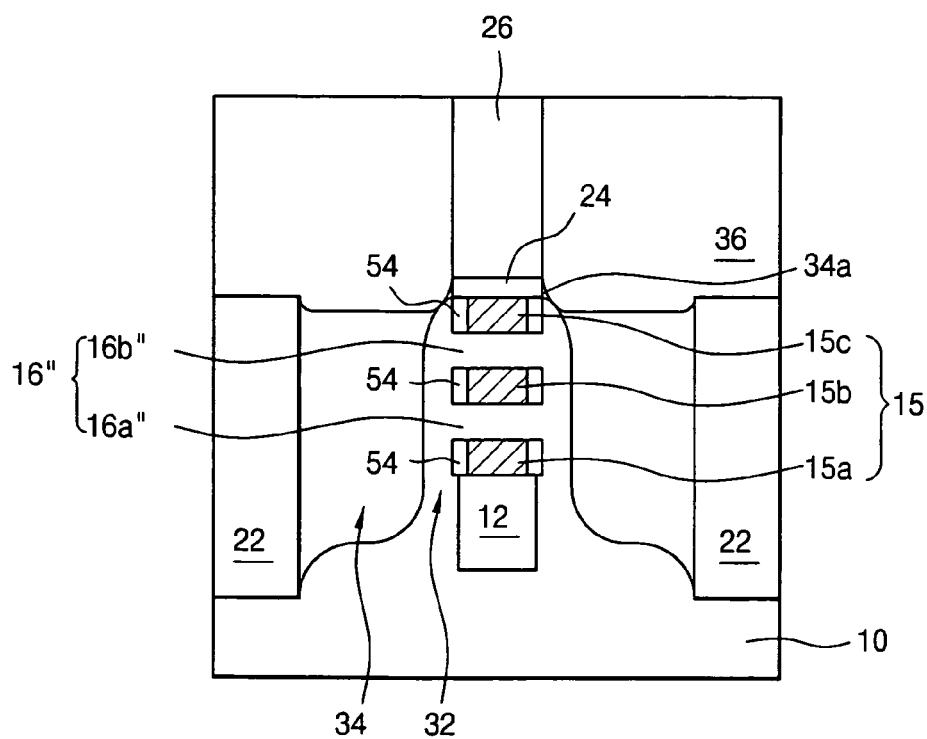

Referring to FIG. 9F, in the same manner as shown in FIG. 4I of Embodiment 1, silicon nitride is deposited on the source/drain regions 34, the active channel pattern 18a of the channel region and the substrate 10, thereby forming a mask layer. Then, in the same manner as in FIG. 4J of Embodiment 1, the mask layer is planarized until the surface of the dummy gate pattern 26 is exposed, thereby forming a mask pattern 36 exposing the dummy gate pattern 26.

Figure 9G:
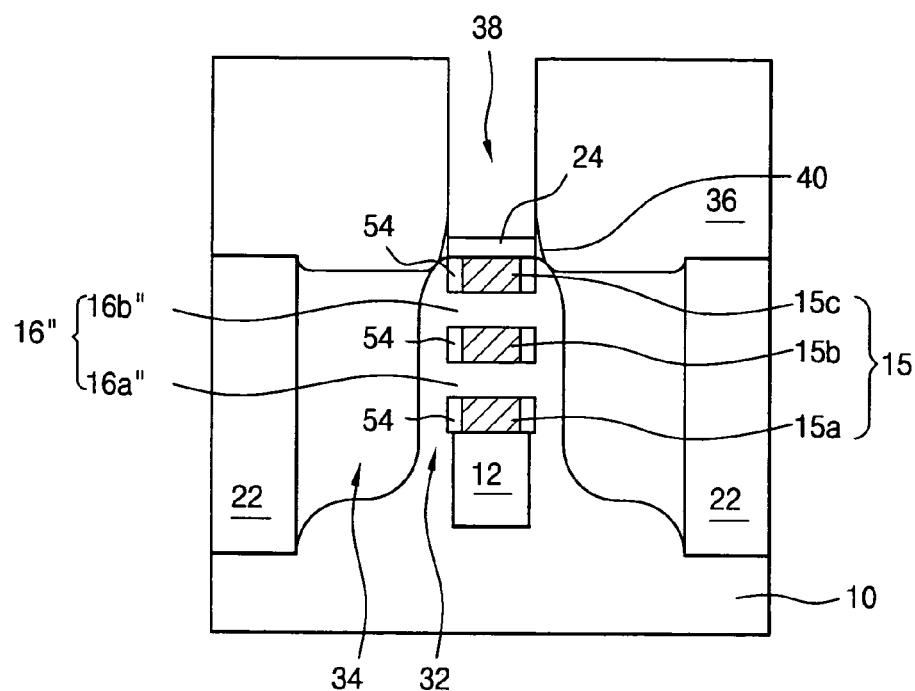

Referring to FIG. 9G, in the same manner as shown in FIG. 4K of Embodiment 1, the dummy gate pattern 26 is selectively removed by using the mask pattern 36, thereby forming a gate trench 38. Here, the etch-stopping layer pattern 24 prevents the underlying active channel pattern 18a from being etched during the etching process of removing the dummy gate pattern 26. If conductive tails 34a for source/drain remain under the sides of the gate pattern 26, an oxidation process may be carried out to convert the conductive tails 34a into insulating layers 40 of silicon oxide in the same manner as in FIG. 4L of Embodiment 1.

Figure 9H:
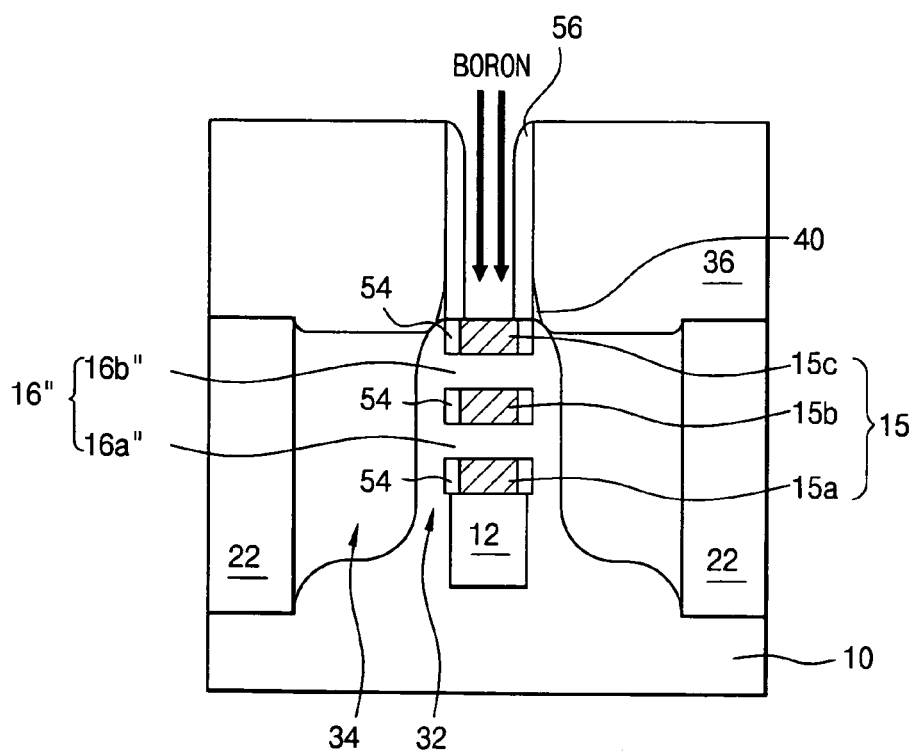

Referring to FIG. 9H, the etch-stopping layer pattern 24 exposed through the gate trench 38 is removed in the same manner as shown in FIG. 4M of Embodiment 1. If the active channel pattern 18a of the channel region is not already doped with boron, boron is locally ion-implanted through the gate trench 38 to thereby dope the active channel pattern 18a of the channel region with boron. In some embodiments, the channel ion implantation is carried out such that the projected range is formed within each of the channel layers 16". Alternatively, in other embodiments, the channel ion implantation is executed such that each of the second channel layer patterns 16a" and 16b" has a different doping concentration from each other, thereby successively operating the transistors according to the applied gate voltage. Phosphorous doping is not performed.

Silicon oxide is deposited on the entire surface of the resultant structure by a chemical vapor deposition method, thereby forming an insulating layer with the same thickness equal to or somewhat larger than the width of the width of the undercut region 31, e.g., about 500~700 Å thick. Then, the insulating layer is etched back to form insulating layer spacers 56 on the inner sidewalls of the gate trench 38. The insulating layer spacers 56 control the channel width and the gate width.

Figure 9I:
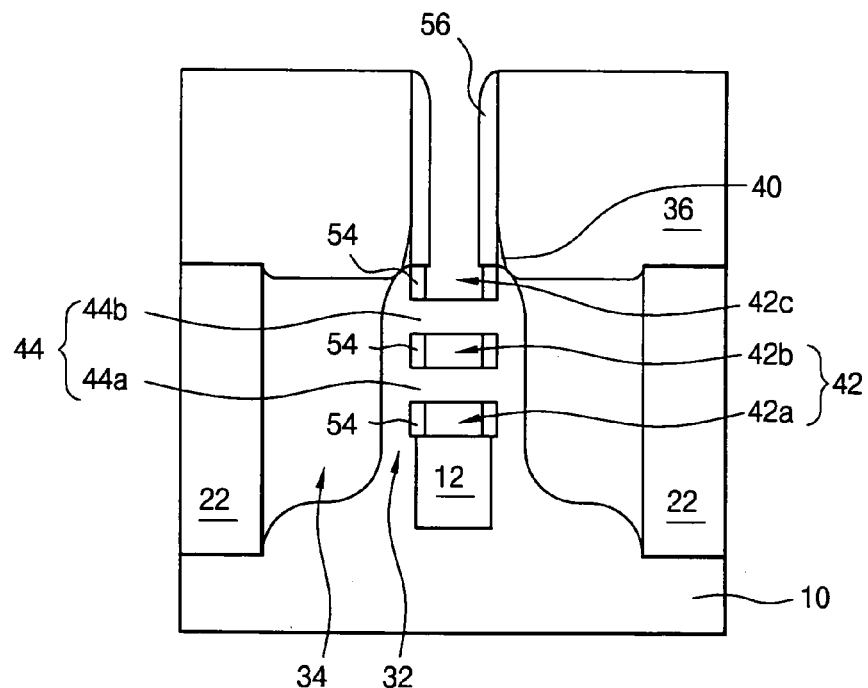

Referring to FIG. 9I, in the same manner as shown in FIG. 4N of Embodiment 1, the field regions 22 are selectively etched using the source/drain regions 34 as an etching mask, thereby exposing the sides of the active channel pattern 18a of the channel region. Then, the plurality of third interchannel layer patterns 15a, 15b and 15c are selectively removed through an isotropic etching process, for example, using poly-etchant, thereby forming a plurality of tunnels 42a and 42b passing through the active channel pattern 18a and a tunnel groove 42c located at an uppermost position. Here, the second channel layer patterns 16a" and 16b" form a plurality of channels 44a and 44b. The tunnels 42a and 42b are formed to have a length shorter than the horizontal length of the channels 44a and 44b due to the gate spacers 54 formed on the sidewalls thereof.

Figure 9J:
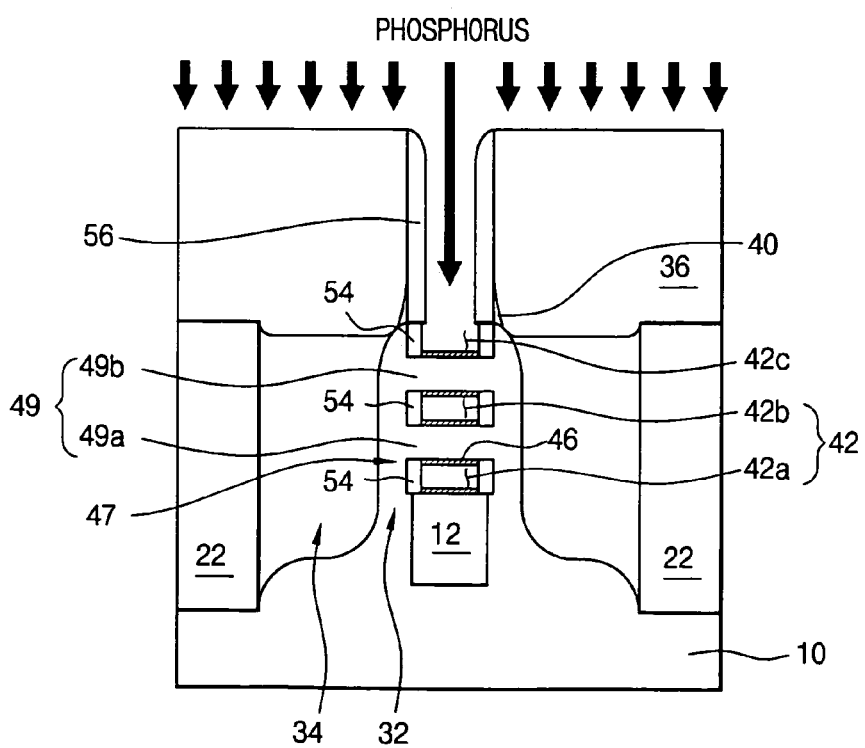

Referring now to FIG. 9J, phosphorus doping is performed in a manner similar to that which was described in connection with FIG. 4O. Boron doping also may be performed as was also described in connection with FIG. 4O.

Figure 9K:
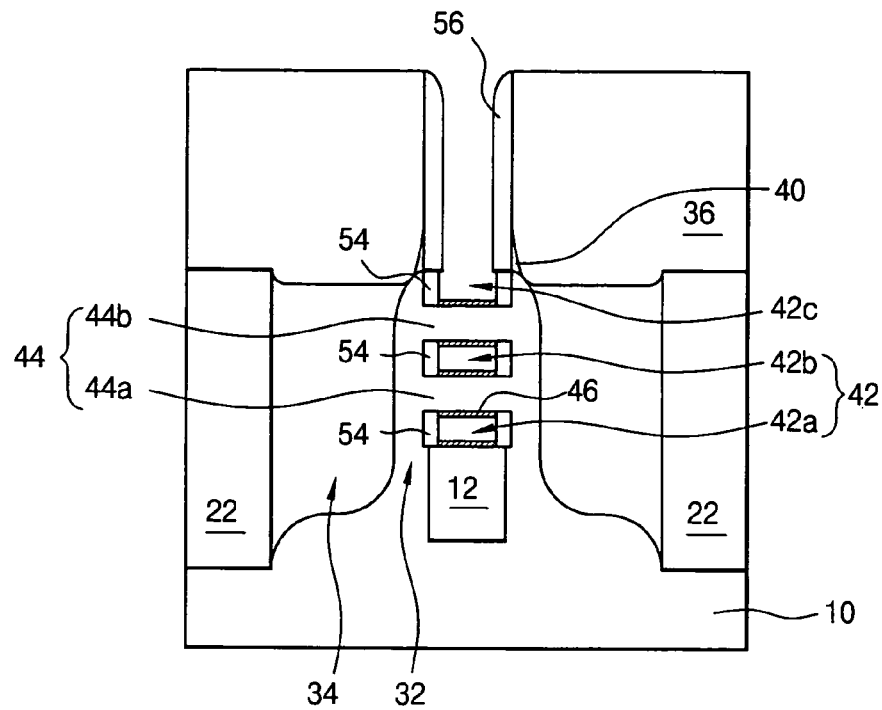

Referring to FIG. 9K, in the same manner as shown in FIG. 4P of Embodiment 1, a thermal oxidation process is carried out to form a gate-insulating layer 46 on the surface portions of the plurality of channels 44a and 44b (particularly, the upper surface and the lower surface of the plurality of tunnels 42a and 42b and the bottom surface of the tunnel groove 42c). Here, in order to reduce the surface roughness of the channels 44a and 44b, a heat treatment may be performed at a high temperature in a hydrogen ($H_2$) or argon (Ar) ambient before forming the gate-insulating layer 46.

Figure 9L:
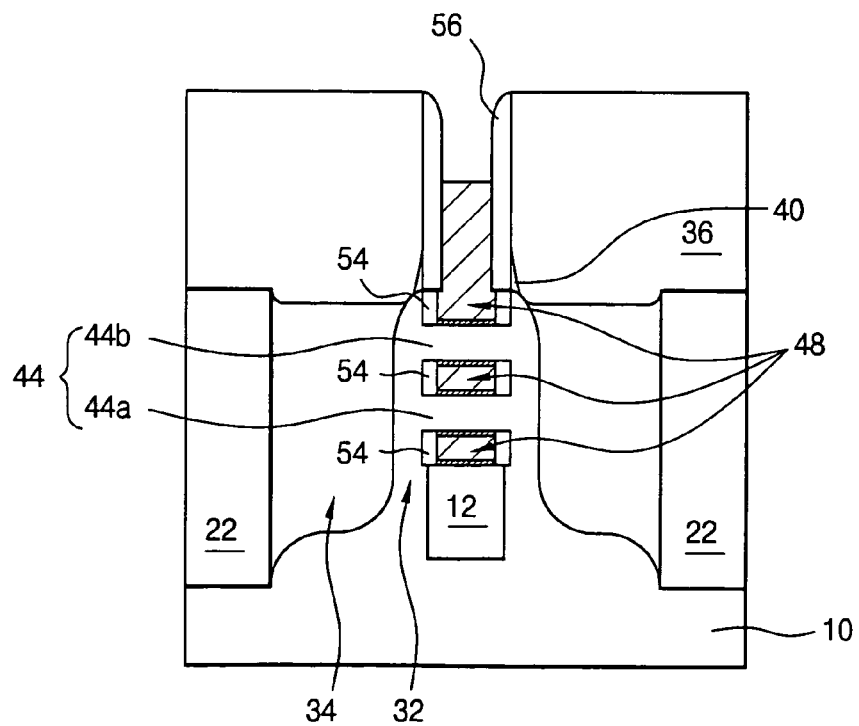

Referring to FIG. 9L, in the same manner as shown in FIG. 4Q of Embodiment 2, a gate electrode 48 is formed so as to fill up the tunnels 42a and 42b and the tunnel groove 42c and to surround the channels 44a and 44b. In some embodiments, the gate electrode 48 comprises a doped polysilicon.

Figure 9M:
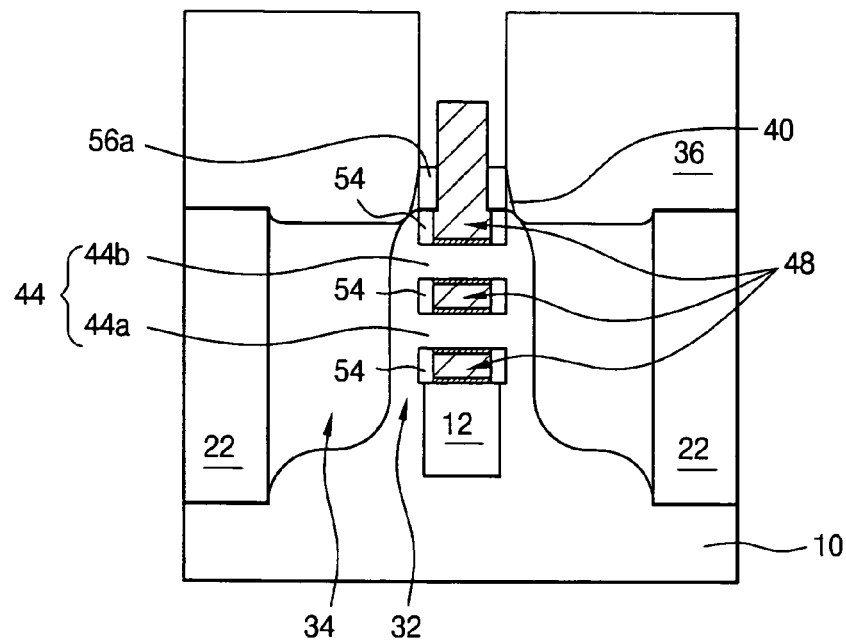

Referring to FIG. 9M, the insulating layer spacers 56 are selectively removed to expose the top surface and a portion of the sidewalls of the gate electrode 48. That is, spacer residues 56a remain on the lower portion of the sidewalls of the gate electrode 48.

Figure 9N:
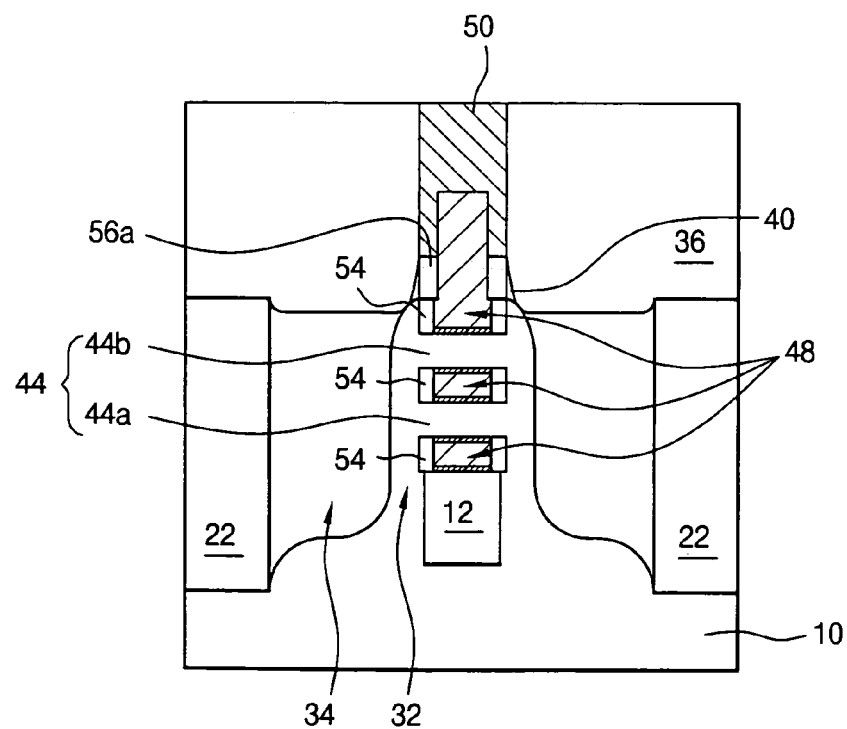

Referring to FIG. 9N, in the same manner as shown in FIG. 4R of Embodiment 1, a gate stack layer 50 having a metal silicide for reducing a gate resistance is formed on the top surface and a portion of the upper sidewalls of the exposed gate electrode 48. Here, the width of the gate stack layer 50 is same as the length of the channels 44a and 44b, while the width of the gate electrode 48 is same as the length of the tunnel 42. Accordingly, there is formed a notched gate profile where the gate stack layer 50 protrudes as compared with the gate electrode 48. The notched gate profile can reduce the contact resistance between the gate electrode 48 and the gate stack layer 50.

Next, the insulating layer spacers 56 and the mask patterns 36 are removed as shown in FIG. 8B.

According to the third embodiments of the present invention, the gate spacers 54 comprised of an insulating material are formed between the gate electrode 48 and the source/drain regions 34, which can decrease the overlap capacitance between the gate electrode and the source/drain. Further, the contact resistance between the gate electrode 48 and the gate stack layer 50 can be reduced because the gate stack layer 50 is formed to surround a portion of the sidewalls of the gate electrode 48.

EMBODIMENT 4

Figure 10:
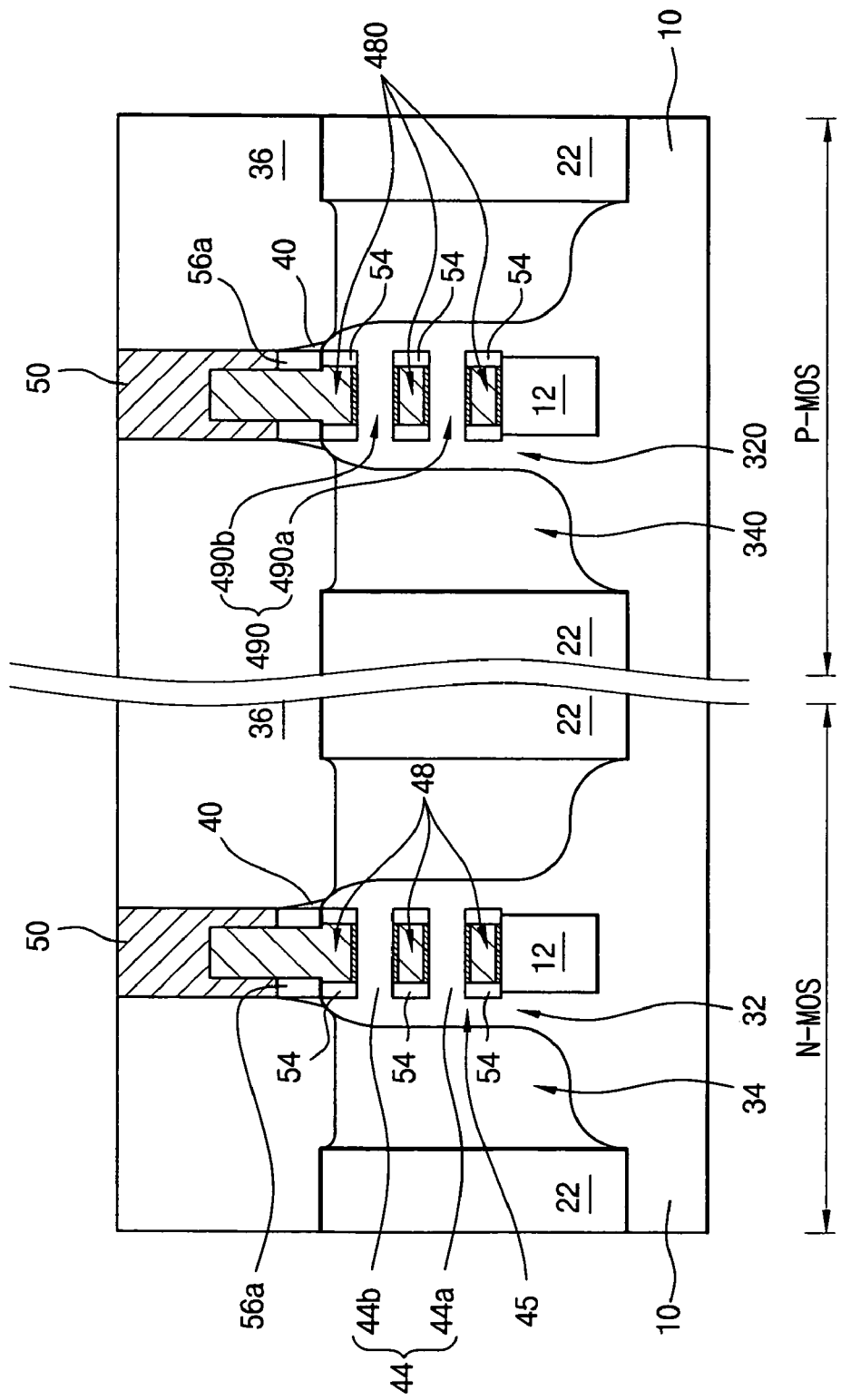
FIG. 10 is a cross-sectional view of a device according to fourth embodiments of the present invention.

FIG. 10 is a cross-sectional view of a device in accordance with fourth embodiments of the present invention. Embodiments of FIG. 10 are similar to embodiments of FIG. 9, except that CMOS embodiments are shown. Thus, these embodiments need not be described in further detail herein.

EMBODIMENT 5

Figure 11:
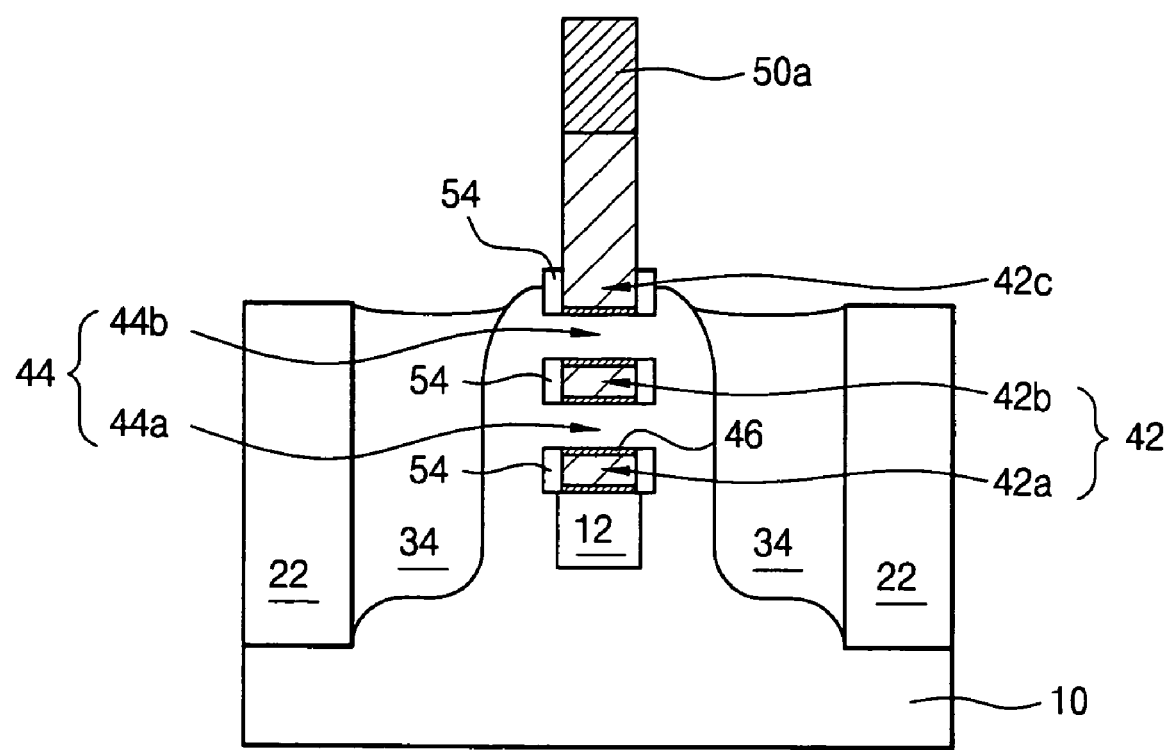
FIG. 11 is a cross-sectional view of a device in accordance with fifth embodiments of the present invention.

FIG. 11 is a cross-sectional view of a device in accordance with fifth embodiments of the present invention. The fifth embodiments are similar to Embodiment 2 except that the polysilicon gate electrode 48 has the same width as that of the gate stack layer 50a comprised of a metal silicide.

A gate-insulating layer 46 is formed in the same manner as shown in FIGS. 9A to 9J of Embodiment 3. Thereafter, a polysilicon gate electrode 48 is formed so as to extend through and/or fill the plurality of tunnels 42a and 42b and the tunnel groove 42c and to surround the plurality of channels 44a and 44b. Accordingly, the polysilicon gate electrode 48 is formed to have the same width as the horizontal width of the tunnels 42a and 42b.

After forming the gate stack layer 50 comprising a metal silicide on the polysilicon gate electrode 48, the insulating layer spacers 56 formed on the sidewalls of the gate trench 38 are removed. So, the gate stack layer 50 is formed to have the same width as that of the gate electrode 48.

In the same manner as in Embodiment 1, a conductive material is deposited and etched back to form source/drain regions 34, after growing an epitaxial single crystalline film on the sides of the active channel pattern of the channel region to form source/drain extension layers. Alternatively, the etched regions of the active pattern is provided with or filled with an epitaxial single crystalline film or a conductive material such as doped polysilicon, metal, metal silicide, etc., to thereby form the source/drain regions 34 as shown in FIG. 11.

EMBODIMENT 6

Figure 12:
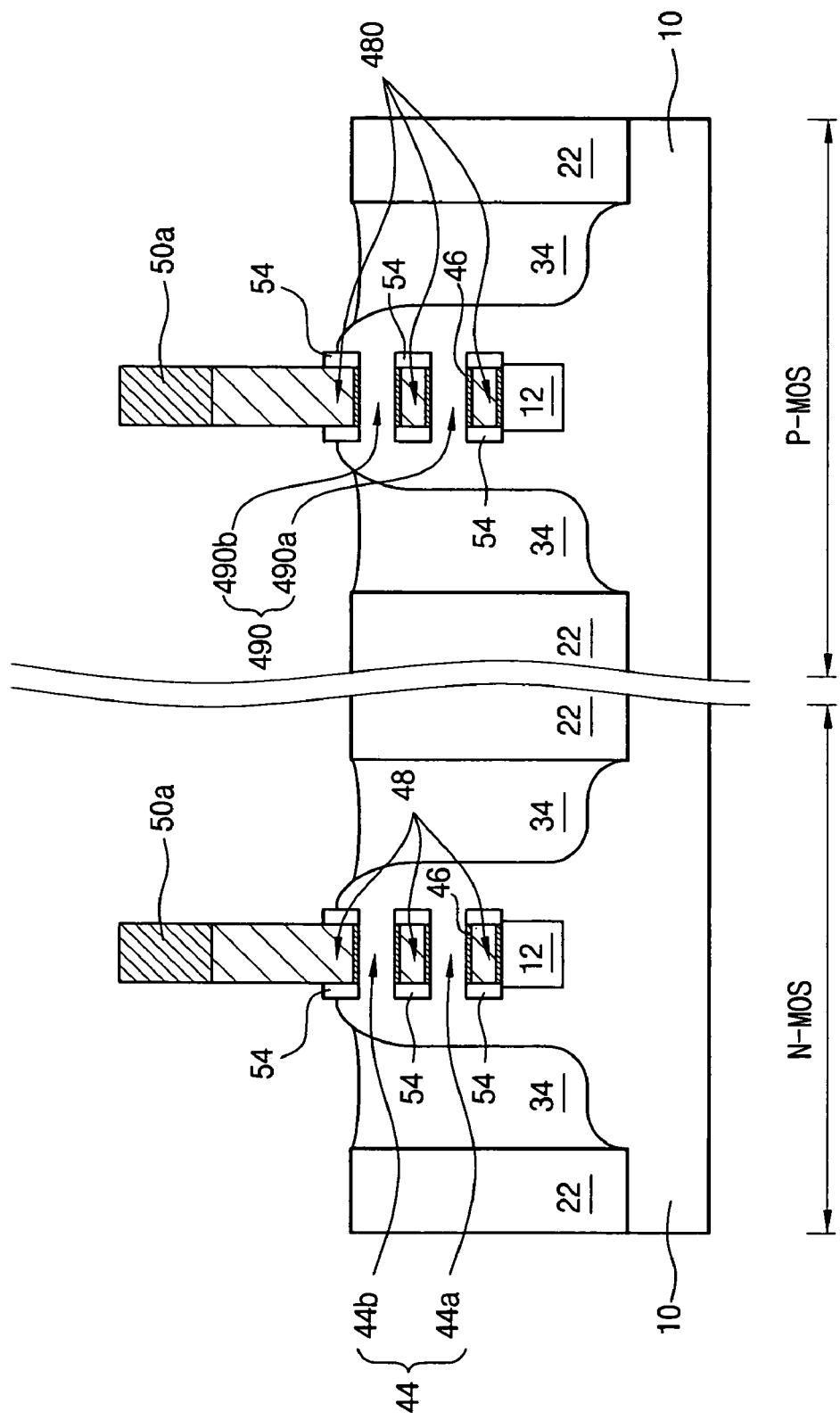
FIG. 12 is a cross-sectional view of a device in accordance with sixth embodiments of the present invention.

FIG. 12 is a cross-sectional view of a device in accordance with sixth embodiments of the present invention. More specifically, FIG. 12 illustrates a CMOS device that is similar to embodiment 5 of FIG. 11. Thus, these embodiments need not be described in further detail herein.

EMBODIMENT 7

FIGS. 13A to 13K are cross-sectional views illustrating methods of manufacturing semiconductor devices in accordance with seventh embodiments of the present invention. In the present embodiments, the same elements as those in previous embodiments are indicated by the same numerals.

Figure 13A:
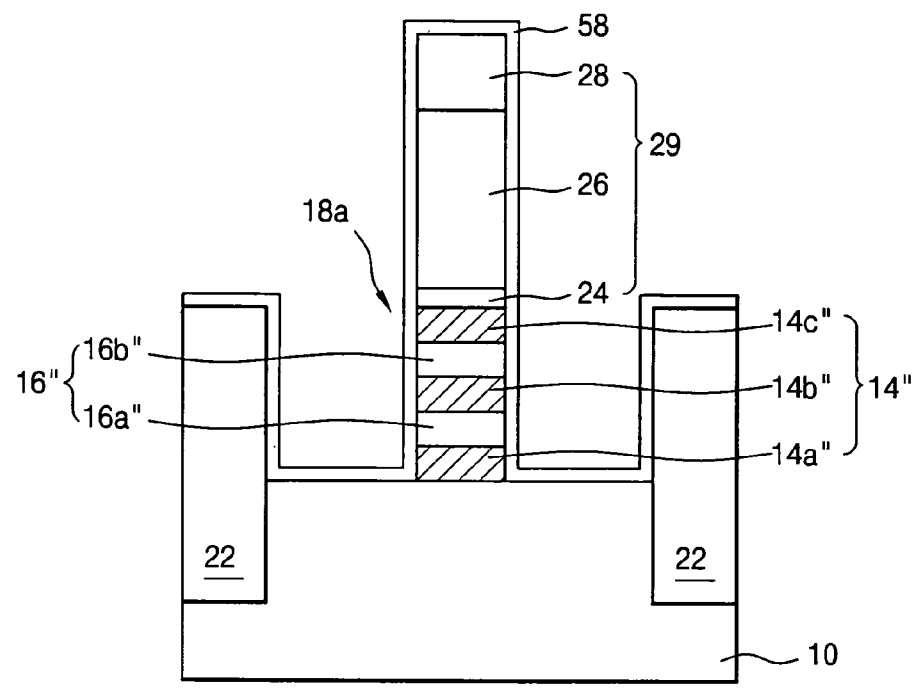
FIGS. 13A to 13K are cross-sectional views illustrating methods of manufacturing a device in accordance with seventh embodiments of the present invention.

Referring to FIG. 13A, in the same manner as shown in FIGS. 4A to 4F, a pre-active pattern 18, in which a plurality of interchannel layers 14 and a plurality of channel layers 16 are stacked alternately with each other, and field regions 22 surrounding the pre-active pattern 18, are formed on a semiconductor substrate 10. In some embodiments, the interchannel layers 14 comprise single crystalline Ge film (including, for example, single crystalline SiGe film), while the channel layers 16 comprise single crystalline Si film.

Next, a gate hard mask 29 comprising an etch-stopping layer pattern 24, a dummy gate pattern 26 and an anti-reflective layer pattern 28 is formed on the pre-active pattern 18.

Using the gate hard mask 29, the pre-active pattern 18 is etched away until the surface of the substrate 10 is exposed, thereby forming regions 30 where the source/drain regions are to be formed. Thus, on the channel region under the gate hard mask 29, an active channel pattern 18a comprising a second channel layer pattern 16" and a second interchannel layer pattern 14" is formed from the pre-active pattern 18 as shown. The second channel layer pattern 16" is comprised of a plurality of second channel layer patterns 16a" and 16b" and the second interchannel layer pattern 14" is comprised of a plurality of interchannel layer patterns 14a", 14b" and 14c". The etching process is further preformed for sufficient time to etch the upper portion of the substrate 10 to below the projected range of the heavily doped region 12.

Thereafter, an oxidation blocking layer 58 comprising a material having an etch selectivity with respect to the field regions 22, such as silicon nitride, is formed on the inner surfaces of the etched regions 30, the surface of the active channel pattern 18a and the surfaces of the field regions 22.

Figure 13B:
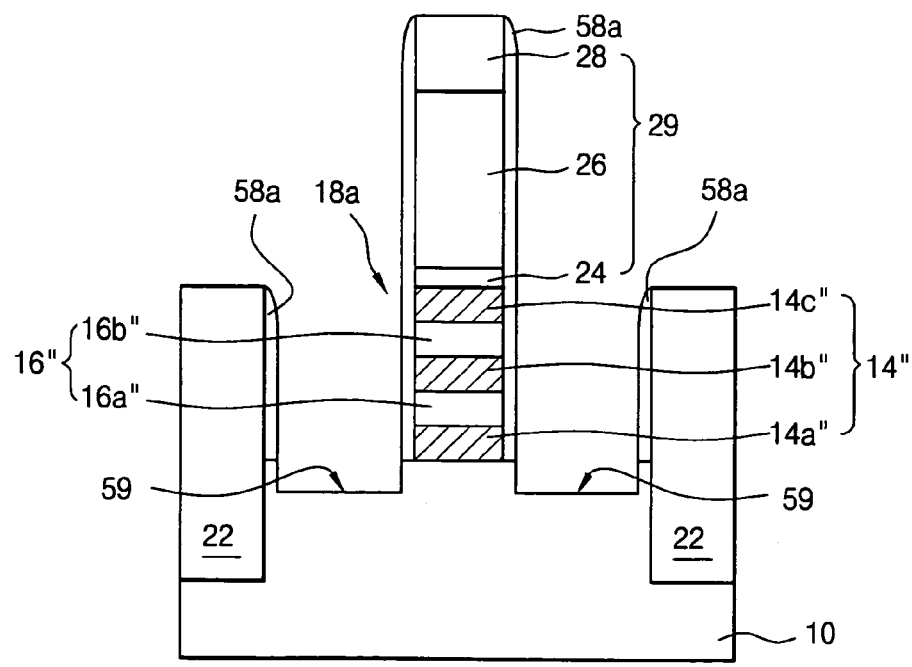

Referring to FIG. 13B, the oxidation blocking layer 58 is anisotropically etched away to form anti-oxidation spacers 58a only the sidewalls of the active channel pattern 18a and the inner sides of the etched regions 30 and simultaneously, to expose the surface 59 of the semiconductor substrate 10 of the etched regions 30, i.e., the bottoms of the source/drain.

Figure 13C:
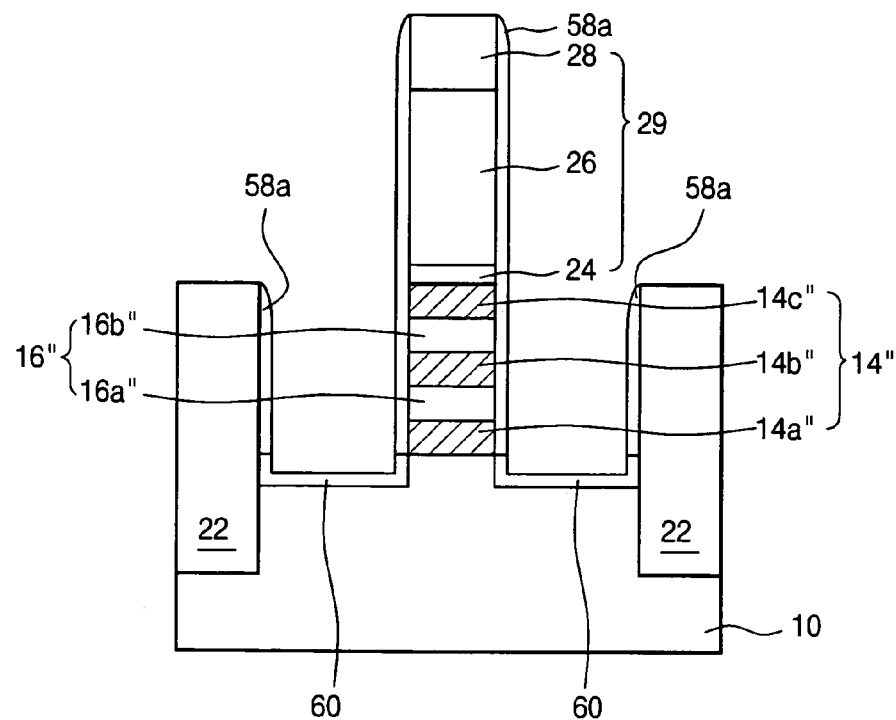
Figure 13D:
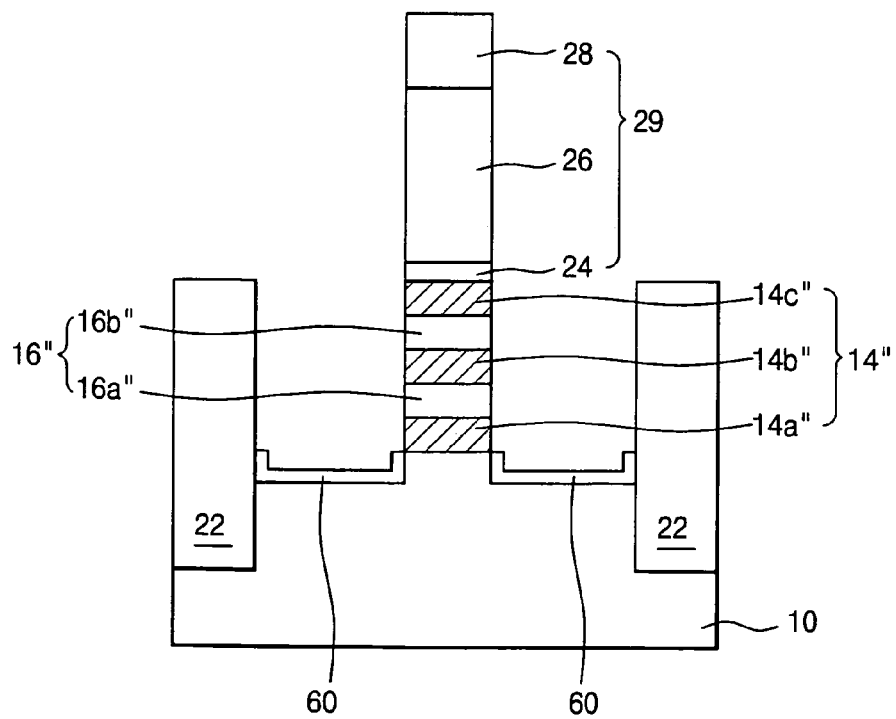
Figure 13E:
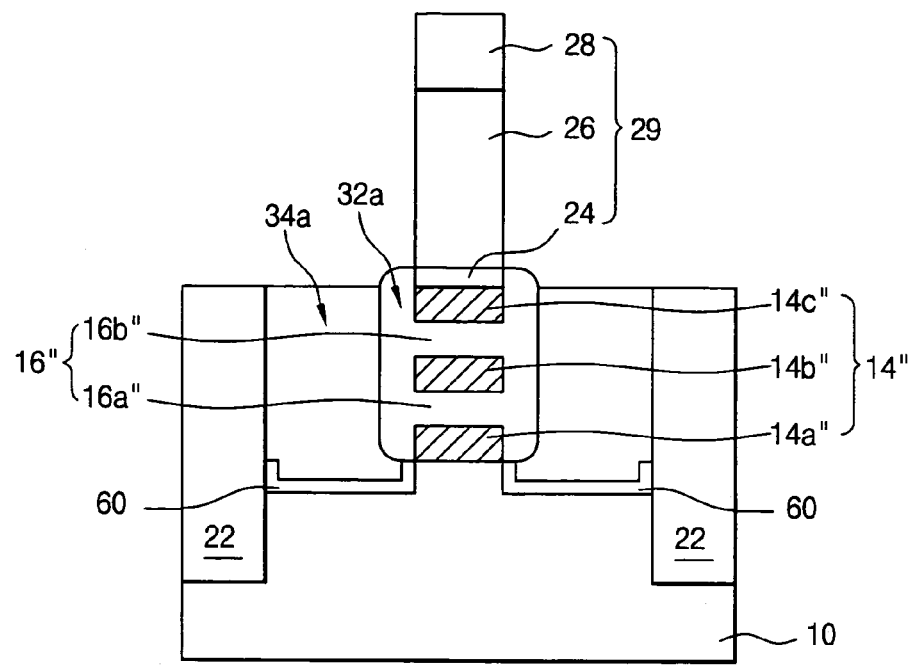

Referring to FIG. 13C, through a thermal oxidation process, the exposed surface of the substrate 59 is oxidized to form insulating layer patterns 60 comprised of silicon oxide only on the bottoms of the source/drain. Referring to FIG. 13D, the anti-oxidation spacers 58a are selectively removed through a wet etching process such as phosphoric acid stripping. Referring to FIG. 13E, in the same manner as shown in FIG. 4G of Embodiment 1, a selective epitaxial single crystalline film is partially grown on the sides of the active channel pattern 18a to form source/drain extension layers 32a.

In the same manner as shown in FIG. 4H, a conductive film such as doped polysilicon, metal, metal silicide, etc. is deposited on the surface of the resultant structure including the source/drain extension layers 32a and then, etched back to form source/drain regions 34a filling up the etched regions 30. Here, the epitaxial single crystalline film is thickly grown on the sides of the active channel pattern 18a because it is grown only on the silicon region excluding the insulating layer patterns 60. Accordingly, a tail 34a of the conductive film for source/drain may not remain under the sidewalls of the dummy gate pattern 26, in contrast to Embodiments 1 to 5.

Here, before depositing the conductive film, a tilted ion implantation may be executed to dope the source/drain extension layers 32a comprised of the selective epitaxial single crystalline film with impurities. Alternatively or in addition, the source/drain extension layers 32 can be doped by solid-phase diffusing a dopant from the source/drain regions in a subsequent annealing process. In either case, the source/drain extension layers 32a and the source/drain regions 34a can have uniform doping profile in a direction perpendicular to the channel region.

Figure 13F:
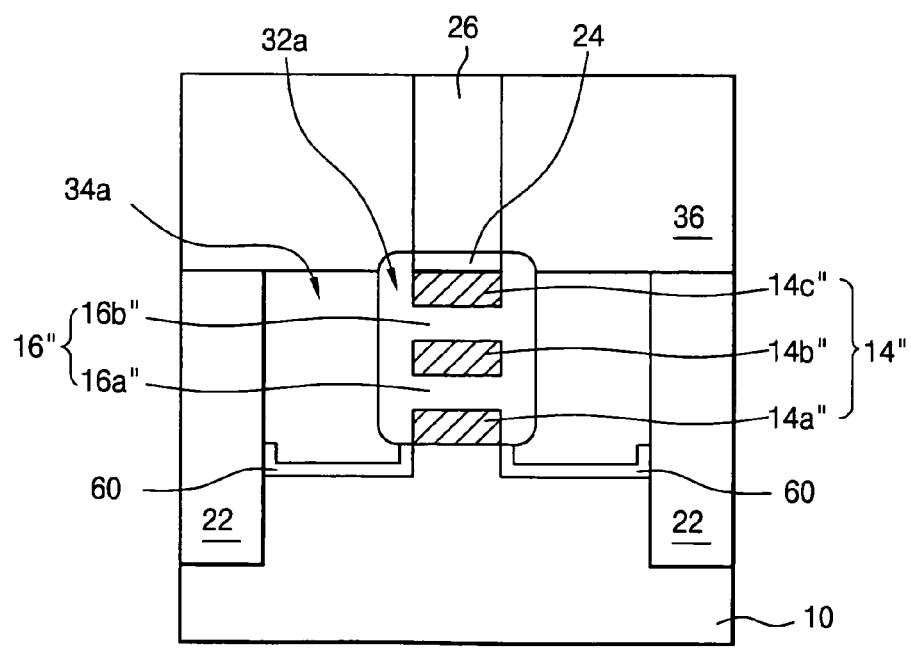

Referring to FIG. 13F, in the same manner as shown in FIG. 4I of Embodiment 1, silicon nitride is deposited on the source/drain regions 34a, the active channel pattern 18a of the channel region and the substrate 10, thereby forming a mask layer. Then, the mask layer is planarized until the surface of the dummy gate pattern 26 is exposed, thereby forming a mask pattern 36 exposing the dummy gate pattern 26.

Figure 13G:
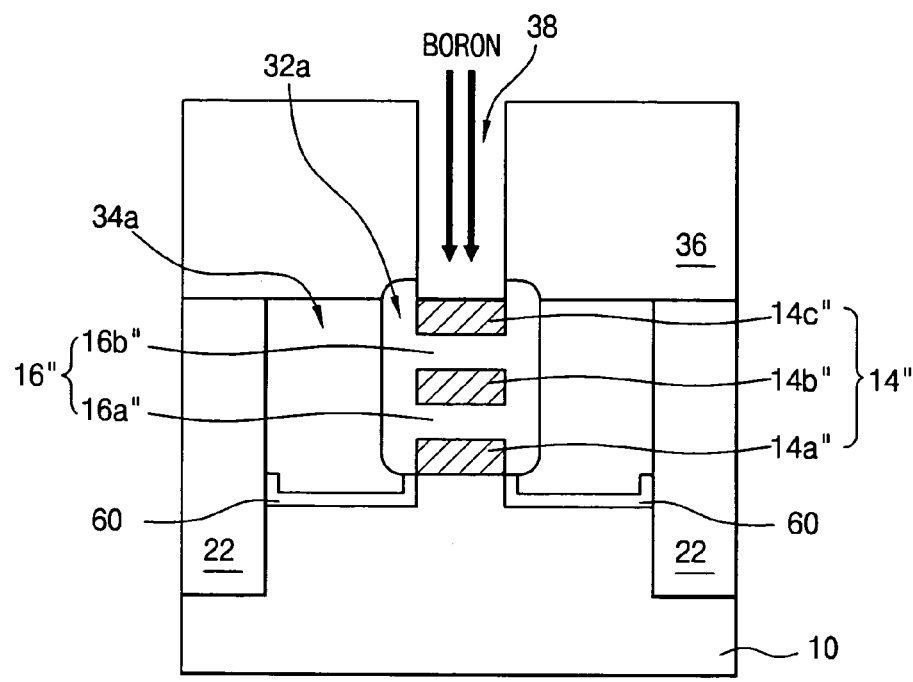

Referring to FIG. 13G, in the same manner as shown in FIG. 4K of Embodiment 1, the dummy gate pattern 26 is selectively removed by using the mask pattern 36, thereby forming a gate trench 38. Then, similar to FIG. 4M, the etch-stopping layer pattern 24 exposed through the gate trench 38 is removed. If the active channel pattern 18a of the channel region is not doped with boron, boron may be locally ion-implanted through the gate trench 38 to thereby dope the active channel pattern 18a of the channel region with boron. In some embodiments, the channel ion implantation with boron is carried out such that the projected range is formed within each of the channel layers 16". Alternatively, in other embodiments, the channel ion implantation with boron is executed such that the channel layers 16" have different doping concentrations from each other so that the obtained transistor successively operates according to the applied gate voltage. Note that phosphorous doping is not performed at this time.

Figure 13H:
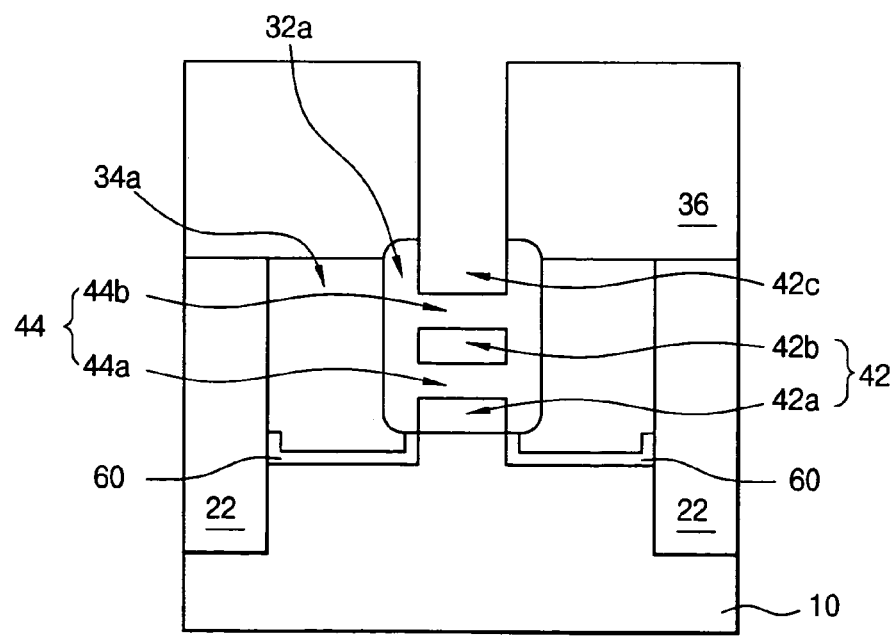

Referring to FIG. 13H, in the same manner as shown in FIG. 4N of Embodiment 1, the field regions 22 are selectively etched using the source/drain regions 34a as an etching mask, thereby exposing the sides of the active channel pattern 18a of the channel region. The plurality of interchannel layer patterns 14a", 14b" and 14c" are selectively removed through an isotropic etching process, thereby forming a plurality of tunnels 42 and 42b passing through the active channel pattern 18a and a tunnel groove 42c located at an uppermost position. Here, the second channel layer patterns 16a" and 16b" form a plurality of channels 44a and 44b. Poly etchant may be used.

Figure 13I:
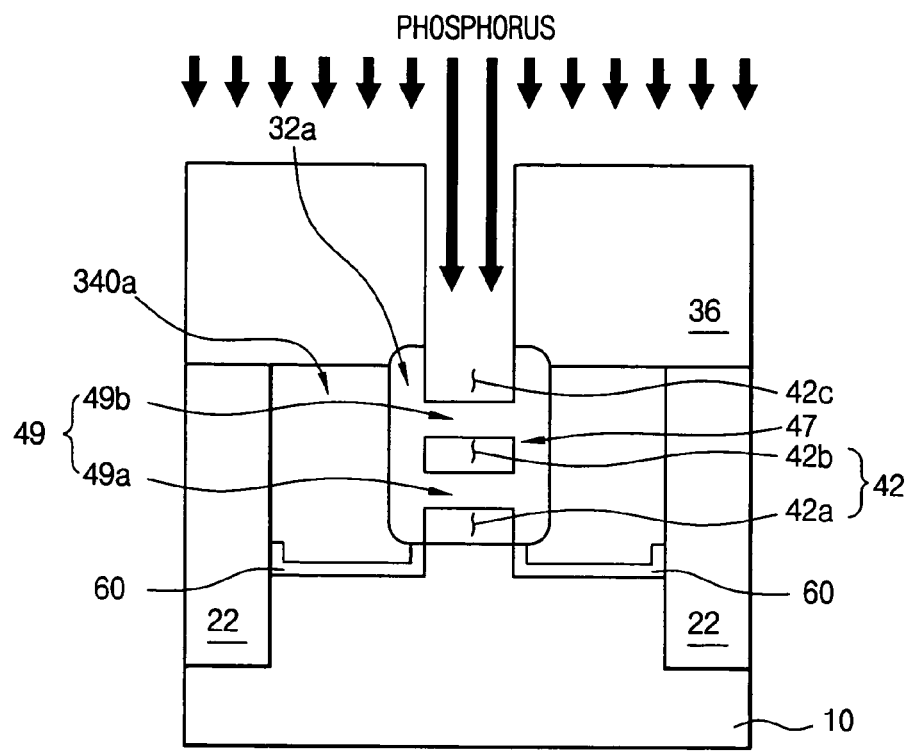

Referring to FIG. 13I, phosphorus is then implanted as was described in connection with FIG. 4O. Boron also may be implanted, if desired, as was described in connection with FIG. 4O.

Figure 13J:
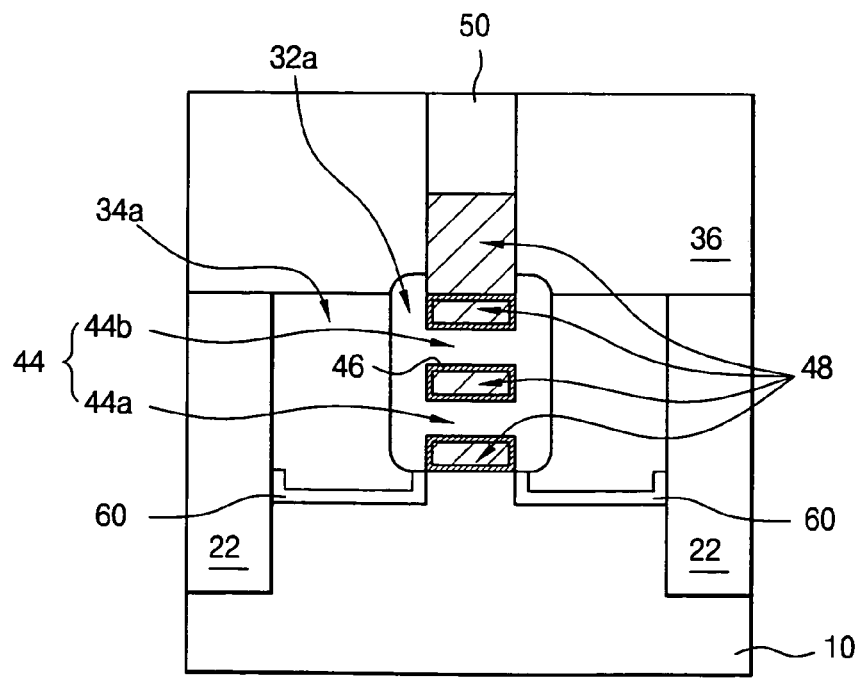

Referring to FIG. 13J, in the same manner as shown in FIG. 4P of Embodiment 1, a thermal oxidation process is carried out to form a gate-insulating layer 46 on the surfaces of the plurality of channels 44a and 44b (particularly, including the plurality of tunnels 42a and 42b and the tunnel groove 42c). Here, in order to reduce the surface roughness of the channels 44a and 44b, a heat treatment may be performed at a high temperature in a hydrogen ($H_2$) or argon (Ar) ambient before forming the gate-insulating layer 46.

Then, in the same manner as shown in FIG. 4Q of Embodiment 1, a polysilicon gate electrode 48 is formed so as to extend through and/or fill up the tunnels 42a and 42b and the tunnel groove 42c and to surround the plurality of channels 44a and 44b. A gate stack layer 50 comprising of metal silicide for reducing a gate resistance is formed on the top of the polysilicon gate electrode 48.

Figure 13K:
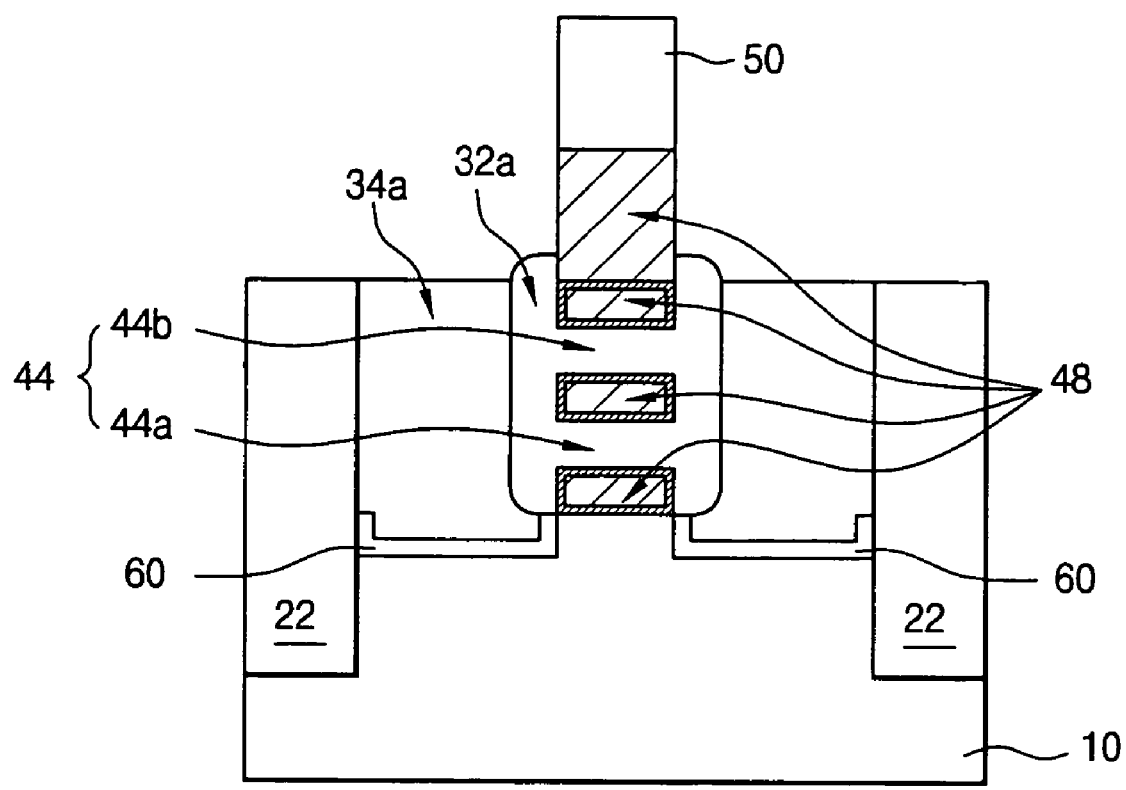

Referring to FIG. 13K, in the same manner as shown in FIG. 4S of Embodiment 1, the mask patterns 36 are removed and then, subsequent processes such as metal interconnection are carried out to complete the vertical MOS transistor.

According to the seventh embodiments of the present invention, the insulating layer patterns 60 are formed on the bottoms of the source/drain regions to thereby decrease the source/drain junction capacitance.

EMBODIMENT 8

Figure 14:
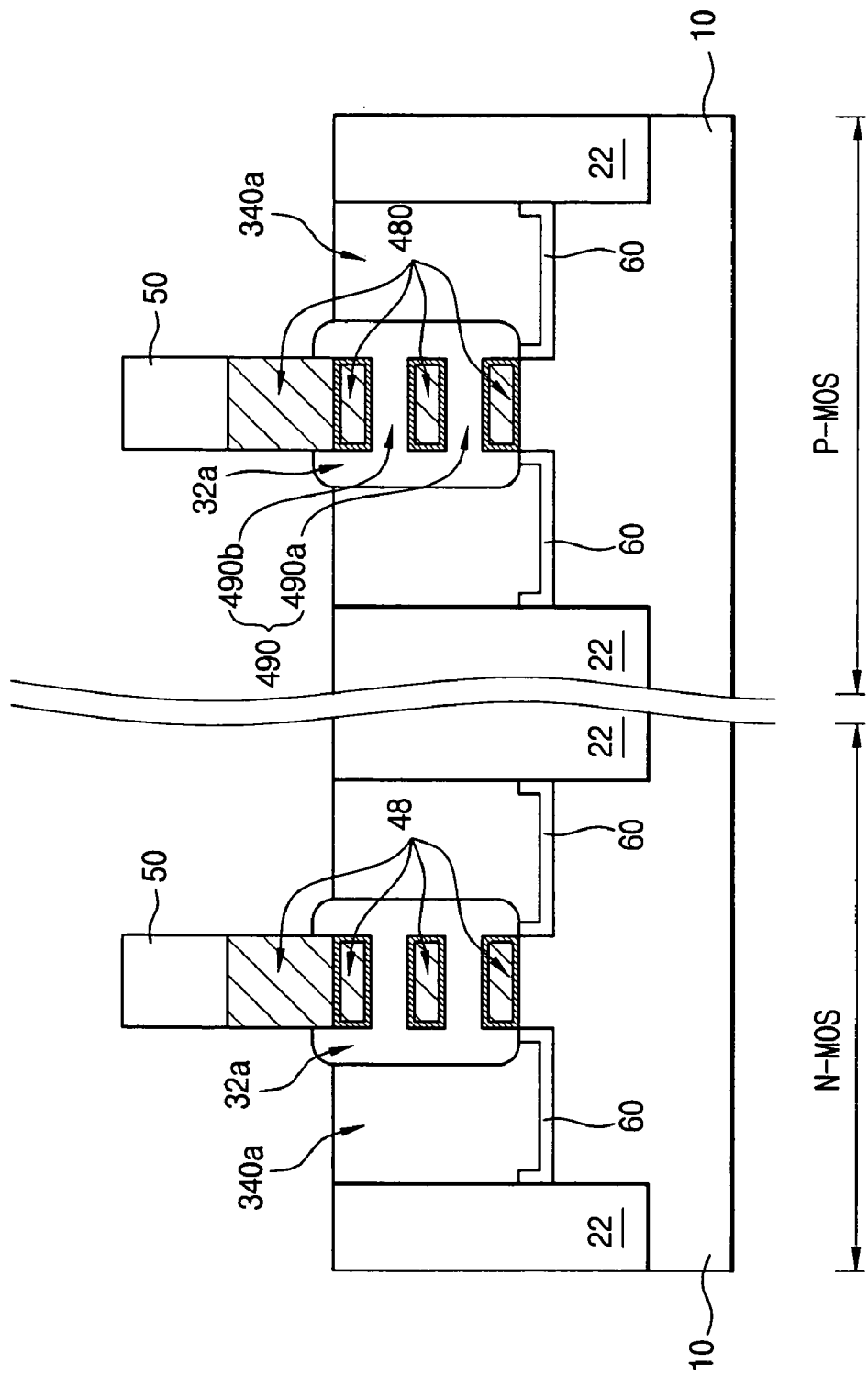
FIG. 14 is a cross-sectional view of a device in accordance with eighth embodiments of the present invention.

FIG. 14 is a side cross-sectional view of an eighth embodiment of the present invention. FIG. 14 is analogous to FIGS. 13A–13K for CMOS embodiments. In these embodiments, the P-MOS transistors are doped with phosphorus after forming the tunnels. The N-MOS and, optionally, the P-MOS channels are doped with boron before and/or after forming the tunnels. Accordingly, additional description need not be provided.

EMBODIMENT 9

Figure 15:
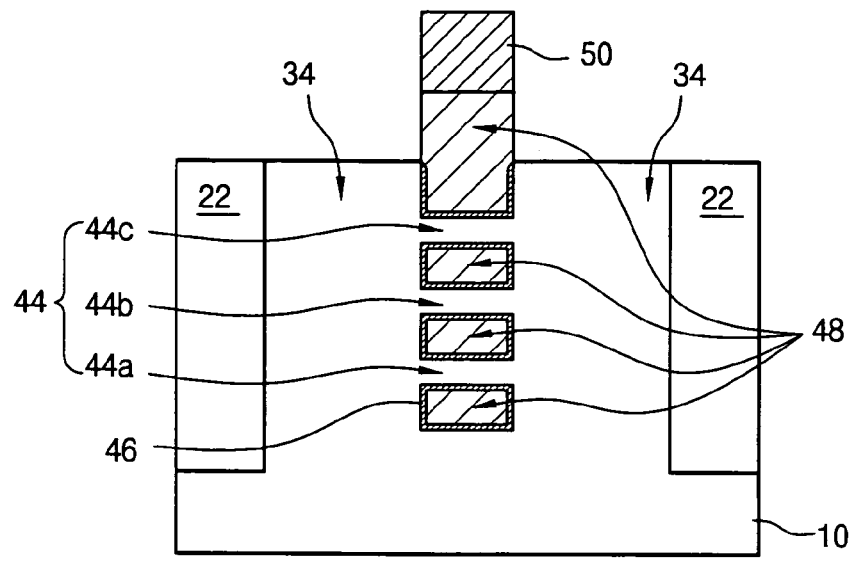
FIG. 15 is a cross-sectional view of a device according to ninth embodiments of the present invention.

FIG. 15 is a cross-sectional view of a device in accordance with ninth embodiments of the present invention. In the present embodiments, the same elements as those in other embodiments are indicated by the same numerals.

In the present embodiments, after performing processes in the same manner as shown in FIGS. 4A to 4F, a pre-active pattern 18 is etched away to form etched regions 30 where the source/drain regions are to be formed and an active channel pattern 18a. Then, the etched regions 30 are filled with a selective epitaxial single crystalline film to form source/drain regions 34. Next, in the same manner as shown in FIGS. 4I to 4S, subsequent processes are executed to form the semiconductor device.

Accordingly, the present embodiment is similar to Embodiment 1 except that the etched regions 30 are completely filled by an epitaxial method to form the source/drain regions 34 without forming additional source/drain extension layers.

In the present embodiment, gate spacers 54 comprising an insulating material may be formed between a gate electrode 48 and the source/drain regions 34 by combining a method as shown in Embodiment 3 or 5. Further, insulating layer patterns 60 may be formed on the bottoms of the source/drain regions 34 by combining a method as shown in Embodiment 7.

EMBODIMENT 10

Figure 16:
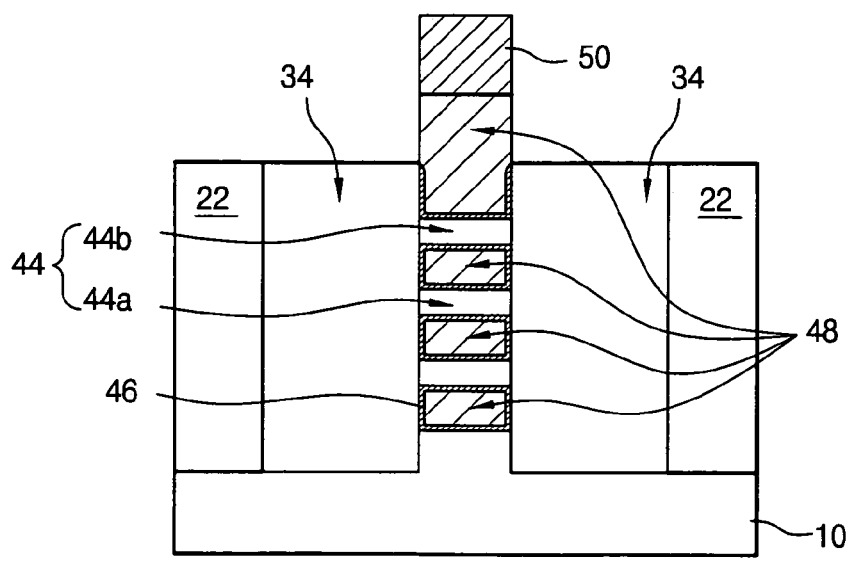
FIG. 16 is a cross-sectional view of a device according to tenth embodiments of the present invention.

FIG. 16 is a cross-sectional view of a semiconductor device in accordance with tenth embodiments of the present invention. In the present embodiments, the same elements as those earlier embodiments are indicated by the same numerals.

The semiconductor device of the present embodiments is similar to Embodiment 9 in which a pre-active pattern 18 is etched away to form etched regions 30 for source/drain and an active channel pattern 18a in the same manner as shown in FIGS. 4A to 4F of Embodiment 1, except that the conductive film such as doped polysilicon, metal, metal silicide, etc., is deposited and then, etched back to form source/drain regions 34 on the etched regions 30 instead of filling the etched regions 30 with a selective epitaxial single crystalline film as shown in Embodiment 9.

In the present embodiments, it may be unnecessary to form additional source/drain extension layers in the same manner as in Embodiment 9. Further, a vertical MOS transistor having multiple channels can be obtained by combining a method as shown in Embodiment 3, Embodiment 5 or Embodiment 7 with Embodiment 10.

EMBODIMENT 11

Figure 17:
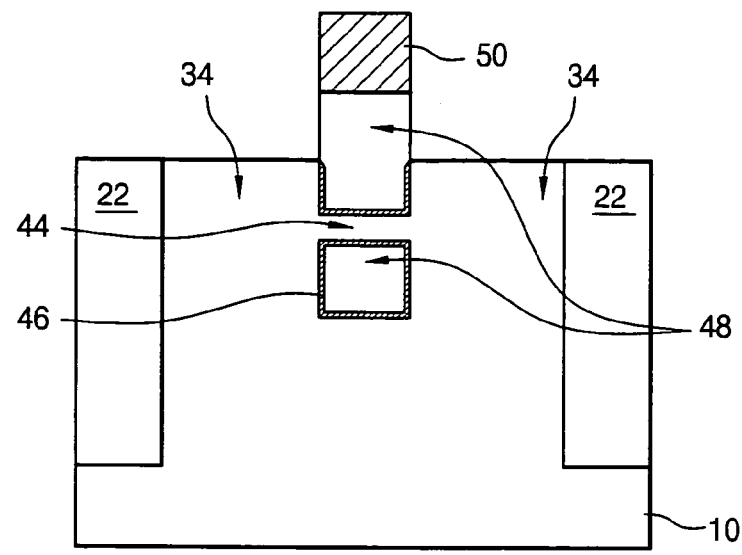
FIG. 17 is a cross-sectional view of a device in accordance with eleventh embodiments of the present invention.

FIG. 17 is a cross-sectional view of a semiconductor device in accordance with seventh embodiments of the present invention. The semiconductor device of the present embodiment is similar to that of Embodiment 9 except that the number of channels 44 and the thickness of tunnels are different from those of the semiconductor device shown in Embodiment 9 by controlling the thickness and the repetitive number of the interchannel layers and the channel layers constituting the active pattern.

EMBODIMENT 12

Figure 18:
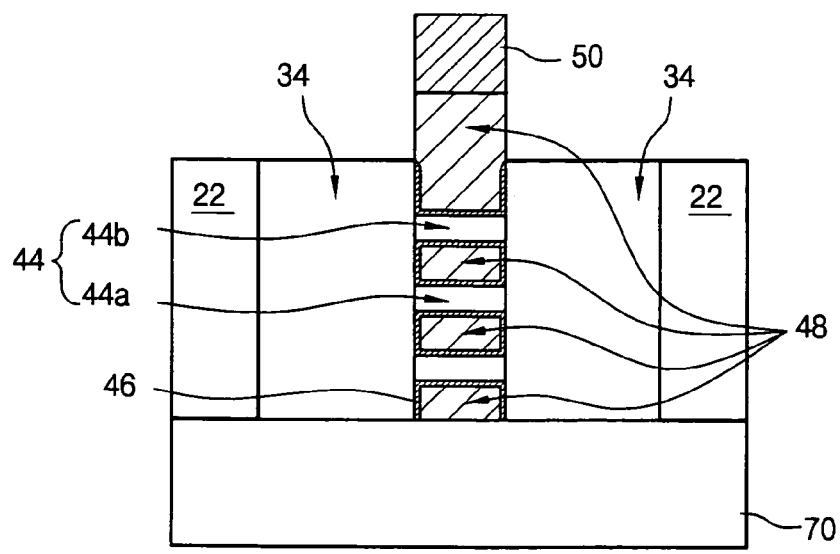
FIG. 18 is a cross-sectional view of a device in accordance with twelfth embodiments of the present invention.

FIG. 18 is a cross-sectional view of a semiconductor device in accordance with eighth embodiments of the present invention. The semiconductor device of the present embodiments is formed on an oxide layer 70 of SOI substrate in the same manner as shown in Embodiment 9 or Embodiment 10.

Particularly, there is provided a vertical MOS transistor having an active channel pattern comprising a plurality of channels 44a, 44b and 44c on the oxide layer 70 of SOI substrate with tunnels interposed between each of the channels, source/drain regions 34 formed so as to connect with the plurality of channels 44a, 44b and 44c on both sides of the active channel pattern and a gate electrode 48 formed on the active channel pattern so as to extend through or fill up the tunnels and to surround the plurality of channels 44a, 44b and 44c.

The vertical MOS transistor can be obtained by combining a method as shown in the other previous Embodiments. As is well known to those having skill in the art, the SOI substrate has a lower semiconductor substrate (not shown) and the buried oxide layer 70 formed on the substrate.

In the present embodiments, a plurality of interchannel layers comprising single crystalline Ge (including, for example, single crystalline SiGe film) and a plurality of channel layers comprising single crystalline Si film are stacked alternately with each other on the buried oxide layer 70. Then, the plurality of interchannel layers and the plurality of channel layers are patterned to form a pre-active pattern.

EMBODIMENT 13

Figure 19:
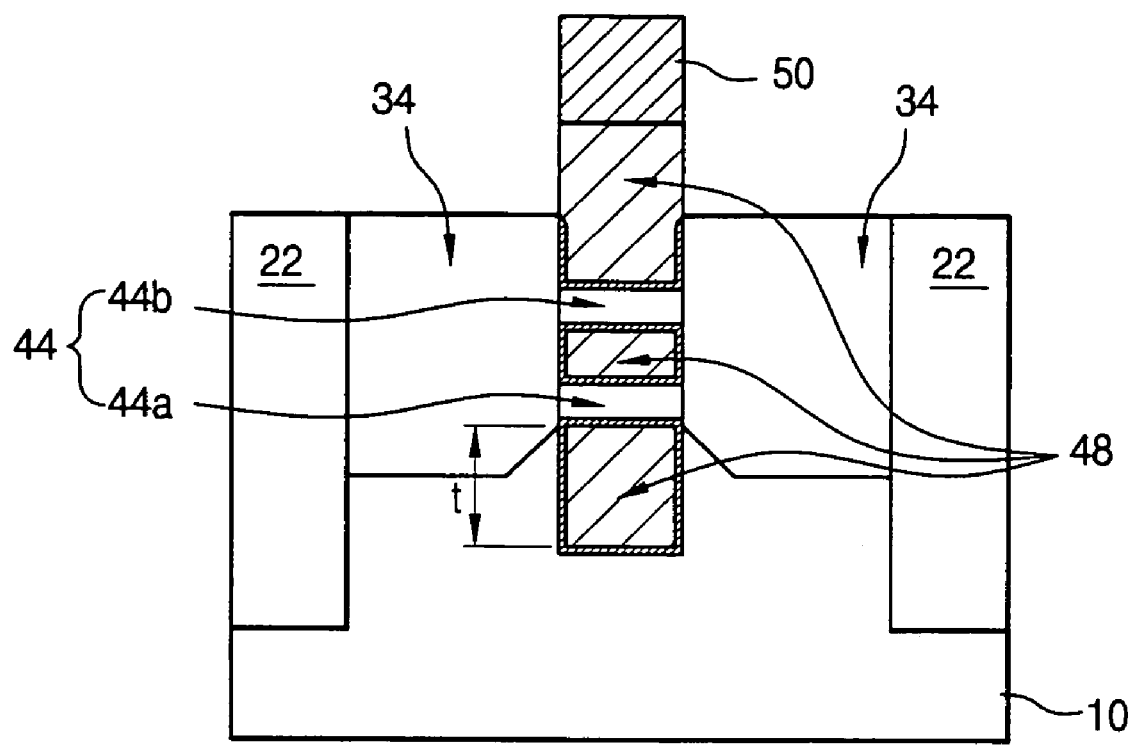
FIG. 19 is a cross-sectional view of a device according to thirteenth embodiments of the present invention.

FIG. 19 is a cross-sectional view of a semiconductor device in accordance with ninth embodiments of the present invention. The semiconductor device of the present embodiments is similar to that shown in FIG. 15 of Embodiment 9 except that the thickness (t) of the lowest tunnel filled with a gate electrode 48 is formed thicker than the other tunnels so as to reduce or prevent the operation of the parasitic transistor of the lowest channel 44a. The same numerals indicate the same elements.

Particularly, in the process illustrated by referring to FIG. 4B in Embodiment 1, the thickness (t) of the lowest interchannel layer 14a is formed thicker than the other interchannel layers 14b and 14c when a plurality of interchannel layers 14 and a plurality of channel layers 16 are stacked alternately with each other on a semiconductor substrate 10. In the same manner as shown in FIGS. 4D to 4F of Embodiment 1, the plurality of interchannel layers 14 and the plurality of channel layers 16 are patterned to form a pre-active pattern 18 and then, the pre-active pattern 19 is etched away until the surface of the substrate 10 is exposed, thereby defining regions where source/drain regions are to be formed and simultaneously, forming an active channel pattern 18a including interchannel layer patterns and channel layer patterns.

In the same manner as in Embodiment 9, an epitaxial single crystalline film is grown so as to fill up the etched regions and then, doped up to the upper portion of the lower interchannel layer, thereby forming source/drain regions 34. Subsequent processes are similar to the above-described embodiments.

EMBODIMENT 14

FIGS. 20A to 20F are cross-sectional views illustrating methods of manufacturing a semiconductor device in accordance with fourteenth embodiments of the present invention.

Figure 20A:
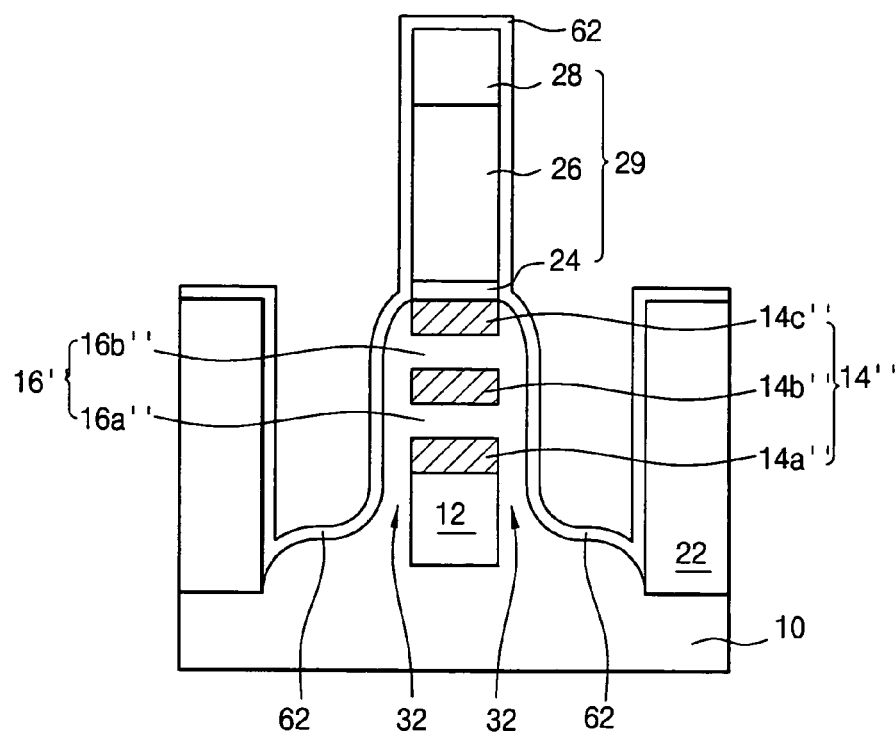
FIGS. 20A to 20F are cross-sectional views illustrating methods of manufacturing a device according to fourteenth embodiments of the present invention.

Referring to FIG. 20A, in the same manner as shown in FIGS. 4A to 4C of Embodiment 1, an pre-active pattern 18 in which a plurality of interchannel layers 14 and a plurality of channel layers 16 are stacked alternately with each other and field regions 22 surrounding the pre-active pattern 18 are formed on a substrate 10. In some embodiments, the plurality of interchannel layers 14 comprises single crystalline Ge (including, for example, single crystalline SiGe film), while the plurality of channel layers 16 comprise single crystalline Si film.

Thereafter, in the same manner as shown in FIGS. 4D and 4E in Embodiment 1, a gate hard mask 29 including a dummy gate pattern (not shown) is formed on the pre-active pattern.

In the same manner as shown in FIG. 4F of Embodiment 1, the pre-active pattern 18 is etched away using the gate hard mask 29 until the surface of the substrate 10 is exposed, thereby forming regions 30 where source/drain are to be formed. As a result, only pre-active pattern 18 of the channel region remains.

Then, in the same manner as shown in FIG. 4G of Embodiment 1, a selective epitaxial single crystalline film is partially grown on the sides of the pre-active pattern 18 and the exposed surface of the substrate 10, thereby forming source/drain extension layers 32. A tilted ion implantation may be carried out to dope the source/drain extension layers 32 with impurities.

Next, as shown in FIG. 20A, silicon nitride is deposited on the entire surface of the resultant structure to form a first insulating layer 62. Particularly, the first insulating layer 62 comprised of an insulating material having an etch selectivity with respect to the pre-active pattern 18 and the field regions 22, e.g., silicon nitride, is formed on the entire surface of the substrate including the field regions 22 and the source/drain extension layers 32.

Figure 20B:
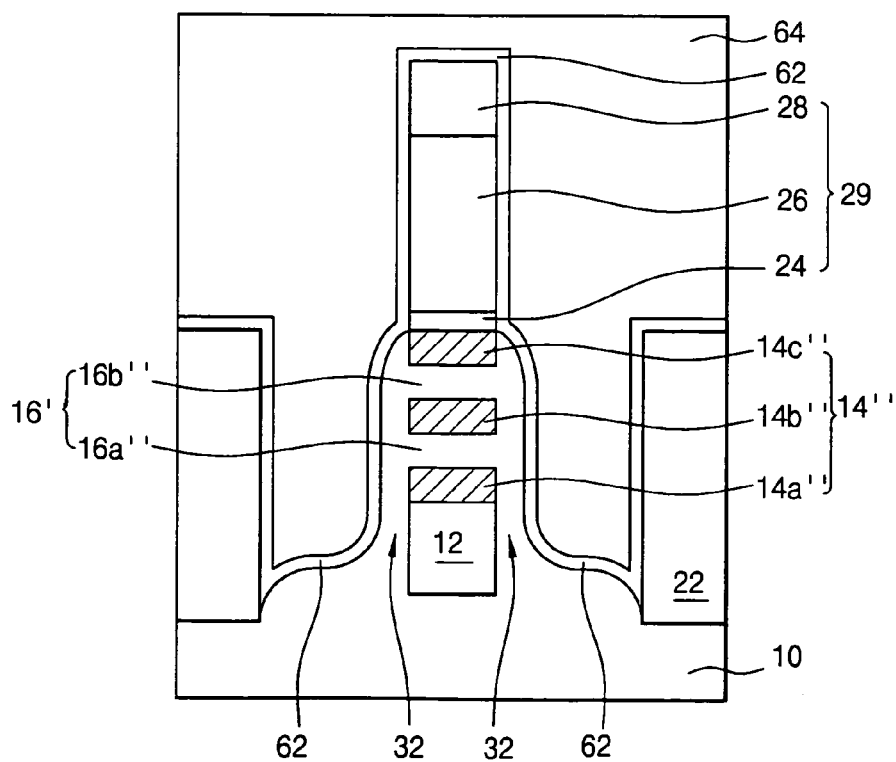

Referring to FIG. 20B, a second insulating layer 64 is deposited on the first insulating layer 62 so as to, in some embodiments, sufficiently fill up the regions where the source/drain are to be formed between the source/drain extension layers 32 and the field regions 22. The second insulating layer 64 comprises a material having an etch selectivity with respect to the first insulating layer 62. In some embodiments, the second insulating layer 64 is comprised of the same material as that constituting the field regions 62, e.g., silicon oxide.

Figure 20C:
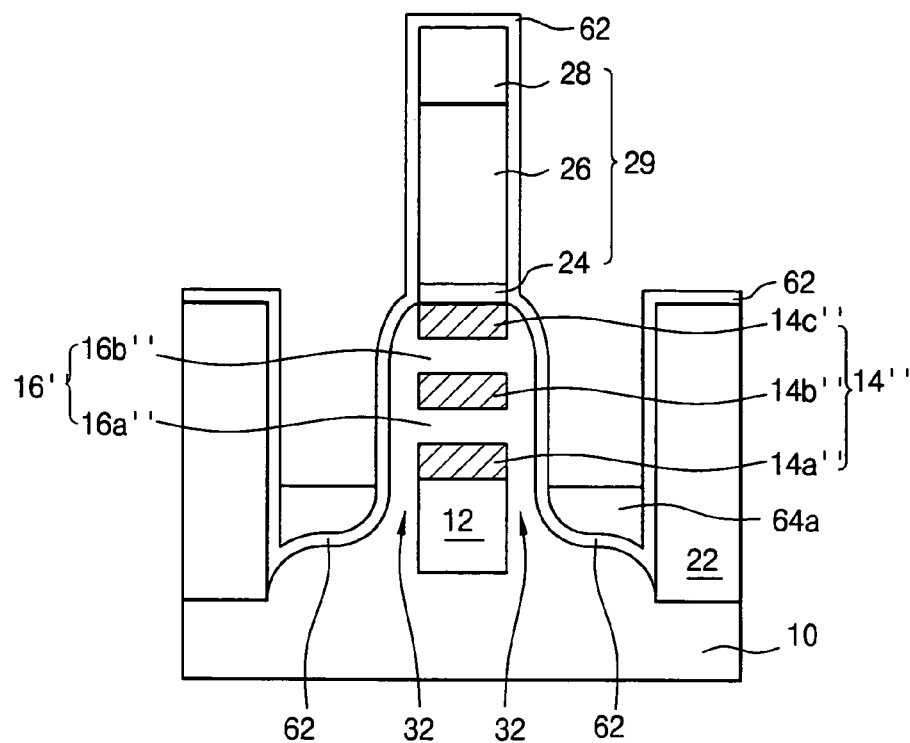

Referring to FIG. 20C, the second insulating layer 64 is etched back to the lowest tunnel, thereby forming second insulating layer patterns 64a on the bottoms of the regions where the source/drain are to be formed.

Figure 20D:
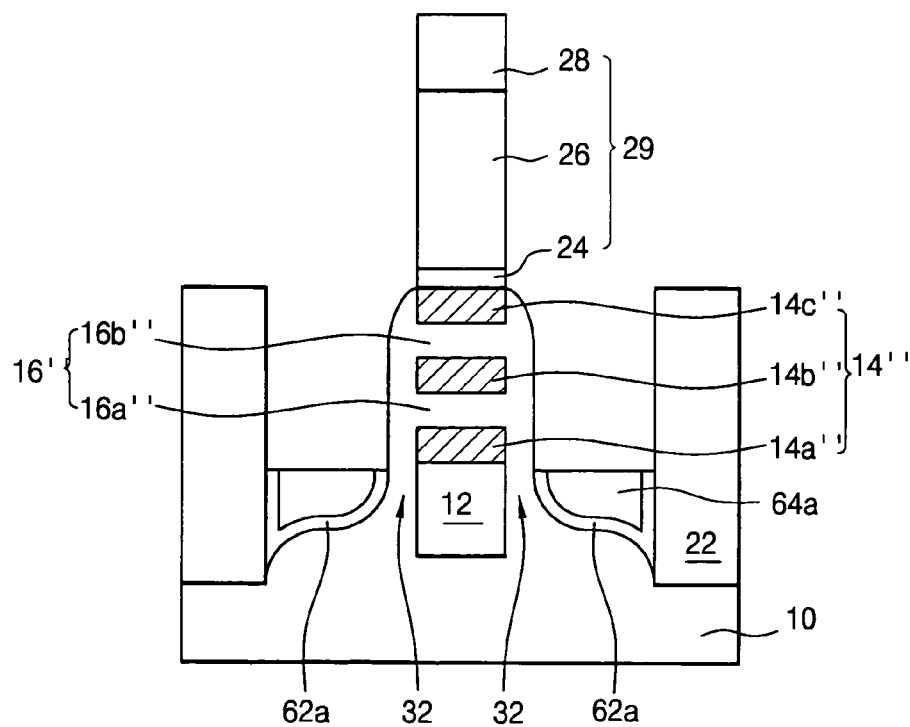

Referring to FIG. 20D, using the second insulating layer patterns 64a as an etching mask, the first insulating layer 62 is etched back to form first insulating layer patterns 62a under each of the second insulating layer patterns 64a.

Figure 20E:
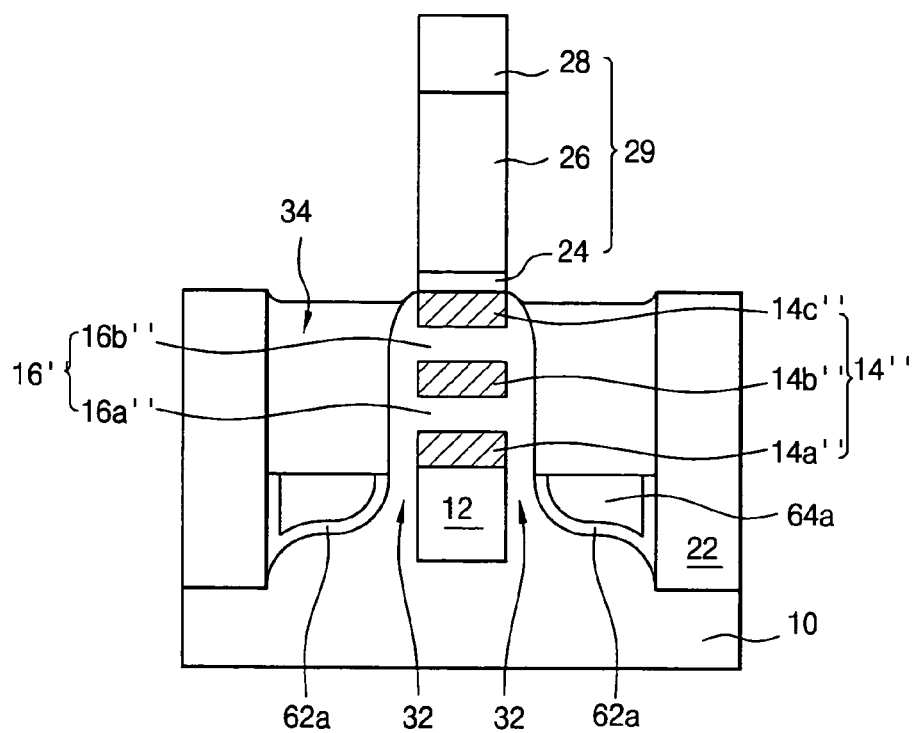

Referring to FIG. 20E, the regions where the source/drain are to be formed between the field regions 22 and the source/drain extension layers 32 are provided with or filled with a conductive film such as doped polysilicon, metal, metal silicide, etc., thereby forming source/drain regions 34.

Figure 20F:
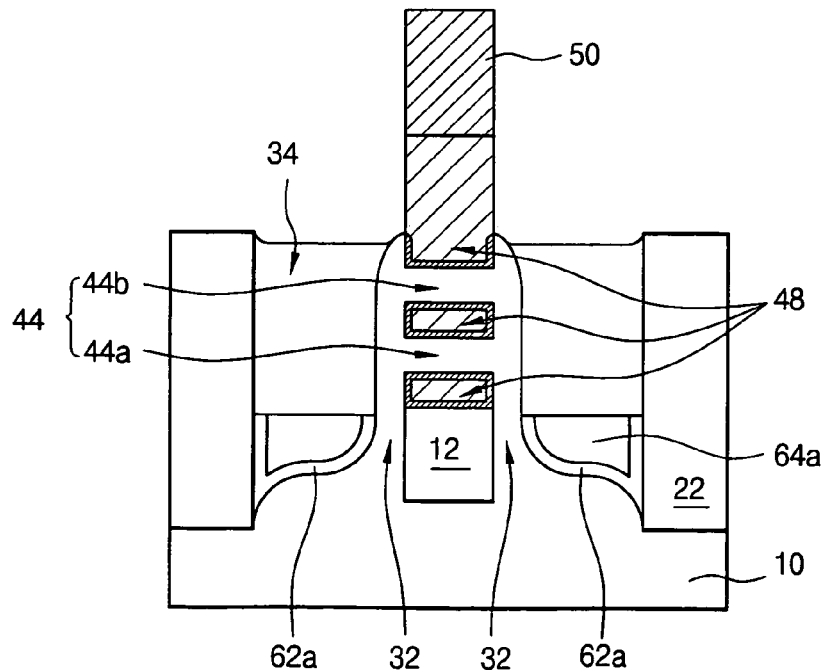
Figure 21:
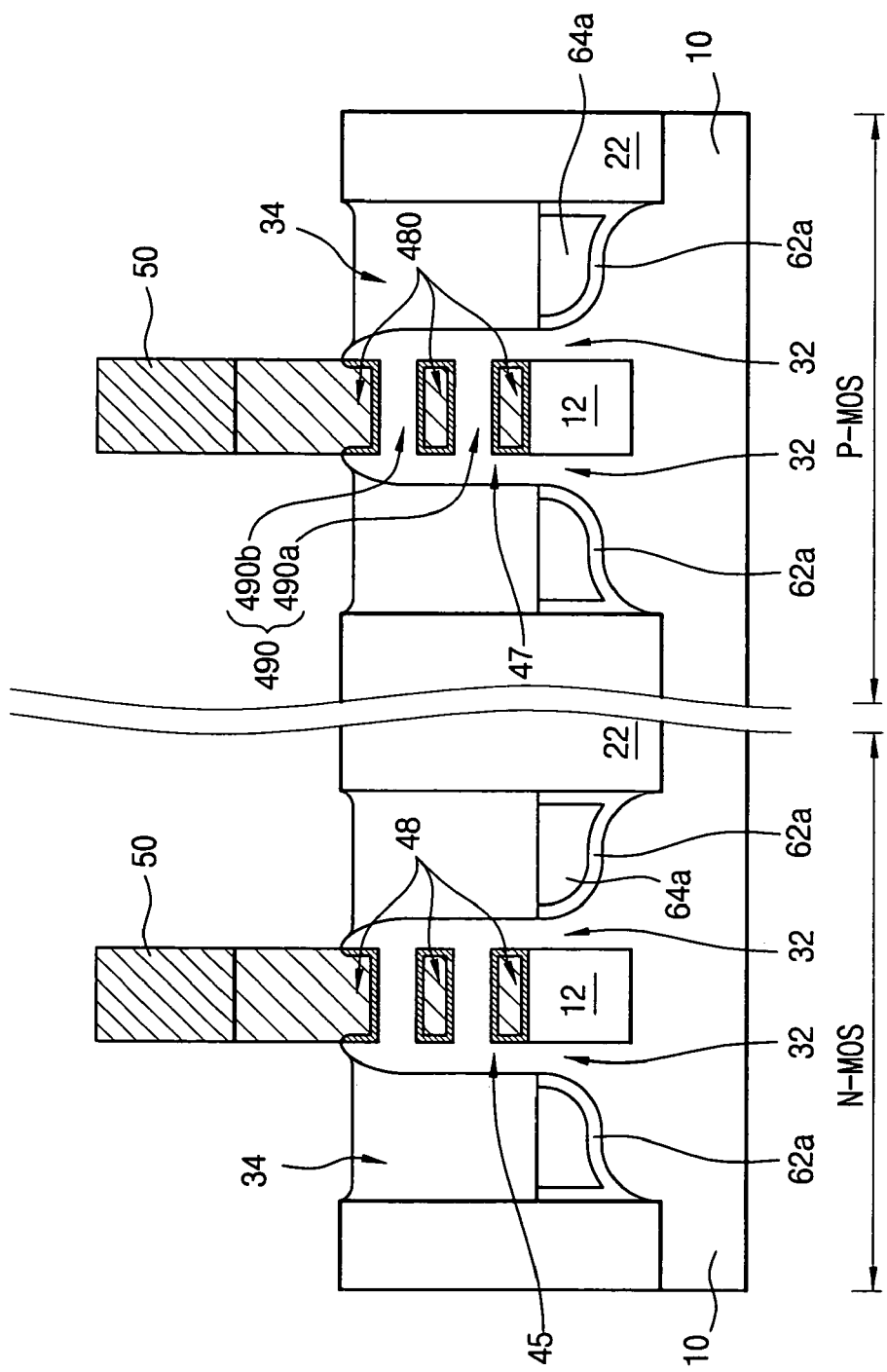
FIG. 21 is a cross-sectional view of a device in accordance with fifteenth embodiments of the present invention.

Next, in the same manner as shown in FIGS. 4I to 4S of Embodiment 1, the semiconductor device is manufactured as shown in FIG. 20F.

According to the present embodiments, an insulating layer stack structure including the first insulating layer pattern 62a and the second insulating layer pattern 64a is formed on the bottoms of the source/drain regions 34, which can decrease in the source/drain junction capacitance.

EMBODIMENT 15

These embodiments are similar to Embodiment 14 of FIGS. 20A-20F, except that CMOS embodiments are shown. As was described in connection with earlier CMOS embodiments, the P-channel transistor is not doped with phosphorus until after the tunnels have been formed. The N-channel devices may be doped with boron and, optionally, the P-channel devices may be doped with boron before and/or after the tunnels are formed. Accordingly, additional details of these embodiments need not be described.

EMBODIMENT 16

FIGS. 22A to 22E are cross-sectional views illustrating semiconductor devices and methods of manufacturing the same in accordance with sixteenth embodiments of the present invention. In the present embodiments, the same elements as those in earlier embodiments are indicated by the same numerals.

Figure 22A:
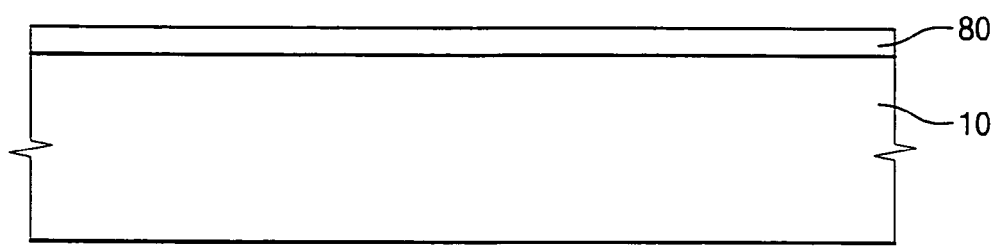
FIGS. 22A to 22E are cross-sectional views illustrating methods of manufacturing a device in accordance with sixteenth embodiments of the present invention.

Referring to FIG. 22A, for example, through a chemical vapor deposition method, an oxide layer 80 is formed on a semiconductor substrate 10 comprised of silicon (Si), silicon-germanium (Si—Ge), silicon-on-insulator (SOI), silicon-germanium-on-insulator (SGOI) and/or other conventional substrates/layers.

Figure 22B:
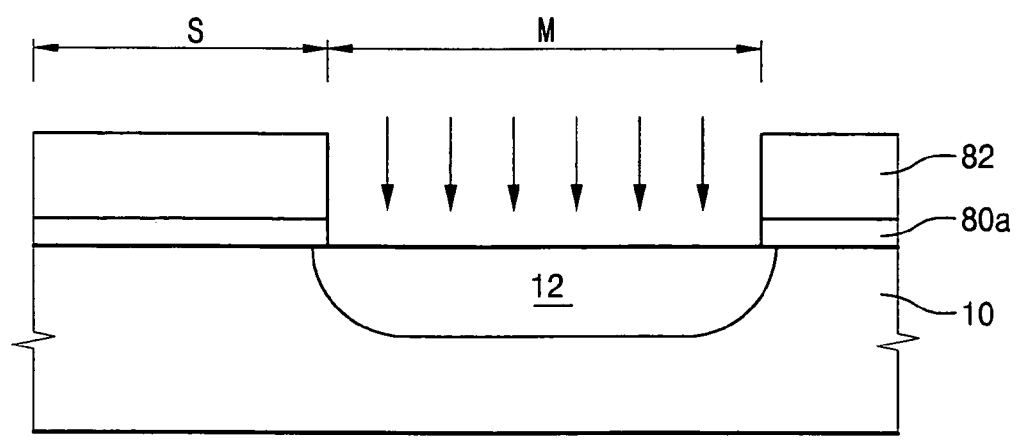

Referring to FIG. 22B, a photoresist film is coated on the oxide layer 80 and then, exposed and developed to form photoresist patterns 82 opening a region M where multiple channels will be formed.

Then, using the photoresist patterns 82 as a mask, the oxide layer 80 is dry-etched away to form oxide layer patterns 80a defining a multiple channel region M and a single channel region S. That is, the oxide layer patterns 80a remain only on the typical single channel regions S.

Subsequently, an impurity of the same conductivity as that of the substrate 10 is ion-implanted in the exposed substrate surface of the multiple channel region M, thereby forming heavily doped region 12 for reducing or preventing the operation of the bottom transistor.

Figure 22C:
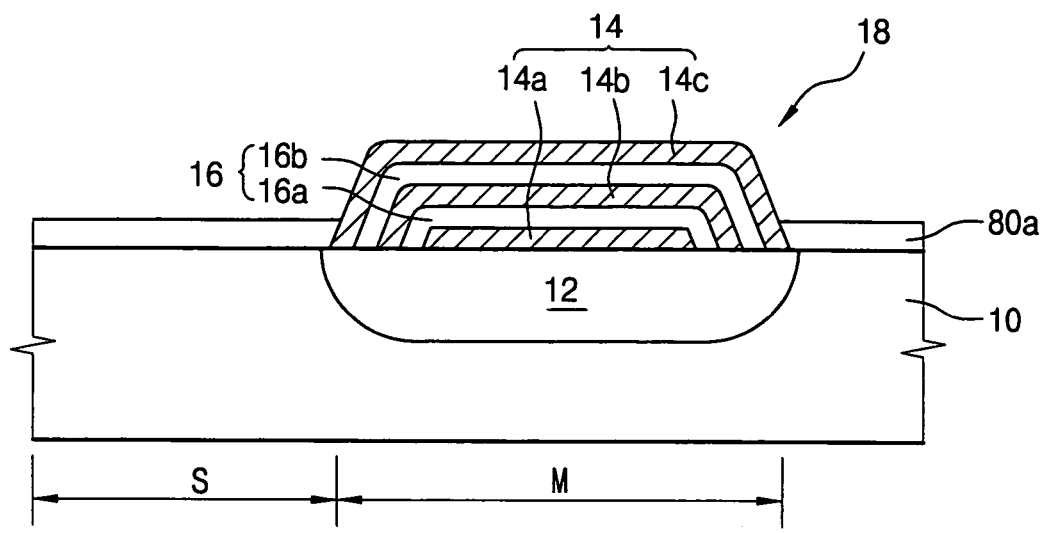

Referring to FIG. 22C, the photoresist patterns 82 are removed by ashing and stripping processes. Then, through a selective epitaxial growth method, a plurality of interchannel layers 14 and a plurality of channel layers 16 are stacked alternately with each other on the regions excluding the oxide layer patterns 80a, i.e., on the substrate surface of the multiple channel region M.

Particularly, a single crystalline Ge epitaxial film (including, for example, a single crystalline Si—Ge epitaxial film) is selectively grown to a thickness of about 300 Å on the surface of the substrate 10 excluding the oxide layer patterns 80a, thereby forming a first interchannel layer 14a. Then, a single crystalline Si epitaxial film having a thickness of about 300 Å is grown on the first interchannel layer 14a to thereby form a first channel layer 16a. Here, in order to previously perform the channel doping, the channel layer 16 may be formed of a boron doped single crystalline Si epitaxial film. However, phosphorus doping is not provided.

By doing so, no epitaxial film is grown on the single channel region S, while a pre-active pattern 18 in which the plurality of interchannel layers 14 and the plurality of channel layers 16 are stacked alternately each other is formed on the multiple channel region M. Boron doping may be performed if desired. However, phosphorus doping is not performed.

Figure 22D:
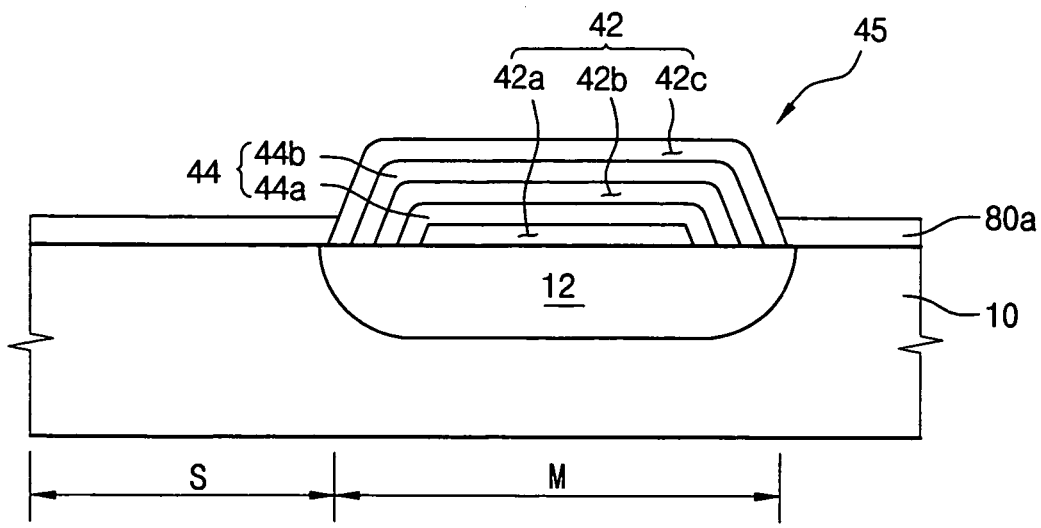
Figure 22E:
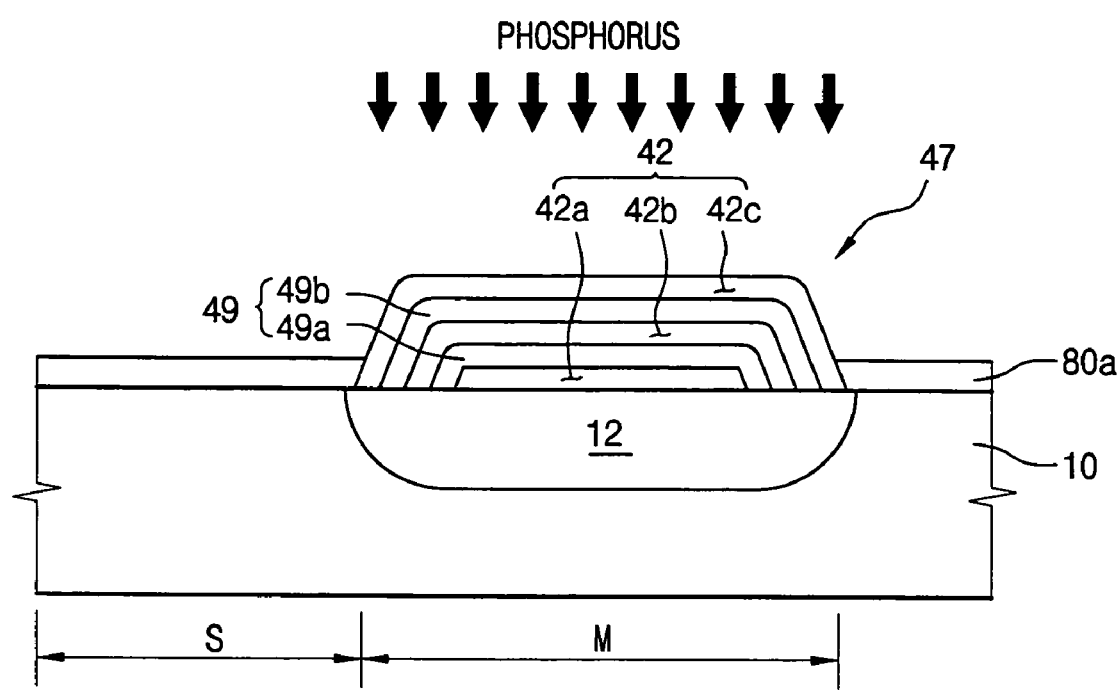

Referring to FIG. 22D, the interchannel layers 14 are removed, to provide a plurality of tunnel layers 42a–42c. Then, as shown in FIG. 22E, after forming the tunnels 42, phosphorus is doped using ion implantation and/or plasma doping. Boron also may be doped at this time if desired.

Finally, in the same manner as shown in previous embodiments, subsequent processes are carried out to form a semiconductor device.

EMBODIMENT 17

Figure 23A:
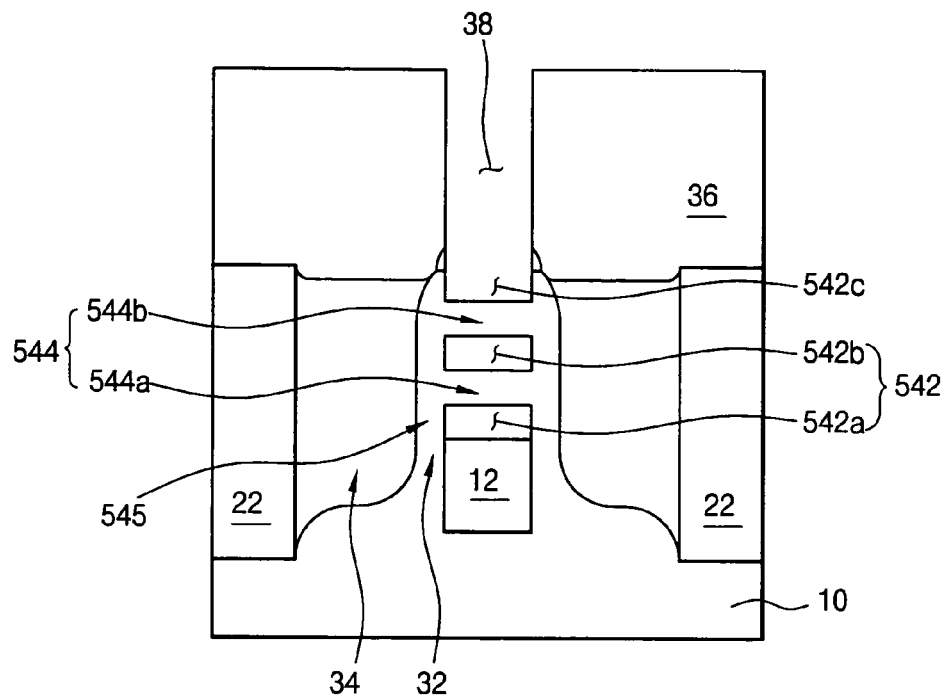
FIGS. 23A to 23C are cross-sectional views illustrating methods of manufacturing a device in accordance with seventeenth embodiments of the present invention.
Figure 23B:
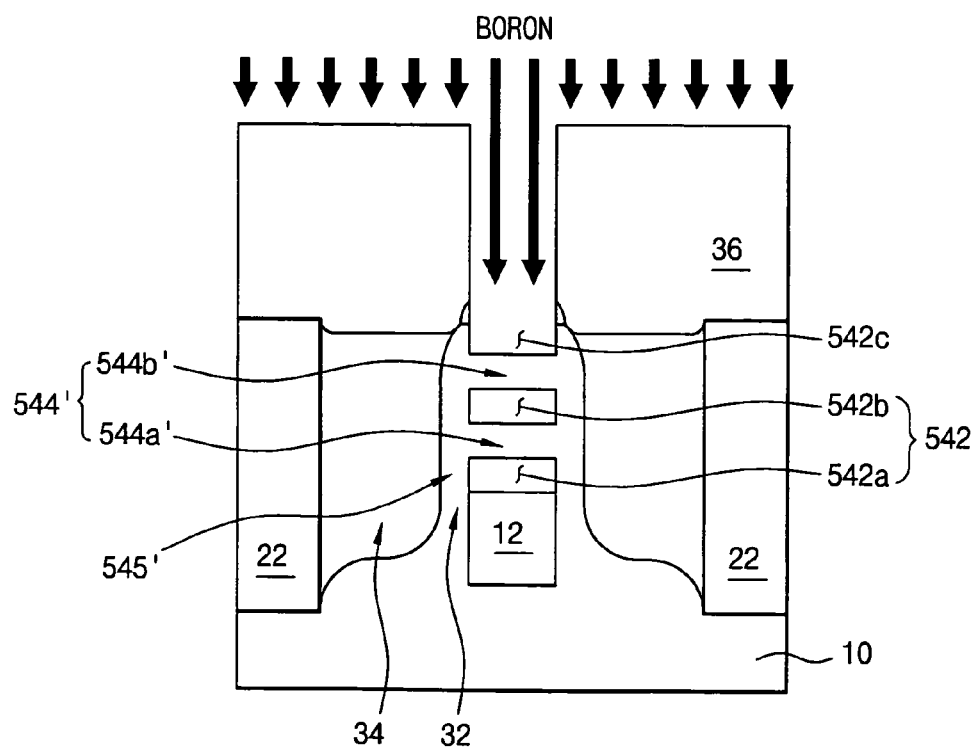
Figure 23C:
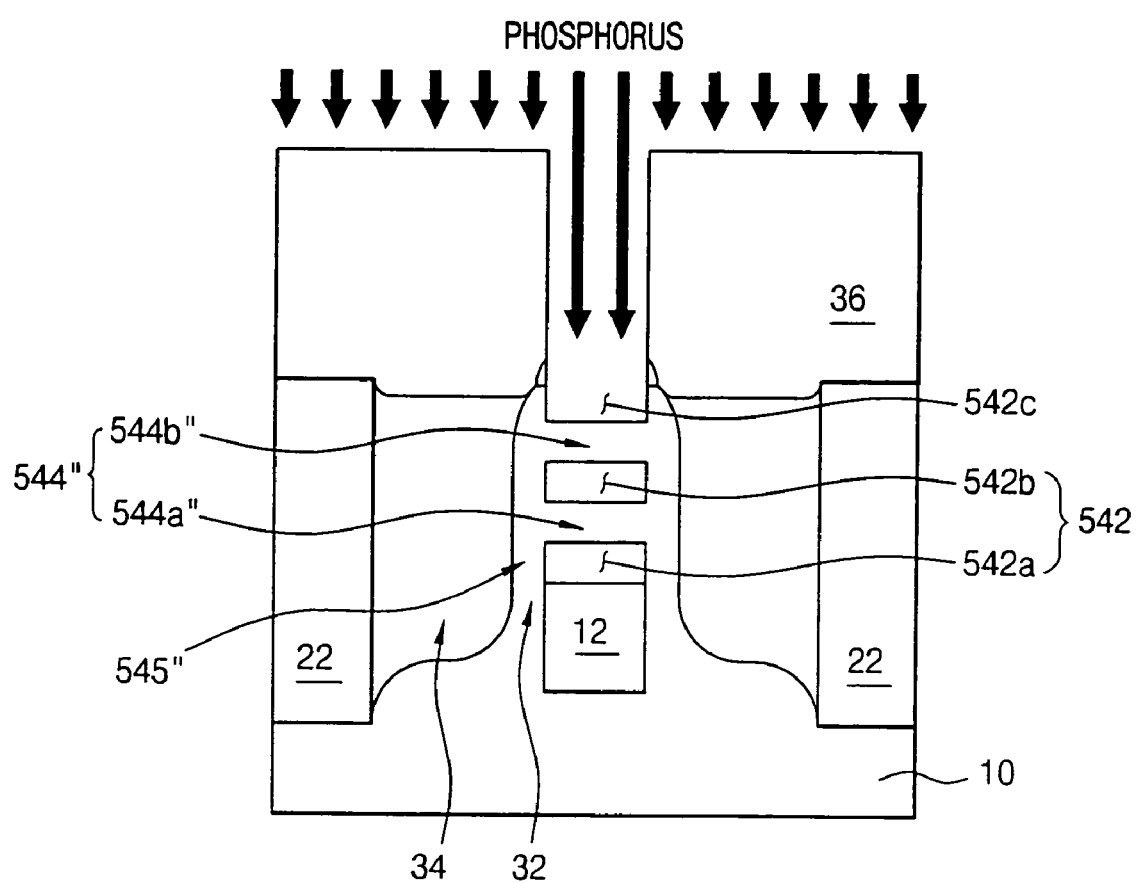

FIGS. 23A–23C illustrate seventeenth embodiments of the present invention. FIG. 23A illustrates process steps up to forming tunnels 542a, 542b and 542c according to any of the previous embodiments. After forming the tunnels 542, boron is doped, as shown in FIG. 23B, into the N-channel areas 544' and, optionally, into the P-channel areas. Finally, as shown in FIG. 23C, phosphorus is doped in the P-channel areas 544" using ion implantation and/or plasma doping and, as shown in the same manner as the previous embodiments, subsequent processes are carried out to form the semiconductor device.

According to some embodiments of the present invention as described above, a plurality of thin channels is formed from one active pattern and the gate electrode is formed to surround the channels. Since the plurality of thin channels are stacked vertically, areas occupied by the channel region and the source/drain regions may be reduced as compared to the conventional fin-type MOS transistor.

Further, in some embodiments of the present invention, the source/drain regions are formed to have uniform doping profile in a direction perpendicular to the plurality of channels, so that uniform source/drain junction capacitance can be maintained even though the number and the area of the channels increase. Thus, while reducing or minimizing the junction capacitance, the current can increase to enhance the operating speed of the device.

According to some embodiments of the present invention, after alternately stacking the plurality of channel layers and the plurality of interchannel layers to form the active pattern, regions of the active pattern where source/drain regions are to be formed are etched away. In some embodiments, the etched regions are filled up with an epitaxial single crystalline film or a conductive material to form the source/drain regions. Since a horizontal length of the interchannel layer can be limited within a length region of the gate, the horizontal extension of the tunnels may be prevented when the interchannel layers are isotropically etched to form the tunnels in a subsequent process. So, a highly integrated MOS transistor having a gate length smaller than a channel width may be realized.

Finally, according to some embodiments of the present invention, phosphorus doping is not performed until after the interchannel layers are selectively removed. Accordingly, conventional poly wet etchant may be used to selectively remove the interchannel layers. The channels are doped with phosphorus after selectively removing the plurality of interchannel layers. Accordingly, a manufacturable process that can use conventional etchants may be provided.

It will be understood that aspects of one or more embodiments of the present invention may be combined with each other to obtain a highly integrated vertical MOS transistor having the multiple channels.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of manufacturing an integrated circuit field effect transistor comprising:

forming a pre-active pattern on a surface of a substrate while refraining from doping the pre-active pattern with phosphorous, the pre-active pattern comprising a series of interchannel layers and channel layers stacked alternately upon each other;

forming source/drain regions on the substrate, at opposite ends of the pre-active pattern;

selectively removing the plurality of interchannel layers to form a plurality of tunnels passing through the pre-active pattern, thereby defining an active channel pattern comprising the tunnels and a plurality of channels comprising the channel layers;

doping the channels with phosphorous after selectively removing the plurality of interchannel layers; and forming a gate electrode in the tunnels and surrounding the channels;

wherein the channel layers comprise single crystalline silicon and wherein the interchannel layers comprise single crystalline silicon-germanium.

2. The method as claimed in claim 1 wherein the integrated circuit field effect transistor is a P-channel integrated circuit field effect transistor.

3. The method according to claim 1 wherein selectively removing is performed using poly etchant.

4. The method according to claim 1 wherein doping the channels is performed using ion implantation.

5. The method according to claim 1 wherein doping the channels is performed using plasma doping.

6. The method as claimed in claim 1 wherein the forming a gate electrode comprises forming a gate electrode to fill up the tunnels and surround the channels.

7. The method as claimed in claim 1, wherein the substrate comprises silicon, silicon-germanium, silicon-on-insulator (SOI) and/or silicon-germanium-on-insulator (SGOI).

8. The method as claimed in claim 1, wherein selectively removing is performed using an isotropic etching process.

9. A method of manufacturing integrated circuit N-channel and P-channel field effect transistors comprising:

forming an N-channel pre-active pattern and a P-channel pre-active pattern on a surface of a substrate, while refraining from doping the N-channel and P-channel pre-active patterns with phosphorous, the respective N-channel and P-channel pre-active patterns comprising a series of interchannel layers and respective N-channel layers and P-channel layers stacked alternately upon each other;

forming source/drain regions on the substrate, at opposite ends of each of the N-channel and P-channel pre-active patterns;

selectively removing the plurality of interchannel layers to form a plurality of tunnels passing through the N-channel and P-channel pre-active patterns, thereby defining respective active N-channel and P-channel patterns comprising the tunnels and a plurality of respective N-channels and P-channels comprising the channel layers;

doping the P-channels of the active P-channel patterns with phosphorous after selectively removing the plurality of interchannel layers, while refraining from doping the N-channels of the active N-channel patterns with phosphorous after selectively removing the plurality of interchannel layers; and forming a gate electrode in the tunnels and surrounding the N-channels and the P-channels;

wherein the following is performed after selectively removing the plurality of interchannel layers;

doping the N-channels of the active N-channel patterns with boron, while refraining from doping the P-channels of the active P-channel patterns with boron.

10. A method of manufacturing integrated circuit N-channel and P-channel field effect transistors comprising:
  forming an N-channel pre-active pattern and a P-channel pre-active pattern on a surface of a substrate, while refraining from doping the N-channel and P-channel pre-active patterns with phosphorous, the respective N-channel and P-channel pre-active patterns comprising a series of interchannel layers and respective N-channel layers and P-channel layers stacked alternately upon each other:
  forming source/drain regions on the substrate, at opposite ends of each of the N-channel and P-channel pre-active patterns;
  selectively removing the plurality of interchannel layers to form a plurality of tunnels passing through the N-channel and P-channel pre-active patterns, thereby defining respective active N-channel and P-channel patterns comprising the tunnels and a plurality of respective N-channels and P-channels comprising the channel layers;
  doping the P-channels of the active P-channel patterns with phosphorous after selectively removing the plurality of interchannel layers, while refraining from doping the N-channels of the active N-channel patterns with phosphorous after selectively removing the plurality of interchannel layers; and
  forming a gate electrode in the tunnels and surrounding the N-channels and the P-channels;
  wherein the following is performed before selectively removing the plurality of interchannel layers:
  doping the N-channel layers of the N-channel pre-active patterns with boron, while refraining from doping the P-channel layers of the P-channel pre-active patterns with boron.

11. A method of manufacturing integrated circuit N-channel and P-channel field effect transistors comprising:
  forming an N-channel pre-active pattern and a P-channel pre-active pattern on a surface of a substrate, while refraining from doping the N-channel and P-channel pre-active patterns with phosphorous, the respective N-channel and P-channel pre-active patterns comprising a series of interchannel layers and respective N-channel layers and P-channel layers stacked alternately upon each other;
  forming source/drain regions on the substrate, at opposite ends of each of the N-channel and P-channel pre-active patterns:
  selectively removing the plurality of interchannel layers to form a plurality of tunnels passing through the N-channel and P-channel pre-active patterns, thereby defining respective active N-channel and P-channel patterns comprising the tunnels and a plurality of respective N-channels and P-channels comprising the channel layers;
  doping the P-channels of the active P-channel patterns with phosphorous after selectively removing the plurality of interchannel layers, while refraining from doping the N-channels of the active N-channel patterns with phosphorous after selectively removing the plurality of interchannel layers; and
  forming a gate electrode in the tunnels and surrounding the N-channels and the P-channels;
  wherein the following is performed after selectively removing the plurality of interchannel layers:
  doping the N-channels of the active N-channel patterns and the P-channels of the active P-channel patterns with boron.

12. A method of manufacturing integrated circuit N-channel and P-channel field effect transistors comprising:
  forming an N-channel pre-active pattern and a P-channel pre-active pattern on a surface of a substrate, while refraining from doping the N-channel and P-channel pre-active patterns with phosphorous, the respective N-channel and P-channel pre-active patterns comprising a series of interchannel layers and respective N-channel layers and P-channel layers stacked alternately upon each other;
  forming source/drain regions on the substrate, at opposite ends of each of the N-channel and P-channel pre-active patterns;
  selectively removing the plurality of interchannel layers to form a plurality of tunnels passing through the N-channel and P-channel pre-active patterns, thereby defining respective active N-channel and P-channel patterns comprising the tunnels and a plurality of respective N-channels and P-channels comprising the channel layers;
  doping the P-channels of the active P-channel patterns with phosphorous after selectively removing the plurality of interchannel layers, while refraining from doping the N-channels of the active N-channel patterns with phosphorous after selectively removing the plurality of interchannel layers; and
  forming a gate electrode in the tunnels and surrounding the N-channels and the P-channels;
  wherein the following is performed before selectively removing the plurality of interchannel layers:
  doping the N-channel layers of the active N-channel pre-active patterns and the P-channel layers of the P-channel pre-active patterns with boron.

13. A method of manufacturing integrated circuit N-channel and P-channel field effect transistors comprising:
  forming an N-channel pre-active pattern and a P-channel pre-active pattern on a surface of a substrate, while refraining from doping the N-channel and P-channel pre-active patterns with phosphorous, the respective N-channel and P-channel pre-active patterns comprising a series of interchannel layers and respective N-channel layers and P-channel layers stacked alternately upon each other;
  forming source/drain regions on the substrate, at opposite ends of each of the N-channel and P-channel pre-active patterns;
  selectively removing the plurality of interchannel layers to form a plurality of tunnels passing through the N-channel and P-channel pre-active patterns, thereby defining respective active N-channel and P-channel patterns comprising the tunnels and a plurality of respective N-channels and P-channels comprising the channel layers;
  doping the P-channels of the active P-channel patterns with phosphorous after selectively removing the plurality of interchannel layers, while refraining from doping the N-channels of the active N-channel patterns with phosphorous after selectively removing the plurality of interchannel layers; and
  forming a gate electrode in the tunnels and surrounding the N-channels and the P-channels;
  wherein the channel layers comprise single crystalline silicon and wherein the interchannel layers comprises single crystalline silicon-germanium.

14. The method according to claim 13 wherein selectively removing is performed using poly etchant.

15. The method according to claim 13 wherein doping the P-channels is performed using ion implantation.

16. The method according to claim 13 wherein doping the P-channels is performed using plasma doping.

17. The method as claimed in claim 13 wherein the forming a gate electrode comprises forming a gate electrode to fill up the tunnels and surround the N-channels and the P-channels.

18. The method as claimed in claim 13, wherein the substrate comprises silicon, silicon-germanium, silicon-on-insulator (SOI) and/or silicon-germanium-on-insulator (SGOI).

19. The method according to claim 13 wherein selectively removing is performed using an isotropic etching process.

* * * * *